US012227863B2

(12) United States Patent
Hotta et al.

(10) Patent No.: US 12,227,863 B2
(45) Date of Patent: Feb. 18, 2025

(54) ANODIZING METHOD AND MANUFACTURING METHOD FOR AN ANISOTROPIC CONDUCTIVE MEMBER

(71) Applicant: FUJIFILM Corporation, Tokyo (JP)

(72) Inventors: Yoshinori Hotta, Haibara-gun (JP); Shunji Kurooka, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 743 days.

(21) Appl. No.: 17/395,653

(22) Filed: Aug. 6, 2021

(65) Prior Publication Data

US 2021/0363653 A1 Nov. 25, 2021

Related U.S. Application Data

(63) Continuation of application No. PCT/JP2020/000545, filed on Jan. 10, 2020.

(30) Foreign Application Priority Data

Feb. 15, 2019 (JP) ................................ 2019-025182

(51) Int. Cl.
*C25D 11/20* (2006.01)
*C25D 11/12* (2006.01)
(Continued)

(52) U.S. Cl.
CPC .............. *C25D 11/20* (2013.01); *C25D 11/12* (2013.01); *H01B 13/0036* (2013.01); *H01L 21/486* (2013.01)

(58) Field of Classification Search
CPC ..... C25D 11/02; C25D 11/022; C25D 11/024; C25D 11/04; C25D 11/045; C25D 11/12;
(Continued)

(56) References Cited

U.S. PATENT DOCUMENTS

2012/0055799 A1\* 3/2012 Hotta ................... H05K 3/4038
205/122
2016/0138180 A1 5/2016 Kozawa
2016/0153104 A1 6/2016 Yamashita

FOREIGN PATENT DOCUMENTS

CN 101104945 A 1/2008
CN 101276661 A 10/2008
(Continued)

OTHER PUBLICATIONS

Bononi et al. ("Pulsed current effect on hard anodizing process of 2024-T3 aluminium alloy". Surface & Coatings Technology 289. 2016. 110-117) (Year: 2016).*
(Continued)

*Primary Examiner* — Ricardo D Morales
(74) *Attorney, Agent, or Firm* — Sughrue Mion, PLLC

(57) ABSTRACT

There are provided an anodizing method by which straight micropores can be formed and a manufacturing method for an anisotropic conductive member in which a filling defect of a conductive material is suppressed. The anodizing method is a method including subjecting a surface of a valve metal plate to a plurality of times of anodization and forming an anodized film having micropores present in a thickness direction of the valve metal plate and having a barrier layer present in the bottom part of the micropores, on the surface of the valve metal plate. In steps of second and subsequent times of anodization of the plurality of times of anodization, a current increasing period and a current keeping period are continuous. The current increasing period is a period in which a quantity of current increase is more than 0 amperes per square meter per second and 0.2 amperes per square meter per second or less, and which is 10 minutes or less. A current is kept at a constant value during a current keeping period, and the constant value is equal to or less than a
(Continued)

maximum current value during the current increasing period.

16 Claims, 18 Drawing Sheets

(51) Int. Cl.
 *H01B 13/00* (2006.01)
 *H01L 21/48* (2006.01)
(58) Field of Classification Search
 CPC ......... C25D 11/14; C25D 11/18; C25D 11/26; H01B 13/0036; H01L 21/486
 See application file for complete search history.

(56) References Cited

FOREIGN PATENT DOCUMENTS

| | | |
|---|---|---|
| CN | 103255461 A | 8/2013 |
| CN | 105492659 A | 4/2016 |
| JP | 5222533 A | 2/1977 |
| JP | 54-033573 B2 | 10/1979 |
| JP | 2013-167023 A | 8/2013 |
| WO | 2015/012234 A1 | 1/2015 |
| WO | 2015/079706 A1 | 6/2015 |

OTHER PUBLICATIONS

Office Action dated May 10, 2022 issued by the Japanese Patent Office in Japanese Application No. 2020-572123.
International Search Report issued Mar. 10, 2020 in International Application No. PCT/JP2020/000545.
Written Opinion of the International Searching Authority issued Mar. 10, 2020 in International Application No. PCT/JP2020/000545.
International Preliminary Report on Patentability issued Aug. 10, 2021 in International Application No. PCT/JP2020/000545.
Taiwanese Office Action issued Jul. 31, 2023 in Application No. 109101275.
Office Action issued Dec. 23, 2023 in Chinese Application No. 202080014052.8.

* cited by examiner

ANODIZING METHOD AND MANUFACTURING METHOD FOR AN ANISOTROPIC CONDUCTIVE MEMBER

CROSS-REFERENCE TO RELATED APPLICATIONS

This application is a Continuation of PCT International Application No. PCT/JP2020/000545 filed on Jan. 10, 2020, which claims priority under 35 U.S.C. § 119(a) to Japanese Patent Application No. 2019-025182 filed on Feb. 15, 2019. The above application is hereby expressly incorporated by reference, in its entirety, into the present application.

BACKGROUND OF THE INVENTION

1. Field of the Invention

The present invention relates to an anodizing method for a valve metal and a manufacturing method for an anisotropic conductive member having micropores of an anodized film, where the micropores are filled with a conductive material and the anisotropic conductive member is obtained by anodization, and particularly relates to an anodizing method which is good in tubular straightness of micropores of an anodized film and a manufacturing method for an anisotropic conductive member.

2. Description of the Related Art

A field of a structure body in which a plurality of through-holes provided in an insulating base material are filled with a conductive substance such as a metal is one of the fields that have been attracting attention in nanotechnology in recent years and is expected to be used as, for example, anisotropic conductive member.

In a case where anisotropic conductive member is inserted between an electronic component such as a semiconductor element and a circuit board and is simply pressurized, an electrical connection between the electronic component and the circuit board can be obtained, and thus the anisotropic conductive member is widely used as an electrical connection member of an electronic component or the like such as a semiconductor element and, as a testing connector thereof for carrying out a functional test.

In particular, an electronic component such as a semiconductor element is significantly downsized. In a type of boding directly connecting a wiring board such as conventional wire bonding, and flip-chip bonding, thermocompression bonding, and the like, the stability of electrical connection of the electronic component cannot be sufficiently guaranteed, and thus, the anisotropic conductive member has been attracting attention as an electronic connection member.

For example, JP2013-167023A discloses a manufacturing method for a microstructure body consisting of a base material having micropore through-holes at a density of 10 million holes/mm$^2$ or more, where a part of the micropore through-holes are filled with a substance other than the material of the base material. In the manufacturing method for a microstructure body of JP2013-167023A, the base material is alumina, and at least the following treatments are carried out on an aluminum substrate in order, (A) a treatment of forming an oxide coating film having micropores by anodization, (B) a treatment of removing aluminum from the oxide coating film obtained by the above-described (A) treatment, (C) a treatment of piercing a part of the micropores present in the oxide coating film from which aluminum has been removed by the above-described (B) process, (D) a treatment of filling the micropores pierced by the above-described treatment (C) with a substance other than the oxide coating film, and (E) a surface smoothing treatment of smoothing a front surface and a back surface of the oxide coating film after the above-described (D) treatment by a chemical mechanical polishing treatment.

SUMMARY OF THE INVENTION

In the manufacturing method for a microstructure body of JP2013-167023A described above, an oxide coating film having micropores can be formed by anodization.

However, depending on the conditions of the anodization, it is difficult to form straight micropores since, for example, micropores become branched or becoming slanted. In a case where the micropores are branched or slanted, the micropores cannot be sufficiently filled, and thus a filling defect occurs even in a case where an attempt is made to fill the micropores with a substance other than the oxide coating film. As a result, for example, in a case of filling with a conductive material such as metal, a sound conduction path cannot be obtained due to the filling defect.

An object of the present invention is to provide anodizing method by which straight micropores can be formed and a manufacturing method for an anisotropic conductive member in which a filling defect of a conductive material is suppressed.

For achieving the above-described object, the first aspect of the present invention is to provide anodizing method which is anodizing method including subjecting a surface of a valve metal plate to a plurality of times of anodization and forming an anodized film having micropores present in a thickness direction of the valve metal plate and having a barrier layer present in a bottom part of the micropores, on the surface of the valve metal plate, in which in steps of second and subsequent times of anodization of the plurality of times of anodization, a current increasing period and a current keeping period are continuous, the current increasing period is a period in which a quantity of current increase is more than 0 amperes per square meter per second and 0.2 amperes per square meter per second or less, and which is 10 minutes or less, and a current is kept at a constant value during the current keeping period, and the constant value is equal to or less than a maximum current value during the current increasing period.

During the current increasing period, it is preferable to stepwise increase the voltage that is applied to the valve metal plate.

It is preferable that a counter electrode is arranged to face the valve metal plate and a conductive load member is electrically connected in parallel with the valve metal plate.

It is preferable that a step of a first time of anodization of the plurality of times of anodization is carried out at a constant voltage.

The valve metal plate is preferably an aluminum substrate.

The second aspect of the present invention provides a manufacturing method for an anisotropic conductive member, including a step of filling micropores of an anodized film with a conductive material, the anodized film having the micropores and being obtained by the anodizing method of the first aspect of the present invention.

Before the step of filling the micropores of the anodized film with a conductive material, it is preferable to include a step of removing a valve metal plate from the anodized film and a step of piercing the micropores present in the anodized film from which the valve metal plate has been removed.

According to the present invention, it is possible to anodized film having straight micropores. In addition, it is possible to obtain an anisotropic conductive member in which the filling defect of the conductive material is suppressed.

DESCRIPTION OF THE PREFERRED EMBODIMENTS

Hereinafter, anodizing method and a manufacturing method for an anisotropic conductive member according to the embodiment of the present invention will be described in detail based on the preferred embodiments illustrated in the attached drawings.

It is noted that the figures described below are exemplary for explaining the present invention, and the present invention is not limited to the figures shown below.

In the following, "to" indicating a numerical range includes numerical values described on both sides thereof.

For example, in a case where $\varepsilon$ is a numerical value $\alpha$ to a numerical value $\beta$, the range of $\varepsilon$ is a range including the numerical value $\alpha$ and the numerical value $\beta$ and thus $\alpha \le \varepsilon \le \beta$ in a case of describing with mathematical symbols.

In the description of an angle such as "orthogonal", the angle includes an error range generally allowed in the related art unless otherwise specified. In addition, in the description of a temperature, the temperature includes an error range generally allowed in the related art unless otherwise specified.

Figure 1:
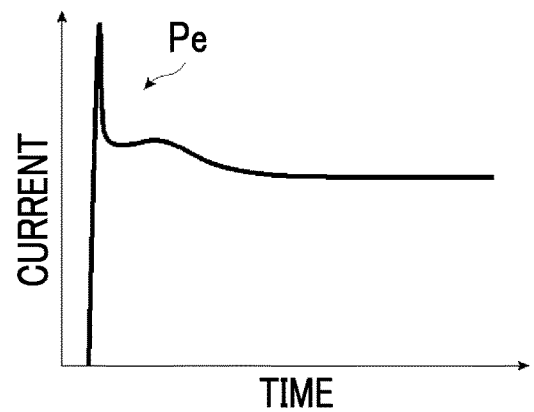
FIG. 1 is a graph showing a change in current during anodization.
Figure 2:
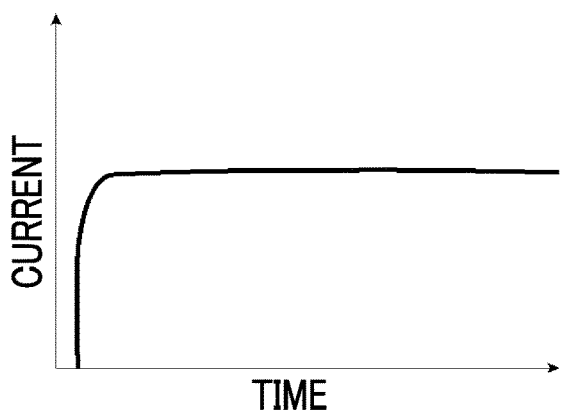
FIG. 2 is a graph showing a change in current during anodization according to the embodiment of the present invention.

FIG. 1 is a graph showing a change in current during anodization, and FIG. 2 is a graph showing a change in current during anodization according to the embodiment of the present invention.

In a case where anodization is carried out, as illustrated in FIG. 1, a current suddenly rises, and a region Pe having a current value higher than the steady state current value is generated when a voltage is applied. Due to the sudden rise of this current, it becomes difficult to form straight micropores in a case where the micropores are formed by subjecting a valve metal into anodization. In contrast to this phenomenon, as illustrated in FIG. 2, it has been found that in a case where the rise of the current is made moderate when the voltage is applied, specifically, in a case where the quantity of current increase is set to more than 0 amperes per square meter per second (0 A/(m²·second)) and 0.2 amperes per square meter per second or less (0.2 A/(m²·second)), straight micropores can be formed. Further, in a case where the straight micropores are formed, it is possible to suppress a filling defect when the micropores are filled with a metal.

Hereinafter, the anodizing method and the manufacturing method for the anisotropic conductive member will be specifically described.

<First Aspect>

FIG. 3 to FIG. 7 are schematic cross-sectional views illustrating a first aspect of the manufacturing method for an anisotropic conductive member according to the embodiment of the present invention in the order of steps.

The anisotropic conductive member is obtained by subjecting the surface of a valve metal plate to a plurality of times of anodization. The anisotropic conductive member has an insulating base material made of an anodized film of a valve metal. The valve metal is aluminum or the like and it is not particularly limited to aluminum; however, as an example, an anodized film of aluminum will be described as the insulating base material. Accordingly, in the following description, an aluminum substrate will be described as an example of the valve metal plate.

Figure 3:
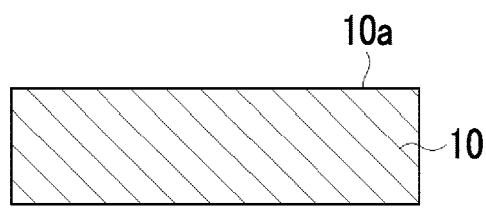
FIG. 3 is a schematic cross-sectional view illustrating a step of the first aspect of the manufacturing method for an anisotropic conductive member according to the embodiment of the present invention.

First, as illustrated in FIG. 3, an aluminum substrate 10 is prepared.

The aluminum substrate 10 is a substrate whose size and thickness are appropriately determined depending on the thickness of anodized film 14 of anisotropic conductive member 20 (see FIG. 7) that is finally obtained, that is, the thickness of the insulating base material, a device for processing, and the like. The aluminum substrate 10 is, for example, a rectangular plate material.

Figure 4:
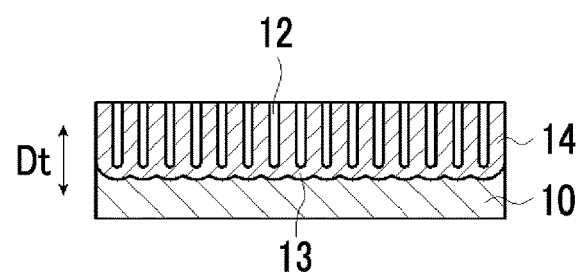
FIG. 4 is a schematic cross-sectional view illustrating a step of the first aspect of the manufacturing method for an anisotropic conductive member according to the embodiment of the present invention.

Next, a surface 10a (see FIG. 3) on one side of the aluminum substrate 10 is subjected to a plurality of times of anodization. That is, the anodization is repeatedly carried out. As a result, the surface 10a (see FIG. 3) on one side of the aluminum substrate 10 is anodized, and as illustrated in FIG. 4, anodized film 14 having a barrier layer 13 present in the bottom part of a plurality of micropores 12 that are extendedly present in the thickness direction Dt of the aluminum substrate 10 is formed on the surface 10a of the aluminum substrate 10. The step of carrying out the plurality of times of anodization described above is referred to as an anodization step. The anodization step will be described in detail later.

Figure 5:
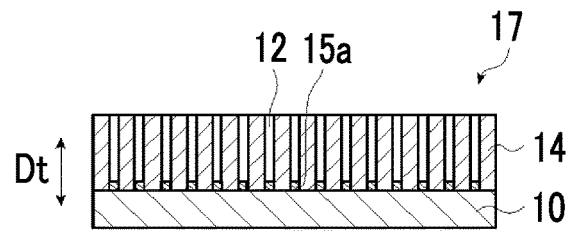
FIG. 5 is a schematic cross-sectional view illustrating a step of the first aspect of the manufacturing method for an anisotropic conductive member according to the embodiment of the present invention.

In the anodized film 14 having the plurality of micropores 12, the barrier layer 13 is present in the bottom part of the micropores 12 as described above; however, the barrier layer 13 is removed as illustrated in FIG. 5. The step of removing the barrier layer 13 is referred to as a barrier layer removing step.

In the barrier layer removing step, in a case where an alkali aqueous solution containing ions of a metal M1 having a hydrogen overvoltage higher than that of aluminum is used, the barrier layer 13 of the anodized film 14 is removed and at the same time, for example, a metal layer 15*a* made of a metal (a metal MD which is a conductive material is formed in the bottom part of the micropore 12. As a result, the aluminum substrate 10 at the bottom of the micropore 12 is covered by the metal layer 15*a*.

The anodized film 14 having a plurality of micropores 12 illustrated in FIG. 5, that is, the insulating base material having a plurality of micropores is referred to as a structure body 17.

Figure 6:
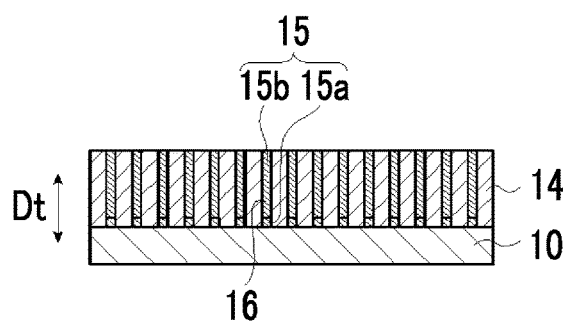
FIG. 6 is a schematic cross-sectional view illustrating a step of the first aspect of the manufacturing method for an anisotropic conductive member according to the embodiment of the present invention.

Next, as illustrated in FIG. 6, the inside of the micropore 12 of the anodized film 14 is filled with, for example, a metal 15*b* as the conductive material. In a case where the inside of the micropore 12 is filled with the metal 15*b*, a conduction path 16 having conductivity is formed. In this case, the metal layer 15*a* made of a metal (a metal M1) can be used as an electrode for electrolytic plating.

Filling the inside of the micropore 12 with the metal 15*b* is referred to as a metal filling step. Electrolytic plating is used in the metal filling step, and the metal filling step will be described in detail later. The material with which filling is carried out may be any conductive material and is not limited to metal.

Figure 7:
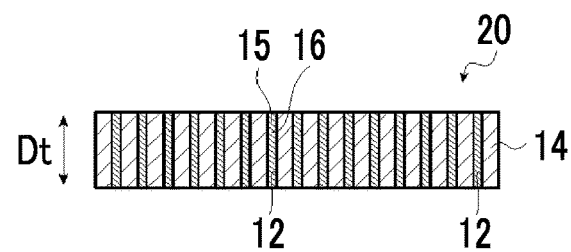
FIG. 7 is a schematic cross-sectional view illustrating a step of the first aspect of the manufacturing method for an anisotropic conductive member according to the embodiment of the present invention.

After the metal filling step, the aluminum substrate 10 is removed as illustrated in FIG. 7. As a result, the anisotropic conductive member 20 is obtained. The step of removing the aluminum substrate 10 is referred to as a substrate removing step.

In the barrier layer removing step before the metal filling step, in a case where the barrier layer is removed by using an alkali aqueous solution containing ions of the metal M1 having a hydrogen overvoltage higher than that of aluminum, not only the barrier layer 13 is removed but also the metal layer 15*a* of the metal M1 from which a hydrogen gas is hard to be generated in comparison with aluminum is formed on the aluminum substrate 10 exposed in the bottom part of the micropore 12. As a result, the in-plane uniformity of the metal filling becomes good. It is presumed that the generation of the hydrogen gas by the plating solution is suppressed and thus the metal filling by the electrolytic plating proceeds easily.

Further, in the barrier layer removing step, in a case where a holding step of holding a voltage of 95% or more and 105% or less of the voltage (the holding voltage) selected from a range of less than 30% of the voltage in the anodization step for a total of 5 minutes or more is provided and the application of an alkali aqueous solution containing ions of the metal M1 is combined, it has been found that the uniformity of the metal filling during the plating treatment is greatly improved.

Although the detailed mechanism is unknown, it is presumed that in the barrier layer removing step, a layer of the metal M1 is formed in the lower part of the barrier layer by using the alkali aqueous solution containing ions of the metal M1, whereby the damage of the interface between the aluminum substrate and the anodized film can be suppressed, and thus the uniformity of the dissolution of the barrier layer is improved.

In the barrier layer removing step, the metal layer 15*a* made of a metal (a metal M1) is formed in the bottom part of the micropore 12. However, the present invention is not limited to this, and after only the barrier layer 13 is removed and the aluminum substrate 10 is exposed at the bottom of the micropore 12, the aluminum substrate 10 may be used as an electrode for electrolytic plating in a state where the aluminum substrate 10 has been exposed.

<Second Aspect>

Figure 8:
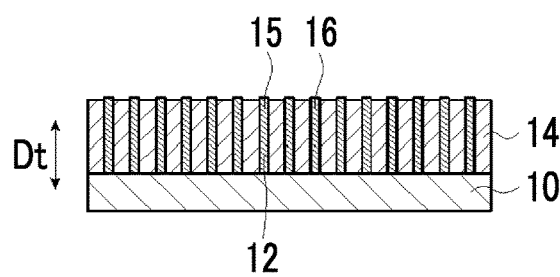
FIG. 8 is a schematic cross-sectional view illustrating a step of the second aspect of the manufacturing method for an anisotropic conductive member according to the embodiment of the present invention.
Figure 9:
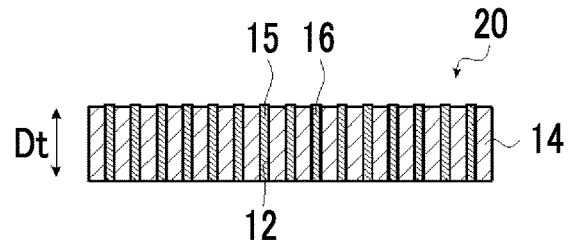
FIG. 9 is a schematic cross-sectional view illustrating a step of the second aspect of the manufacturing method for an anisotropic conductive member according to the embodiment of the present invention.
Figure 10:
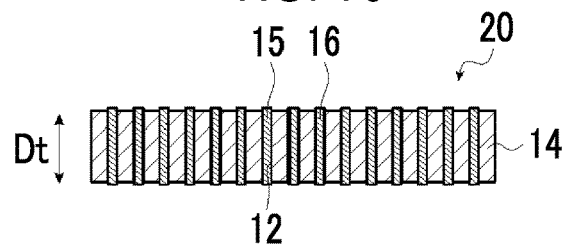
FIG. 10 is a schematic cross-sectional view illustrating a step of the second aspect of the manufacturing method for an anisotropic conductive member according to the embodiment of the present invention.

FIG. 8 to FIG. 10 are schematic cross-sectional views illustrating a second aspect of the manufacturing method for an anisotropic conductive member according to the embodiment of the present invention in the order of steps.

In FIGS. 8 to 10, the same configuration components as those illustrated in FIGS. 3 to 7 are designated by the same references, and the detailed description thereof will be omitted. FIG. 8 illustrates the state after FIG. 6 described above.

In the second aspect, the steps described below are different from those in the first aspect described above. As illustrated in FIG. 8, after the metal filling step, the surface of the anodized film 14 on the side where the aluminum substrate 10 is not provided is partially removed in the thickness direction, and the metal 15 with which filling has been carried out in the metal filling step is allowed to protrude from the surface of the anodized film 14. That is, the conduction path 16 is allowed to protrude from the surface of the anodized film 14. Allowing the metal 15 with which filling has been carried out to protrude from the surface of the anodized film 14 is referred to as a front surface metal protruding step.

After the front surface metal protruding step, the aluminum substrate 10 is removed as illustrated in FIG. 9 (the substrate removing step).

Next, as illustrated in FIG. 10, after the substrate removing step, the surface of the anodized film 14 on the side where the aluminum substrate 10 has been provided is partially removed in the thickness direction, and the metal 15 with which filling has been carried out in the metal filling step, that is, the conduction path 16 is allowed to protrude from the surface of the anodized film 14. As a result, the anisotropic conductive member 20 illustrated in FIG. 10 is obtained.

An aspect having both the front surface metal protruding step described above and a back surface metal protruding step may be adopted; however, an aspect having any one step of the front surface metal protruding step or the back surface metal protruding step may be adopted. The front surface metal protruding step and the back surface metal protruding step are collectively voltage to be applied a "metal protruding step".

<Third Aspect>

Figure 11:
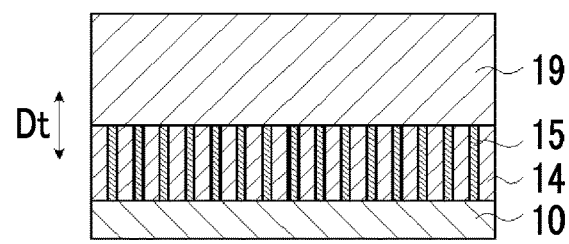
FIG. 11 is a schematic cross-sectional view illustrating a step of the third aspect of the manufacturing method for an anisotropic conductive member according to the embodiment of the present invention.
Figure 12:
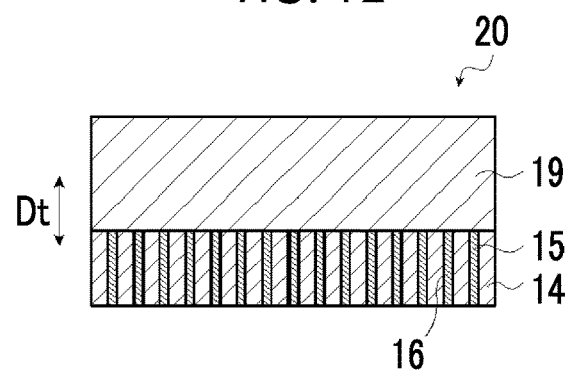
FIG. 12 is a schematic cross-sectional view illustrating a step of the third aspect of the manufacturing method for an anisotropic conductive member according to the embodiment of the present invention.

FIG. 11 and FIG. 12 are schematic cross-sectional views illustrating a third aspect of the manufacturing method for an anisotropic conductive member according to the embodiment of the present invention in the order of steps.

In FIG. 11 and FIG. 12, the same configuration components as those illustrated in FIG. 3 to FIG. 7 are designated by the same references, and the detailed description thereof will be omitted. FIG. 11 illustrates the state after FIG. 6 described above.

In the third aspect, the steps described below are different from those in the first aspect described above. As illustrated in FIG. 11, a resin layer 19 is provided on the surface of the anodized film 14 on the side where the aluminum substrate 10 is not provided, after the metal filling step. Providing the resin layer 19 is referred to as a resin layer forming step.

Next, as illustrated in FIG. 12, the aluminum substrate 10 is removed after the resin layer forming step (the substrate removing step). As a result, the anisotropic conductive member 20 illustrated in FIG. 7 is obtained.

Figure 13:
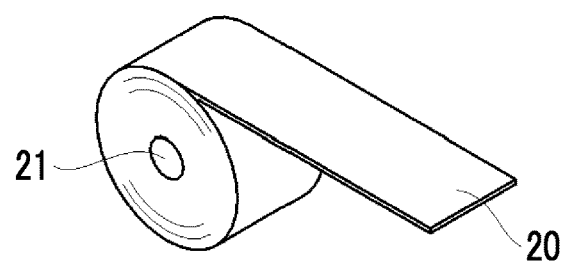
FIG. 13 is a schematic view illustrating an example of a supply form of anisotropic conductive member manufactured by the third aspect of the manufacturing method for an anisotropic conductive member according to the embodiment of the present invention.
Figure 14:
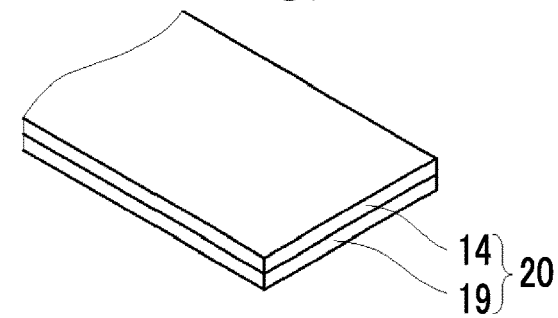
FIG. 14 is a schematic enlarged view illustrating an example of a main part of the supply form of the anisotropic conductive member manufactured by the third aspect of the manufacturing method for an anisotropic conductive member according to the embodiment of the present invention.

The third aspect is an aspect in which the manufactured anisotropic conductive member 20 as illustrated in FIG. 13 is intended to be supplied in a state of being wound around a winding core 21 in a roll shape. In a case where the resin layer 19 (see FIG. 14) is peeled off when the anisotropic conductive member 20 is used, the anisotropic conductive member 20 can be used, for example, as an anisotropic conductive member.

<Other Aspects>

As a manufacturing method, for example, the anodization step, the holding step, the barrier layer removing step, the metal filling step, the front surface metal protruding step, the resin layer forming step, the substrate removing step, and the back surface metal protruding step, which are described above, may be carried out in order.

Further, a part of the surface of the aluminum substrate may be subjected to the anodization by using a mask layer having a desired shape.

[Insulating Base Material]

The insulating base material is composed of an anodized film of a valve metal. The anodized film of the valve metal is preferable since micropores having a desired average opening diameter are formed as through-holes and a conduction path having conductivity is easily formed.

Specific examples of the valve metal include aluminum, tantalum, niobium, titanium, hafnium, zirconium, zinc, tungsten, bismuth, and antimony. Among these, an aluminum anodized film (a base material) is preferable since it has good dimensional stability and is relatively inexpensive. Accordingly, it is preferable to form an anodized film which is an insulating base material and to manufacture an anisotropic conductive member, by using an aluminum substrate.

[Aluminum Substrate]

The aluminum substrate is not particularly limited, and specific examples thereof include a pure aluminum plate; an alloy plate containing aluminum as a main component and containing a trace amount of foreign elements; a substrate obtained by vapor depositing high-purity aluminum on low-purity aluminum (for example, a recycled material); a substrate obtained by covering the surface of a silicon wafer, quartz, glass, or the like with high-purity aluminum by a method such as vapor deposition, sputtering, or the like; a resin substrate laminated with aluminum; and the like.

The surface of the aluminum substrate, on which the anodized film is provided by the anodization step, preferably has an aluminum purity of 99.5% by mass or more, more preferably 99.9% by mass or more, and still more preferably 99.99% by mass or more. In a case where the aluminum purity is in the above-described range, the regularity of the micropore arrangement is sufficient.

Further, in the present invention, it is preferable that the surface of one side of the aluminum substrate to be subjected to the anodization step is subjected to a heat treatment, a degreasing treatment, and a mirror finishing treatment in advance.

Here, regarding the heat treatment, the degreasing treatment, and the mirror finishing treatment, the same treatment as each of those described in paragraphs [0044] to [0054] of JP2008-270158A can be applied.

[Anodization Step]

The anodization step is a step of subjecting a surface of the above-described valve metal plate to a plurality of times of anodization, thereby forming an anodized film having micropores present on the surface of the valve metal plate in a thickness direction of the valve metal plate and having a barrier layer present in a bottom part of the micropores, on the surface of the valve metal plate. Specifically, the anodization step is a step of subjecting a surface of an aluminum substrate which is the valve metal plate to a plurality of times of anodization as described above, thereby forming an anodized film having micropores present in a thickness direction of the aluminum substrate and having a barrier layer present in a bottom part of the micropores, on the surface of the aluminum substrate.

In the anodization step, the anodization is carried out a plurality of times; however, in the second and subsequent times, the rise of the current is adjusted to be made moderate as illustrated in FIG. 2 described above.

Figure 15:
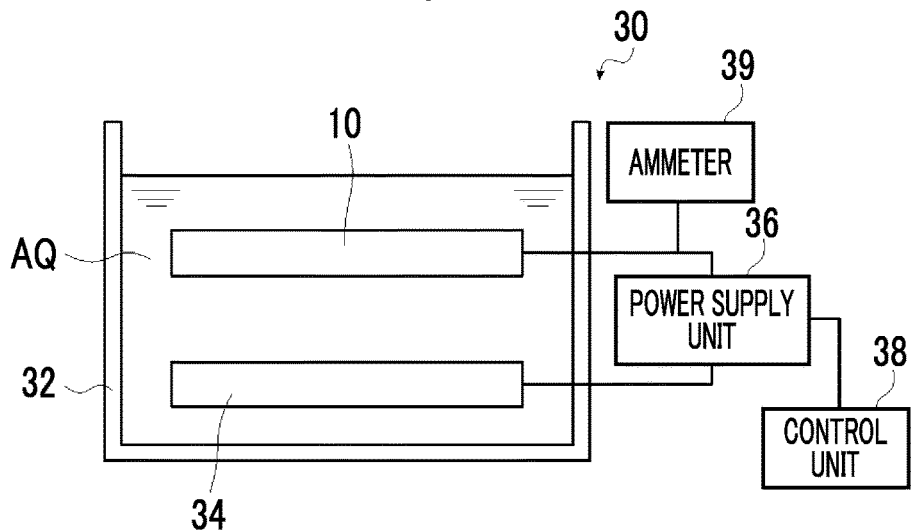
FIG. 15 is a schematic view illustrating an example of anodization device that is used in anodization step of the manufacturing method for an anisotropic conductive member according to the embodiment of the present invention.

Here, FIG. 15 is a schematic view illustrating an example of an anodization device that is used in anodization step of the manufacturing method for an anisotropic conductive member according to the embodiment of the present invention.

Figure 16:
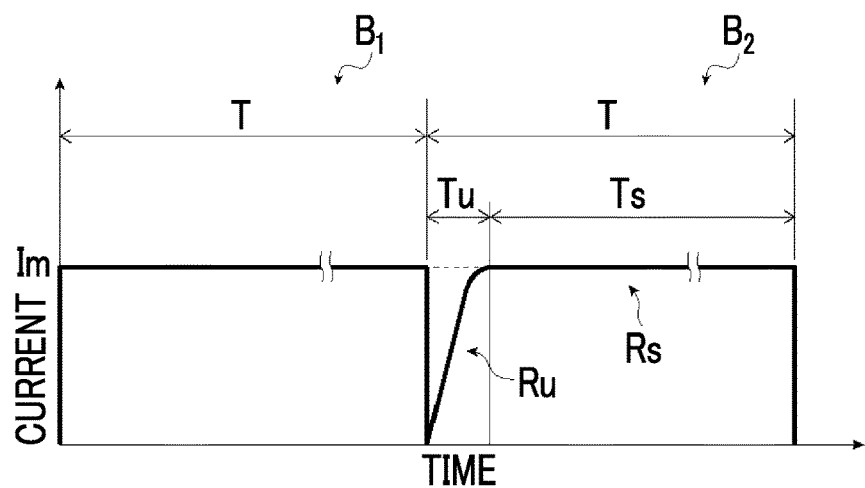
FIG. 16 is a graph showing a first example of a current pattern in the anodization step of the manufacturing method for an anisotropic conductive member according to the embodiment of the present invention.
Figure 17:
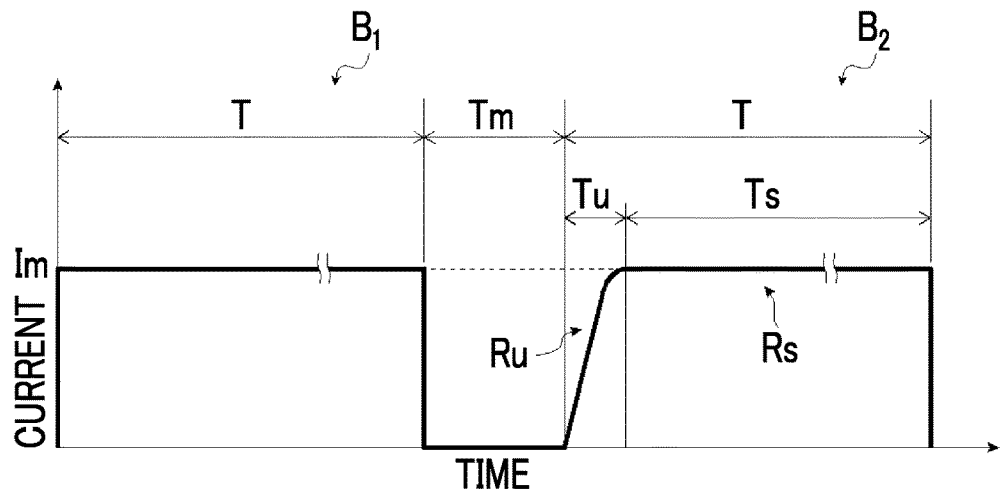
FIG. 17 is a graph showing a second example of a current pattern in the anodization step of the manufacturing method for an anisotropic conductive member according to the embodiment of the present invention.

FIG. 16 is a graph showing a first example of a current pattern in the anodization step of the manufacturing method for an anisotropic conductive member according to the embodiment of the present invention, and FIG. 17 is a graph showing a second example of a current pattern in the anodization step of the manufacturing method for an anisotropic conductive member according to the embodiment of the present invention.

Figure 18:
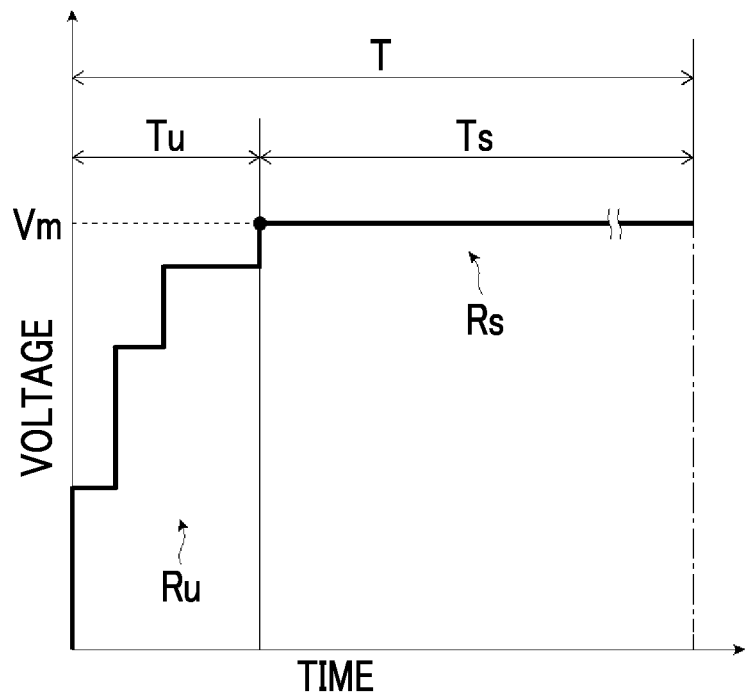
FIG. 18 is a graph showing an example of a voltage pattern in the anodization step of the manufacturing method for an anisotropic conductive member according to the embodiment of the present invention.

FIG. 18 is a graph showing an example of a voltage pattern in the anodization step of the manufacturing method for an anisotropic conductive member according to the embodiment of the present invention.

Figure 19:
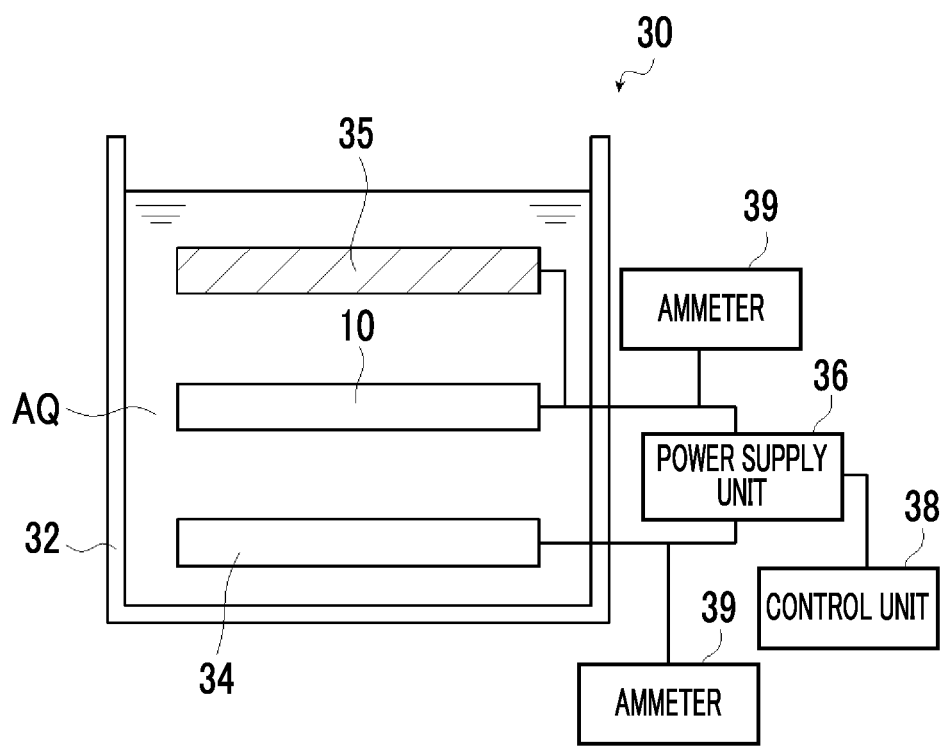
FIG. 19 is a schematic view illustrating another example of the anodization device that is used in the anodization step of the manufacturing method for an anisotropic conductive member according to the embodiment of the present invention.

In addition, FIG. 19 is a schematic view illustrating another example of an anodization device that is used in the anodization step of the manufacturing method for an anisotropic conductive member according to the embodiment of the present invention.

The anodization device 30 illustrated in FIG. 15 includes an electrolytic bath 32, a counter electrode 34, a power supply unit 36, a control unit 38, and an ammeter 39. The aluminum substrate 10 described above is arranged in the electrolytic bath 32 to face the counter electrode 34. Further, the electrolytic bath 32 is filled with an electrolytic solution AQ, and the aluminum substrate 10 and the counter electrode 34 are immersed. The aluminum substrate 10 is a target object to be subjected to the anodization as described above.

The power supply unit 36 is a unit that is electrically connected to the aluminum substrate 10 and the counter electrode 34 and applies a current or a voltage to the aluminum substrate 10.

The control unit 38 is a unit that is connected to the power supply unit 36 and controls the power supply unit 36. The control unit 38 controls the current value, the timing, and the period of the current that is applied by the power supply unit 36.

For example, a plurality of current patterns of the current to be applied are stored in the control unit 38, and a current is applied from the power supply unit 36 to the aluminum substrate 10 in any one of the current patterns.

The control unit 38 may have the functions of the power supply unit 36, and thus, in this case, the control unit 38 is unnecessary. In addition, the current pattern of the current to be applied is also referred to as a current control pattern.

Further, for example, a configuration in which a plurality of voltage patterns of the voltage to be applied are stored in the control unit 38 and a voltage is applied from the power supply unit 36 to the aluminum substrate 10 in any one of the voltage patterns may also be adopted. Even in a case where a voltage is applied, the power supply unit 36 may have the functions of the control unit 38 as described above. The voltage pattern of the referred to as is also referred to as a voltage control pattern.

Further, the ammeter 39 is provided between the power supply unit 36 and the aluminum substrate 10, and the current value of the current that flows through the aluminum substrate 10 can be obtained by the ammeter 39. It is also possible to carry out a feedback control in which a current value from the ammeter 39 is output to the control unit 38 and the control unit 38 adjusts the current or the voltage that is applied to the aluminum substrate 10 based on the current from the ammeter 39. A voltmeter may be provided in addition to the ammeter 39.

In the anodization step, the aluminum substrate 10 and the counter electrode 34 are arranged to face each other in the electrolytic bath 32 illustrated in FIG. 15. Then, the inside of the electrolytic bath 32 is filled with the electrolytic solution AQ.

Next, a current is applied from the power supply unit 36 to the aluminum substrate 10 and the counter electrode 34 based on the current pattern output from the control unit 38. The anodization is carried out a plurality of times; however, it is necessary to avoid a sudden rise in the current in the second and subsequent times as illustrated in FIG. 1 described above. In the second and subsequent times, as illustrated in FIG. 2 described above, the rise of the current at the time of applying a voltage is made moderate. That is, at the time when the current rises, the quantity of current increase is set to more than 0 amperes per square meter per second and 0.2 amperes per square meter per second or less.

FIG. 16 and FIG. 17 illustrate the anodization step for two times; however, the anodization may be carried out a plurality of times and is not limited to two times. The reference T indicated in FIG. 16 and FIG. 17 is the anodization time.

The first time of anodization $B_1$ is not particularly limited and is, for example, the same as the general anodization. In this case, it is carried out at a constant voltage such as 40V. Accordingly, as illustrated in FIG. 16, the current value becomes a constant current value.

In the second anodization $B_2$, the current increasing period and the current keeping period are continuous, and the current increasing period is a period of 10 minutes or less. In the second anodization $B_2$, the current value is continuously increased to carry out the anodization.

In the second anodization $B_2$, in a case where the rising time of the rising part Ru is denoted by Tu and the steady state time of the steady state part Rs is denoted by Ts, the anodization time T is, T=Tu+Ts.

The steady state part Rs indicates a predetermined region that is electrically kept steady state.

The rising part Ru is a region from a state where the current is zero to a state where the current reaches the maximum value Im and is a region where the current value is increased by the quantity of current increase described above.

The rising part Ru is the current increasing period, and the quantity of current increase is more than 0 amperes per square meter per second and 0.2 amperes per square meter per second or less as described above. In the rising part Ru, that is, in the current increasing period, in a case where the quantity of current increase is more than 0 amperes per square meter per second and 0.2 amperes per square meter per second or less, the sudden rise of the current as illustrated in FIG. 1 as described above does not occur. As a result, straight micropores are formed without micropores being branched or being formed slantedly, and thus anodized film having the straight micropores can be obtained.

It is noted that the straight micropores mean that micropores are not branched and not slantedly formed, and that the micropore diameter ratio of the diameter on the front surface side to the diameter on the back surface side of the anodized film is 0.9 to 1.1.

In a case where the current increasing period is long, since the diameter of the micropores on the side to be subjected to the anodization may become large, and further, the micropores may be branched or the micropores may be formed slantedly, the current increasing period is set to 10 minutes or less. The lower limit value of the current increasing period is not particularly limited, and the lower limit value is more than 0 minutes. The current increasing period of 5 minutes or more and 10 minutes or less is more preferable since the occurrence that the diameter of the micropore is increased, the micropores are branched, and the micropores are slanted is further suppressed.

The steady state part Rs is a region where the current increased in the rising part Ru is kept. In the steady state part Rs, that is, in the current keeping period, the current is kept at a constant value. The constant value is equal to or less than the maximum current value in the current increasing period, that is, the maximum value Im of the current value of the anodization.

The constant value means that the value does not increase or decrease and the fluctuation is in the range of 10% in absolute value.

In a case where the anodization is carried out a plurality of times, the anodization may be continuously carried out, or a period in which no current is applied may be provided between the anodizations. The period in which no current is applied is appropriately determined in consideration of the time required for the anodization step and the like.

In a case where the anodization is carried out a plurality of times, for example, a current pattern illustrated in FIG. 16 is used. Although the anodization is repeated continuously in FIG. 16, the anodization is not limited to thereto. As illustrated in FIG. 17, the anodization may be carried out a plurality of times in a current pattern having a period Tm in which no current is applied.

In the anodization step, the predetermined number of times of anodization is set in advance, and the anodization is repeatedly carried out until the predetermined number of times is reached. In a case where the number of times of anodization is a plurality of times, the number of times thereof is not particularly limited.

The control of the current value in the anodization is not limited to continuously increasing the current value, and the current value may be increased in multiple stages as long as the quantity of current increase is within the above-described range.

In addition, in a case where the anodization is controlled by the voltage to be applied, the voltage to be applied may be continuously increased so that the current value is continuously increased. Further, as illustrated in FIG. 18, the voltage to be applied can be increased stepwise so that the current value is increased stepwise and thus the quantity of current increase at the rise of current is within the above range.

In a case of controlling by voltage, as illustrated in FIG. 18, a region from a state where the voltage is zero to a state where the voltage reaches the maximum value Vm is the rising part Ru, and the time of the rising part Ru is the rising time Tu. The region where the increased voltage in the rising part Ru is kept as a constant value is the steady state part Rs.

The pattern of increase in current and voltage is not particularly limited as long as the current increasing period, that is, the quantity of current increase in the rising part Ru can be set within the above-described range, and is not limited to those illustrated in FIG. 16 and FIG. 18. For example, the current or voltage may be increased in three steps with different degrees of increase. In this case, the degrees of increase are respectively represented by three linear functions. The degree of increase is not limited to three as long as it is plural.

Further, regarding the current or the voltage, the degree of increase in the current value or the voltage value may be increased as time elapses.

Continuously increasing the current or the voltage means increasing the current value or the voltage value as the electrolysis time elapses. In this case, the current value or the voltage value can be represented by a linear function, a higher-order function such as a quadratic function, a plurality of linear functions, or a combination of a linear function and a higher-order function. It is assumed that all of the above functions are increasing functions and have no inflection points.

Increasing the current value or the voltage value in multiple stages means increasing the current value or the voltage value in a stepwise manner as the electrolysis time increases. As a result, in a case where the current value or the voltage value is increased in multiple stages, there exists a period in which the current value or the voltage value is a constant value, in which the current value or the voltage value does not increase even in a case where the electrolysis time elapses.

In a case where the current or the voltage is continuously increased, the quantity of current increase can be obtained from the rising time Tu and the maximum value Im of the current or from the maximum value Vm of the voltage.

Even in a case where the voltage is increased stepwise, the quantity of current increase can be obtained from the rising time Tu and the maximum value Im of the current or from the maximum value Vm of the voltage. The current value can be obtained by the ammeter 39 described above. For example, the value of the voltage output by the power supply unit 36 can be used as the voltage value.

As illustrated in FIG. 2 described above, making the rise of the current moderate at the time of applying a voltage is not limited to the current control and the voltage control which are described above. For example, the current rise rate can be controlled by using a conductive load member electrically connected in parallel with the valve metal plate to be subjected to the anodization.

In a case where a conductive load member is provided, for example, the anodization device 30 illustrated in FIG. 19 can be used. The anodization device 30 illustrated in FIG. 19 is different from the anodization device 30 illustrated in FIG. 15 in that the anodization device 30 has a metal substrate 35, as a conductive load member, which is electrically connected in parallel with the aluminum substrate 10 to be subjected to the anodization. The other configurations are the same as those of the anodization device 30 illustrated in FIG. 13, and thus the detailed description thereof will be omitted.

The metal substrate 35 is immersed in the electrolytic solution AQ in the electrolytic bath 32 together with the aluminum substrate 10 to be subjected to the anodization.

The metal substrate 35 is made of, for example, pure titanium, a titanium alloy, stainless steel, or the like.

The shape and the size of the metal substrate 35 are not particularly limited and are, for example, the same as those of the valve metal plate to be subjected to the anodization, that is, the aluminum substrate 10.

In a case where the metal substrate 35 is provided, it is not necessary to adjust the current or voltage to be applied, and the current of a predetermined current value or the voltage of a predetermined voltage value may be applied. In this case, since the metal substrate 35 suppresses the rapid rise of the current, the rise of the current becomes moderate, and the quantity of current increase falls within the above range.

The load member is not limited to the metal substrate 35 as long as it has conductivity and is electrically connected in parallel with a target to be subjected to the anodization.

Further, both the anodization device 30 illustrated in FIG. 15 and the anodization device 30 illustrated in FIG. 19 have a configuration in which the flat plate-shaped aluminum substrate 10 and the flat plate-shaped counter electrode 34 are provided; however, the configuration is not limited thereto. For example, a configuration in which an electricity feeding drum around which the aluminum substrate 10 to be subjected to the anodization is wound, and a counter electrode provided to face the electricity feeding drum may be adopted. Further, a configuration in which a plurality of electricity feeding drums are arranged, the plurality of electricity feeding drums are passed through, and the anodization is carried out repeatedly a plurality of times may be adopted.

Although the anodization is carried out a plurality of times, a conventionally known method can be used for the first time of anodization as described above. In this case, as the anodization, it is preferable to use a self-regulating method or a constant voltage treatment from the viewpoint of increasing the regularity of the through-hole arrangement and ensuring the anisotropic conductivity of the anisotropic conductive member.

Here, regarding the self-regulating method and the constant voltage treatment of the anodization, the same treatments as those described in paragraphs [0056] to [0108] and [FIG. 3] of JP2008-270158A can be applied.

<Anodization>

The average flow rate of the electrolytic solution in the anodization is preferably 0.5 to 20.0 m/min, more preferably 1.0 to 15.0 m/min, and still more preferably 2.0 to 10.0 m/min.

The method of causing the electrolytic solution to flow under the above conditions is not particularly limited; however, for example, a method that uses a general stirring device such as a stirrer is used. In particular, it is preferable to use a stirrer the stirring speed of which can be controlled by a digital display since the average flow rate can be controlled. Examples of such a stirring device include "Magnetic Stirrer HS-50D (manufactured by AS ONE Corporation)" and the like.

For the anodization, for example, a method of electrically energizing an aluminum substrate as the anode in a solution having an acid concentration of 1% to 10% by mass can be used.

The solution that is used for the anodization is preferably an acid solution, more preferably sulfuric acid, phosphoric acid, chromic acid, oxalic acid, sulfamic acid, benzenesulfonic acid, amidosulfonic acid, glycolic acid, tartaric acid, malic acid, or citric acid, and among them, particularly preferably sulfuric acid, phosphoric acid, or oxalic acid. These acids can be used alone or two or more thereof can be used in combination.

The conditions of the anodization cannot be sweepingly determined since they change depending on the electrolytic solution to be used; however, in general, the conditions of the anodization are preferably conditions in which the electrolytic solution concentration is 0.1% to 20% by mass, the liquid temperature is −10° C. to 30° C., the current density is 0.01 to 20 A/dm$^2$, the voltage is 3 to 300 V, and the electrolysis time is 0.5 to 30 hours, more preferably conditions in which the electrolytic solution concentration is 0.5% to 15% by mass, the liquid temperature is −5° C. to 25° C., the current density is 0.05 to 15 A/dm$^2$, the voltage is 5 to 250 V, and the electrolysis time is 1 to 25 hours, and still more preferably conditions in which the electrolytic solution concentration is 1% to 10% by mass, the liquid temperature is 0° C. to 20° C., the current density is 0.1 to 10 A/dm$^2$, the voltage is 10 to 200 V, and the electrolysis time is 2 to 20 hours.

In the anodization step described above, the average thickness of the anodized film that is formed by the anodization is preferably 30 μm or less and more preferably 5 to 20 μm from the viewpoint of supplying the anisotropic conductive member 20 in a shape of being wound around the winding core 21 having a predetermined diameter and a predetermined width, as illustrated in FIG. 13. The average thickness is determined by cutting and processing the anodized film with a focused ion beam (FIB) in the thickness direction, taking a photomicrograph of the surface of the cross section thereof with a field emission scanning electron microscope (FE-SEM) (magnification: 50,000 times), and carrying out calculation as an average value measured at 10 points.

[Holding Step]

The manufacturing method for an anisotropic conductive member may include a holding step. The holding step is a step of holding a voltage of 95% or more and 105% or less of the holding voltage selected from the range of 1 V or more and less than 30% of the voltage in the above-described anodization step for a total of 5 minutes or more, after the above-described anodization step. In other words, the holding step is a step of carrying out an electrolytic treatment at a voltage of 95% or more and 105% or less of the holding voltage selected from the range of 1 V or more and less than 30% of the voltage in the above-described anodization step for a total of 5 minutes or more, after the above-described anodization step.

Here, the "voltage in the anodization" is a voltage that is applied between the aluminum substrate and the counter electrode. For example, in a case where the electrolysis time by the anodization is 30 minutes, the "voltage in the anodization" is the average value of the voltage that is held for 30 minutes.

From the viewpoint of controlling the thickness of the side wall of the anodized film, that is, the thickness of the barrier layer with respect to the depth of the micropores, to a proper thickness, the voltage in the holding step is preferably 5% or more and 25% or less and more preferably 5% or more and 20% or less of the voltage in the anodization.

Further, due to the reason that the in-plane uniformity is further improved, the total holding time in the holding step is preferably 5 minutes or more and 20 minutes or less, more preferably 5 minutes or more and 15 minutes or less, and still more preferably 5 minutes or more and 10 minutes or less.

The holding time in the holding step may be 5 minutes or more in total; however, it is 5 minutes or more, where the holding time is preferably continuous.

Further, the voltage in the holding step may be set to be continuously or stepwise (step-shapedly) lowered from the voltage in the anodization step to the voltage in the holding step; however, due to the reason that the in-plane uniformity is further improved, it is preferable to set the voltage to 95% or more and 105% or less of the above-described holding voltage within 1 second after the completion of the anodization step.

The above-described holding step can be carried out continuously together with the above-described anodization step by, for example, lowering the electrolytic potential at the end part of the above-described anodization step.

In the above-described holding step, the same electrolytic solution and treatment conditions as those of the above-described conventionally known anodization can be adopted except for the electrolytic potential conditions.

In particular, in a case where the holding step and the anodization step are continuously carried out with each other, it is preferable to carry out the treatments using the same electrolytic solution.

[Barrier Layer Removing Step]

The barrier layer removing step is a step of removing the barrier layer of the anodized film by using, for example, an alkali aqueous solution containing ions of a metal M1 having a hydrogen overvoltage higher than that of aluminum.

By the barrier layer removing step described above, the barrier layer is removed, and as illustrated in FIG. 5, a metal layer 15*a* made of a metal M1 is formed in the bottom part of the micropore 12.

Here, the hydrogen overvoltage means a voltage required for hydrogen to be generated, and for example, the hydrogen overvoltage of aluminum (Al) is −1.66 V (Journal of the Chemical Society of Japan, 1982, (8), p1305 to 1313). Examples of the metal M1 having a hydrogen overvoltage higher than that of aluminum and the value of the hydrogen overvoltage thereof are shown below.

<Metal M1 and Hydrogen (1N $H_2SO_4$) Overvoltage>

Platinum (Pt): 0.00 V
Gold (Au): 0.02 V
Silver (Ag): 0.08 V
Nickel (Ni): 0.21 V
Copper (Cu): 0.23 V
Tin (Sn): 0.53 V
Zinc (Zn): 0.70 V In the present invention, due to the reason that the influence on electrical characteristics of a metal which undergoes a substitution reaction with a metal M2 with which the inside of the micropores is filled in the anodization step described later is small, the metal M1 that is used in the above-described barrier layer removing step is preferably a metal having an ionization tendency higher than that of the metal M2 that is used in the metal filling step.

Specifically, in a case where copper (Cu) is used as the metal M2 in the metal filling step, examples of the metal M1 that is used in the above-described barrier layer removing step include Zn, Fe, Ni, and Sn. Among them, Zn or Ni is preferably used, and Zn is more preferably used.

In a case where Ni is used as the metal M2 in the metal filling step, examples of the metal M1 that is used in the above-described barrier layer removing step include Zn and Fe. Among them, Zn is preferably used.

The method of removing the barrier layer using an alkali aqueous solution containing ions of such a metal M1 is not particularly limited, and examples thereof include the same methods as those of the conventionally known chemical etching treatments.

<Chemical Etching Treatment>

Only a barrier layer can be selectively dissolved to remove the barrier layer by a chemical etching treatment, for example, by a method in which a construct after the anodization step is immersed in an alkali aqueous solution, the inside of the micropores is filled with the alkali aqueous solution, and then the surface of the anodized film on the side of the opening part of the micropores is brought into contact with a pH (hydrogen ion exponent) buffer solution.

Here, as the alkali aqueous solution containing ions of the metal M1 described above, it is preferable to use at least one alkali aqueous solution selected from the group consisting of sodium hydroxide, potassium hydroxide, and lithium hydroxide. In addition, the concentration of the alkali aqueous solution is preferably 0.1% to 5% by mass. The temperature of the alkali aqueous solution is preferably 10° C. to 60° C., more preferably 15° C. to 45° C., and still more preferably 20° C. to 35° C.

Specifically, for example, a phosphoric acid aqueous solution of 50 g/L and 40° C., a sodium hydroxide aqueous solution of 0.5 g/L and 30° C., or a potassium hydroxide aqueous solution of 0.5 g/L and 30° C. is preferably used.

As the pH buffer solution, a buffer solution matching with the above-described alkali aqueous solution can be appropriately used.

The immersion time in the alkali aqueous solution is preferably 5 to 120 minutes, more preferably 8 to 120 minutes, still more preferably 8 to 90 minutes, and particularly preferably 10 to 90 minutes. Among the above, 10 to 60 minutes is preferable and 15 to 60 minutes is more preferable.

[Other Examples of Barrier Layer Removing Step]

The barrier layer removing step may be a step other than the above, which is a step of removing the barrier layer of the anodized film to expose a part of the aluminum substrate in the bottom of the micropores.

In this case, the method of removing the barrier layer is not particularly limited, and examples thereof include a method (hereinafter, also referred to as an "electrolytic removal treatment") in which the barrier layer is electrochemically dissolved at a potential lower than the potential of the anodization in the anodization step; a method (hereinafter, also referred to as an "etching removal treatment") in which the barrier layer is removed by etching; and a method (particularly, a method in which the residual barrier layer is subjected to an etching removal treatment for removal thereof after carrying out the electrolytic removal treatment) in which these methods are combined.

<Electrolytic Removal Treatment>

The electrolytic removal treatment is not particularly limited as long as it is an electrolytic treatment carried out at a potential lower than the potential (the electrolytic potential) of the anodization in the anodization step.

The electrolytic dissolution treatment can be carried out continuously together with the anodization by, for example, lowering the electrolytic potential at the end part of the anodization step.

In the electrolytic removal treatment, the same electrolytic solution and treatment conditions as those of the above-described conventionally known anodization can be adopted except for the electrolytic potential conditions.

In particular, in a case where the electrolytic removal treatment and the anodization are continuously carried out with each other as described above, it is preferable to use the same electrolytic solution.

(Electrolytic Potential)

The electrolytic potential in the electrolytic removal treatment is preferably lowered continuously or stepwise (step-shapedly) to a potential lower than the electrolytic potential in the anodization.

Here, the reduction width (the step width) in a case where the electrolytic potential is stepwise lowered is preferably 10 V or less, more preferably 5 V or less, and still more preferably 2 V or less, from the viewpoint of the voltage endurance of the barrier layer.

Further, the voltage lowering rate in a case where the electrolytic potential is continuously or stepwise lowered is preferably 1 V/sec or less, more preferably 0.5 V/sec or less, and still more preferably 0.2 V/sec or less, from the viewpoint of productivity and the like.

<Etching Removal Treatment>

The etching removal treatment is not particularly limited; however, it may be a chemical etching treatment that carries out dissolution using an acid aqueous solution or an alkali aqueous solution or may be a dry etching treatment.

(Chemical Etching Treatment)

Removing the barrier layer by chemical etching treatment is a method, for example, in which a construct after the anodization step is immersed in an acid aqueous solution or an alkali aqueous solution, the inside of the micropores is filled with the acid aqueous solution or the alkali aqueous solution, and then the surface of the anodized film on the side of the opening part of the micropores is brought into contact with a pH (hydrogen ion exponent) buffer solution, which is capable of selectively dissolving only the barrier layer.

Here, in a case where an acid aqueous solution is used, it is preferable to use an aqueous solution of an inorganic acid such as sulfuric acid, phosphoric acid, nitric acid, or hydrochloric acid, or a mixture thereof. The concentration of the acid aqueous solution is preferably 1% by mass to 10% by mass. The temperature at the acid aqueous solution is preferably 15° C. to 80° C., more preferably 20° C. to 60° C., and still more preferably 30° C. to 50° C.

On the other hand, in a case where an alkali aqueous solution is used, it is preferable to use at least one alkali aqueous solution selected from the group consisting of sodium hydroxide, potassium hydroxide, and lithium hydroxide. In addition, the concentration of the alkali aqueous solution is preferably 0.1% to 5% by mass. The temperature of the alkali aqueous solution is preferably 10° C. to 60° C., more preferably 15° C. to 45° C., and still more preferably 20° C. to 35° C. The alkali aqueous solution may contain zinc and other metals.

Specifically, for example, a phosphoric acid aqueous solution of 50 g/L and 40° C., a sodium hydroxide aqueous solution of 0.5 g/L and 30° C., or a potassium hydroxide aqueous solution of 0.5 g/L and 30° C. is preferably used.

As the pH buffer solution, a buffer solution matching with the above-described acid aqueous solution or alkali aqueous solution can be appropriately used.

The dipping time in the acid aqueous solution or the alkali aqueous solution is preferably 8 minutes to 120 minutes, more preferably 10 minutes to 90 minutes, and still more preferably 15 minutes to 60 minutes.

(Dry Etching Treatment)

In the dry etching treatment, it is preferable to use a kind of a gas such as a $Cl_2/Ar$ mixed gas.

[Metal Filling Step]

The metal filling step is a step of filling the inside of the micropores of the anodized film with, for example, the metal M2 as a conductive material by using electrolytic plating after the barrier layer removing step described above. A conductive conduction path is formed by the metal filling step.

<Metal M2>

The above-described metal M2 is preferably a material having an electrical resistivity of $10^3$ Ω·cm or less, and suitable specific examples thereof include gold (Au), silver (Ag), copper (Cu), aluminum (Al), magnesium (Mg), nickel (Ni), and zinc (Zn).

Among them, from the viewpoint of electrical conductivity, Cu, Au, Al, or Ni is preferable, Cu or Au is more preferable, and Cu is still more preferable.

Although a metal is used for filling in the metal filling step, the conduction path is not limited to the metal, and an oxide conductor or the like may be used as long as it is a conductive material. Accordingly, instead of the metal, for example, indium-doped tin oxide (ITO) or the like may be used for filling.

However, the conduction path is preferably made of a metal since the metal has excellent ductility and is easily deformed as compared with the oxide conductor, and is also easily deformed by compression at the time of joining. Among the metals, Cu or Au is more preferable since they are metals having the property of being easily deformed by compression in addition to the above-described electrical conductivity, and Cu is still more preferable in consideration of cost and the like.

<Metal Filling Method>

As a method of plating treatment for filling the inside of the micropore with the above-described metal M2, for example, an electrolytic plating method or an electroless plating method can be used.

However, it is difficult to selectively precipitate (grow) metal in the hole with a high aspect ratio by a conventionally known electrolytic plating method that is used for coloration or the like. It is presumed to because the precipitated metal is consumed in the holes and thus plating does not proceed even in a case where electrolysis is carried out for a constant period time or longer.

Therefore, in the manufacturing method according to the embodiment of the present invention, in a case where a metal is used for filling by the electrolytic plating method, it is necessary to allow a rest time during pulse electrolysis or constant potential electrolysis. A rest time of 10 seconds or more is required, and the rest time is preferably 30 to 60 seconds.

It is also desirable to additionally apply ultrasonic waves to promote the stirring of the electrolytic solution.

Further, the electrolytic voltage is usually 20 V or less and desirably 10 V or less; however, it is preferable to measure a precipitation potential of the target metal in the electrolytic solution to be used in advance and carry out constant potential electrolysis within the precipitation potential+1 V. In a case of carrying out constant potential electrolysis, it is desirable that cyclic voltammetry can be used in combination, and a potentiostat device from Solartron Analytical, BAS Inc., HOKUTO DENKO Corporation, Ivium Technologies, or the like can be used.

As the plating solution, a conventionally known plating solution can be used.

Specifically, an aqueous solution of copper sulfate is generally used for precipitating copper, where the concentration of copper sulfate is preferably 1 to 300 g/L and more preferably 100 to 200 g/L. Further, the precipitation can be promoted by adding hydrochloric acid to the electrolytic solution. In this case, the hydrochloric acid concentration is preferably 10 to 20 g/L.

In a case of precipitating gold, it is desirable to use a sulfuric acid solution of tetrachloroaurate and carry out plating by alternating current electrolysis.

In the electroless plating method, it takes a long time to fully fill a hole consisting of micropores having a high aspect ratio, and thus it is desirable to fill a hole with a metal by the electrolytic plating method in the manufacturing method according to the embodiment of the present invention.

In the present invention, a barrier layer is removed by the above-described barrier layer removing step, and a metal layer made of the above-described metal M1 is formed in the bottom part of the micropores, and thus it is presumed that the generation of a hydrogen gas due to the plating solution is suppressed and the metal filling by the plating treatment easily proceeds.

[Substrate Removing Step]

The substrate removing step is a step of removing the aluminum substrate, which is the valve metal plate described above, after the metal filling step. The method of removing the aluminum substrate is not particularly limited, and for example, a method in which dissolution is carried out by dissolution is preferable. Although the aluminum substrate is exemplified as an example of the valve metal plate for the explanation, a substrate to be removed is the valve metal plate and is not limited to the aluminum substrate.

<Dissolution of Aluminum Substrate>

For the above-described dissolution of the aluminum substrate, it is preferable to use a treatment liquid in which the anodized film is difficult to be dissolved but aluminum is easily dissolved.

In such a treatment liquid, the dissolution rate for aluminum is preferably 1 µm/min or more, more preferably 3 µm/min or more, and still more preferably 5 µm/min or more. Similarly, the dissolution rate for the anodized film is preferably 0.1 nm/min or less, more preferably 0.05 nm/min or less, and still more preferably 0.01 nm/min or less.

Specifically, the treatment liquid is preferably a treatment liquid containing at least one metal compound having an ionization tendency lower than that of aluminum and having a pH of 4 or less or 8 or more. The pH of the treatment liquid is more preferably 3 or less or 9 or more and still more preferably 2 or less or 10 or more.

The treatment liquid for dissolving aluminum is preferably a treatment liquid obtained by blending, for example, manganese, zinc, chromium, iron, cadmium, cobalt, nickel, tin, lead, antimony, bismuth, copper, mercury, silver, palladium, platinum, a gold compound (for example, chloroplatinic acid), fluorides of these metals, and chlorides of these metals, based on an acid or alkali aqueous solution.

Among them, an acid aqueous solution-based treatment liquid is preferable, and a chloride blend is preferably blended.

In particular, a treatment liquid obtained by blending mercury chloride in a hydrochloric acid aqueous solution (mercury chloride/hydrochloric acid) or a treatment liquid obtained by blending copper chloride in a hydrochloric acid aqueous solution (copper chloride/hydrochloric acid) are preferable from the viewpoint of the treatment latitude.

The composition of the treatment liquid for dissolving aluminum is not particularly limited, and for example, a bromine/methanol mixture, a bromine/ethanol mixture, aqua regia, or the like can be used.

The concentration of the acid or alkali of the treatment liquid for dissolving aluminum is preferably 0.01 to 10 mol/L and more preferably 0.05 to 5 mol/L.

Further, the treatment temperature in a case of using the treatment liquid for dissolving aluminum is preferably −10° C. to 80° C. and more preferably 0° C. to 60° C.

Further, the above-described dissolution of the aluminum substrate is carried out by bringing the aluminum substrate after the above-described metal filling step into contact with the above-described treatment liquid. The method of bringing an object into contact is not particularly limited, and examples thereof include a dipping method and a spraying method. Among them, a dipping method is preferable. In this case, the contact time is preferably 10 seconds to 5 hours and more preferably 1 minute to 3 hours.

[Protruding Step]

At least one of a front surface protruding step or a back surface protruding step is included for providing a protruding part.

Here, the front surface protruding step is a step of partially removing, in the thickness direction, the surface of the anodized film on the side where the above-described aluminum substrate is not provided and causing the metal M2 with which filling has been carried out in the metal filling step to protrude from the surface of the anodized film, after the above-described metal filling step and before the above-described substrate removing step.

In addition, the back surface protruding step is a step of partially removing, in the thickness direction, the surface of the anodized film on the side where the above-described aluminum substrate is provided and causing the metal M2 with which filling has been carried out in the metal filling step to protrude from the surface of the anodized film, after before the above-described substrate removing step.

The partial removal of the anodized film in the protruding step can be carried out, for example, by bringing the anodized film having micropores filled with a metal into contact with an acid aqueous solution or an alkali aqueous solution, which does not dissolve the above-described metal M1 and metal M2 (particularly, the metal M2) but dissolves the anodized film, that is aluminum oxide. The method of bringing an object into contact is not particularly limited, and examples thereof include a dipping method and a spraying method. Among them, a dipping method is preferable.

In a case where an acid aqueous solution is used, it is preferable to use an aqueous solution of an inorganic acid such as sulfuric acid, phosphoric acid, nitric acid, or hydrochloric acid, or a mixture thereof. Among the above, an aqueous solution containing no chromic acid is preferable since it is excellent in safety. The concentration of the acid aqueous solution is preferably 1% to 10% by mass. The temperature of the acid aqueous solution is preferably 25° C. to 60° C.

In addition, in a case where an alkali aqueous solution containing ions of the metal M1 described above is used, it is preferable to use at least one alkali aqueous solution selected from the group consisting of sodium hydroxide, potassium hydroxide, and lithium hydroxide. The concentration of the alkali aqueous solution is preferably 0.1% to 5% by mass. The temperature of the alkali aqueous solution is preferably 20° C. to 35° C.

Specifically, for example, a phosphoric acid aqueous solution of 50 g/L and 40° C., a sodium hydroxide aqueous solution of 0.5 g/L and 30° C., or a potassium hydroxide aqueous solution of 0.5 g/L and 30° C. is preferably used.

The immersion time in the acid aqueous solution or the alkali aqueous solution is preferably 8 to 120 minutes, more preferably 10 to 90 minutes, and still more preferably 15 to 60 minutes. Here, the immersion time means the total of each of the immersion times in a case where an immersion treatment for a short time is repeated. A washing treatment may be carried out between the immersion treatments.

[Resin Layer Forming Step]

It is preferable to have the above-described resin layer forming step due to the reason the transportability of the manufactured anisotropic conductive member 20 is improved.

Here, the resin layer forming step is a step of providing a resin layer on the surface of the anodized film on the side where the above-described aluminum substrate is not provided, after the above-described metal filling step (after the front surface protruding step in a case where the above-described front surface protruding step is included) and before the above-described substrate removing step.

Specific examples of the resin material constituting the above-described resin layer include an ethylene-based copolymer, a polyamide resin, a polyester resin, a polyurethane resin, a polyolefin-based resin, an acrylic resin, and a cellulose-based resin. However, from the viewpoint of transportability and the viewpoint of ease of use as the anisotropic conductive member, the above-described resin layer is preferably a film attached with a peelable adhesion layer, and more preferably a film attached with an adhesion layer whose adhesiveness becomes weakened by a heat treatment or an ultraviolet exposure treatment and become peelable.

The above-described film attached with an adhesion layer is not particularly limited, and examples thereof include a heat-peeling type resin layer and an ultraviolet (UV) peeling type resin layer.

Here, the heat-peeling type resin layer has adhesive power at room temperature and is easily peelable by only heating, and most of them mainly are obtained using effervescent microcapsules or the like.

Specific examples of the pressure sensitive adhesive constituting the adhesion layer include a rubber-based pressure sensitive adhesive, an acrylic-based pressure sensitive adhesive, a vinyl alkyl ether-based pressure sensitive adhesive, a silicone-based pressure sensitive adhesive, a polyester-based pressure sensitive adhesive, a polyamide-based pressure sensitive adhesive, an urethane-based pressure sensitive adhesives, and a styrene-diene block copolymer-based pressure sensitive adhesive.

In addition, the UV-peeling type resin layer has a UV-curing type adhesion layer, and the adhesive power is lost by curing, whereby the resin layer becomes peelable.

Examples of the UV-curing type adhesion layer include a polymer obtained by introducing a carbon-carbon double bond into a polymer side chain or a polymer main chain or at the terminal of a main chain of a base polymer. The base polymer having a carbon-carbon double bond preferably has an acrylic polymer as a base skeleton.

Further, since the acrylic polymer is crosslinked, a polyfunctional monomer or the like can be included as a monomer component for copolymerization, as necessary.

The base polymer having a carbon-carbon double bond can be used alone; however, a UV curable monomer or oligomer can also be blended.

It is preferable to use a photopolymerization initiator in combination with the UV-curing type adhesion layer in order to cure it by UV irradiation. Examples of the photopolymerization initiator include a benzoin ether compound; a ketal compound; an aromatic sulfonyl chloride compound; a photoactive oxime-based compound; a benzophenone-based compound; a thioxanthone-based compound; camphorquinone; a halogenated ketone; an acyl phosphinoxide; an acyl phosphonate.

Examples of commercially available product of the heat-peeling type resin layer include Intellimar [registered trade mark] tapes (manufactured by NITTA Corporation) such as WS5130002 and WS5130C10; Somatac [registered trade mark] TE series (manufactured by SOMAR Corporation); and REVALPHA [registered trade mark] series (manufactured by Nitto Denko Corporation) such as No. 3198, No. 3198LS, No. 3198M, No. 3198MS, No. 3198H, No. 3195, No. 3196, No. 3195M, No. 3195MS, No. 3195H, No. 3195HS, No. 3195V, No. 3195VS, No. 319Y-4L, No. 319Y-4LS, No. 319Y-4M, No. 319Y-4MS, No. 319Y-4H, No. 319Y-4HS, No. 319Y-4LSC, No. 31935MS, No. 31935HS, No. 3193M, and No. 3193MS.

As commercially available products of the UV-peeling type resin layer, for example, the followings can be used: dicing tapes such as ELEP HOLDER [registered trade mark] (manufactured by Nitto Denko Corporation) such as ELP DU-300, ELP DU-2385KS, ELP DU-2187G, ELP NBD-3190K, and ELP UE-2091J, Adwill D-210, Adwill D-203, Adwill D-202, Adwill D-175, and Adwill D-675 (all manufactured by LINTEC Corporation), SUMILITE [registered trade mark] FLS N8000 series (manufactured by Sumitomo Bakelite Co., Ltd.), and UC353EP-110 (manufactured by Furukawa Electric Co., Ltd.); and back grind tapes such as ELP RF-7232DB, ELP UB-5133D (all manufactured by Nitto Denko Corporation), SP-575B-150, SP-541B-205, SP-537T-160, and SP-537T-230 (all manufactured by FURUKAWA ELECTRIC Co., Ltd.).

The method of attaching the above-described film attached with an adhesion layer is not particularly limited, and the adhesion layer can be attached using a conventionally known surface protective tape attaching device and a laminator.

[Winding Step]

Due to the reason that the transportability of the manufactured anisotropic conductive member 20 is further improved, it is preferable to include a winding step of winding the anisotropic conductive member 20 into a roll in a state where the anisotropic conductive member 20 has the above-described resin layer after the above-described optional resin layer forming step.

Here, the winding method in the above-described winding step is not particularly limited, and examples thereof include a method of carrying out winding on the winding core 21 (see FIG. 13) having a predetermined diameter and a predetermined width.

Further, from the viewpoint of ease of the winding in the above-described winding step, the average thickness of the anisotropic conductive member 20 excluding the resin layer 19 (see FIG. 14) is preferably 30 µm or less and is more preferably 5 to 20 µm. The average thickness can be calculated by a method of cutting and processing the anisotropic conductive member 20 excluding the resin layer with a focused ion beam (FIB) in the thickness direction and taking a photomicrograph of the surface of the cross section thereof with field emission scanning electron microscope (FE-SEM) (magnification: 50,000 times) to obtain an average value measured at 10 points.

[Other Treatment Steps]

In addition to the above-described steps, the manufacturing method according to the embodiment of the present invention may include the polishing step, the surface smoothing step, the protective film forming treatment, and the water washing treatment, which are described in paragraphs [0049] to [0057] of WO2015/029881.

Further, from the viewpoint of manufacturing handleability and the use of the anisotropic conductive member 20 as the anisotropic conductive member, various types of processes and formats such as those described below can be applied.

<Example of Process in which Temporary Bonding Material is Used>

In the present invention, after obtaining the anisotropic conductive member 20 by the above-described substrate removing step, a step of fixing the anisotropic conductive member 20 on a silicon wafer using a temporary bonding material and thinning the fixed anisotropic conductive member 20 by polishing may be included.

After the step of thinning the layer, the surface is subsequently washed sufficiently and then can be subjected to the above-described front surface protruding step.

Next, after a temporary bonding material having an adhesive force stronger than that of the above temporary bonding material is applied onto the surface, on which a metal is allowed to protrude, so that the temporary bonding material is fixed on the silicon wafer, the silicon wafer bonded with the above temporary bonding material is peeled off, and then the peeled surface of the anisotropic conductive member 20 can be subjected to the above-described back surface protruding step.

<Example of Process in which Wax is Used>

In the present invention, after obtaining the anisotropic conductive member 20 by the above-described substrate removing step, a step of fixing the anisotropic conductive member 20 on a silicon wafer using wax and thinning the fixed anisotropic conductive member 20 by polishing may be included.

After the step of thinning the layer, the surface is subsequently washed sufficiently and then can be subjected to the above-described front surface protruding step.

Next, after a temporary bonding material is applied onto the surface, on which a metal is allowed to protrude, so that the temporary bonding material is fixed on the silicon wafer, the above wax is melted by heating to peel off the silicon wafer, and then the peeled surface of the anisotropic conductive member 20 can be subjected to the above-described back surface protruding step.

Solid wax may be used; however, the uniformity of coating thickness can be improved in a case where liquid wax such as SKYCOAT (manufactured by NIKKA SEIKO Co., Ltd.) is used.

<Example of Process of Carrying Out Substrate Removal Treatment Substrate Later>

In the present invention, a step of fixing the aluminum substrate on a rigid substrate (for example, a silicon wafer or a glass substrate) using a temporary bonding material, wax, or a functional adsorption film and then thinning the surface of the above-described anodized film on the side where the above-described aluminum substrate is not provided may be included after the above-described metal filling step and before the above-described substrate removing step.

After the step of thinning the layer, the surface is subsequently washed sufficiently and then can be subjected to the above-described front surface protruding step.

After a resin material (for example, an epoxy resin or a polyimide resin) which is an insulating material is applied onto the surface on which a metal is allowed to protrude, and a rigid substrate can be subsequently attached to this surface by the same method as described above. The attachment by using a resin material can be carried out by selecting a resin material in which the adhesive force is greater than the adhesive force due to a temporary bonding material or the like, subsequently peeling off the firstly attached rigid substrate after the attachment by using with the resin material, and carrying out the above-described substrate removing step, polishing step, and back surface protruding treatment step in order.

As the functional adsorption film, Q-chuck (registered trade mark) (manufactured by MARUISHI SANGYO Co., Ltd.) or the like can be used.

In the present invention, it is preferable that the anisotropic conductive member 20 is provided as a product in a state of being attached to a rigid substrate (for example, a silicon wafer or a glass substrate) by a peelable layer.

In such a supply form, in a case where the anisotropic conductive member 20 is used as a joining member, the surface of the anisotropic conductive member 20 is temporarily adhered to the surface of a device, a device to be connected is mounted in an appropriate place after peeling off the rigid substrate, and heating and compression is carried out, whereby the upper and lower devices can be joined by the anisotropic conductive member 20.

Further, as the peelable layer, a heat peeling layer may be used, or a photo peeling layer may be used in combination with a glass substrate.

Further, each of the above-described steps can be carried out by a single-sheet type treatment or can be carried out by a continuous-web type treatment using an aluminum coil as a raw material sheet.

Further, in a case of being carried out by a continuous treatment, it is preferable to include a suitable cleaning step and drying step between individual steps.

By the manufacturing method having each of the above-described treatment steps, the anisotropic conductive member 20 is obtained, where the anisotropic conductive member 20 is obtained by filling, with a metal, the inside of a micropore derived from a micropore provided on an insulating base material made of an anodized film of an aluminum substrate.

Specifically, by the above-described manufacturing method, it is possible to obtain, for example, the anisotropic conductive member disclosed in JP2008-270158A, that is, an anisotropic conductive member that is provided in a state where, in an insulating base material (anodized film of an aluminum substrate having micropores), a plurality of conduction paths made of a conductive member (a metal) penetrate the above-described insulating base material in the thickness direction in a state of being insulated from each other, and in addition, one end part of each of the above-described conduction paths is exposed on one surface of the above-described insulating base material and the other end part of each of the above-described conduction paths is exposed on the other surface of the above-described insulating base material.

Further, since anodized film having straight micropores can be obtained as described above, the anisotropic conductive member 20 in which a filling defect is suppressed can be obtained in a case where micropores are filled with a conductive material. As a result, for example, in a case where the filling is carried out with a conductive material such as a metal, it is possible to obtain an anisotropic conductive member having a sound conduction path in which a filling defect is suppressed.

Hereinafter, the anisotropic conductive member 20 will be described.

Figure 20:
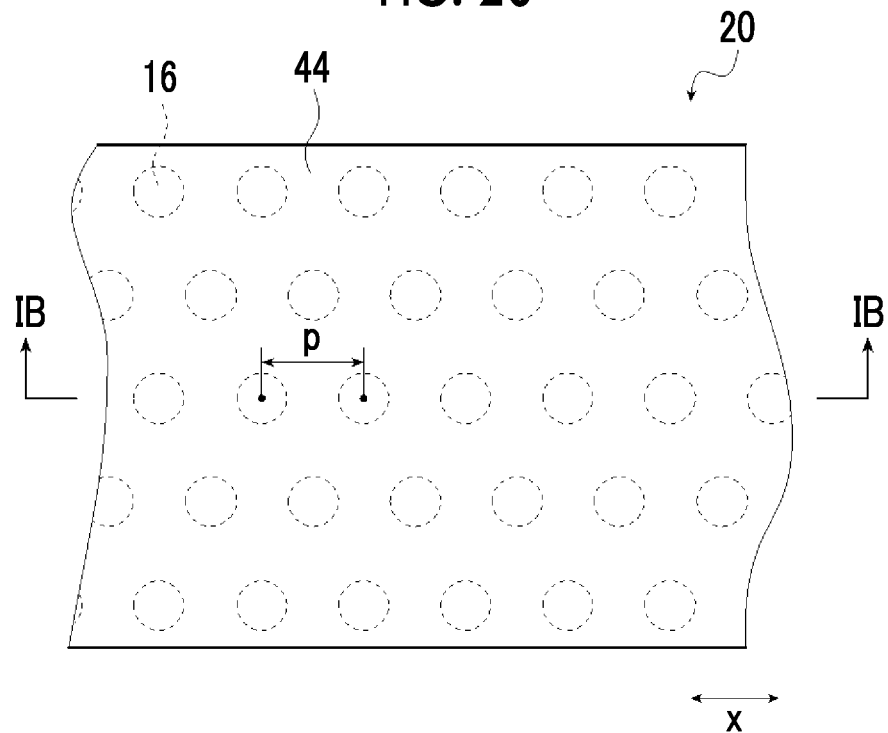
FIG. 20 is a plan view illustrating an example of anisotropic conductive member according to the embodiment of the present invention.
Figure 21:
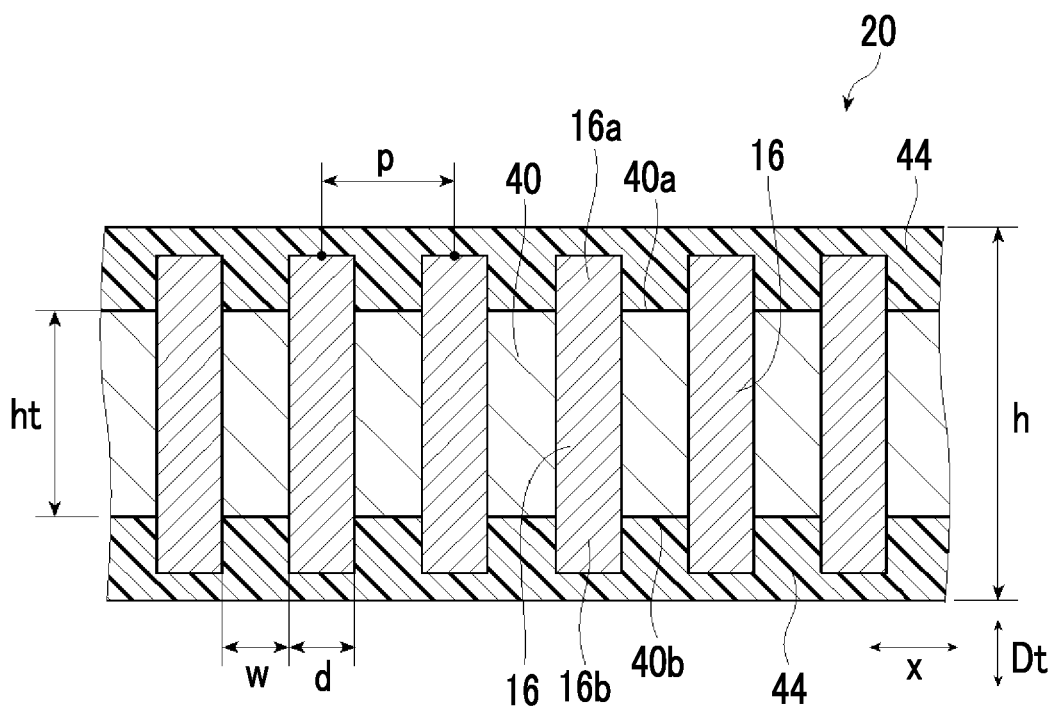
FIG. 21 is a schematic cross-sectional view illustrating an example of the anisotropic conductive member according to the embodiment of the present invention.
Figure 22:
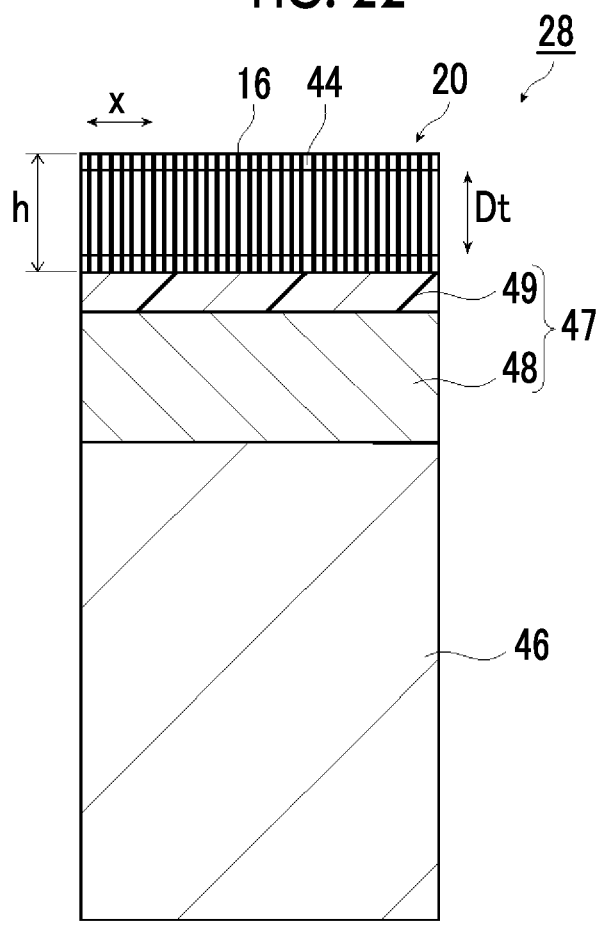
FIG. 22 is a schematic cross-sectional view illustrating an example of a configuration of the anisotropic conductive material obtained using the anisotropic conductive member according to the embodiment of the present invention.

First, an example of the anisotropic conductive member 20 manufactured by the above-described manufacturing method will be described. FIG. 20 is a plan view illustrating an example of the anisotropic conductive member according to the embodiment of the present invention, and FIG. 21 is a schematic cross-sectional view illustrating an example of the anisotropic conductive member according to the embodiment of the present invention. FIG. 21 is a cross-sectional view taken along the line IB-IB of FIG. 20. In addition, FIG. 22 is a schematic cross-sectional view illustrating an example of a configuration of the anisotropic conductive material obtained using the anisotropic conductive member according to the embodiment of the present invention.

The anisotropic conductive member 20 manufactured as described above is a member, for example, having an insulating base material 40 consisting of an anodized film of aluminum and a plurality of conduction paths 16 that penetrate the insulating base material 40 in the thickness direction Dt (see FIG. 21) and are provided in a state of being electrically insulated from each other as illustrated in FIG. 20 and FIG. 21. The anisotropic conductive member 20 further includes a resin layer 44 provided on a front surface 40a and a back surface 40b of the insulating base material 40.

Here, the "state of being electrically insulated from each other" means a state where each of the conduction paths present in the inside of the insulating base material has a sufficiently low inter-conduction path conductivity in the inside of the insulating base material.

In the anisotropic conductive member 20, the conduction paths 16 having conductivity are electrically insulated from each other, and the conductivity is very low in the direction x orthogonal to the thickness direction Dt (see FIG. 21) of the insulating base material 40 and has conductivity in the thickness direction Dt (see FIG. 21). As described above, the anisotropic conductive member 20 is a member exhibiting anisotropic conductivity. For example, the anisotropic conductive member 20 is arranged so that the thickness direction Dt (see FIG. 21) coincides with the stacking direction Ds (see FIG. 23) of the stacked device 60 (see FIG. 23).

The conduction path 16 is made of a conductive material and has conductivity. Further, as illustrated in FIG. 20 and FIG. 21, the conduction paths 16 are provided to penetrate the insulating base material 40 in the thickness direction Dt in a state of being electrically insulated from each other.

Further, as illustrated in FIG. 21, the conduction path 16 may have a protruding portion 16a and a protruding portion 16b protruding from the front surface 40a and the back surface 40b of the insulating base material 40. The anisotropic conductive member 20 may further include the resin layer 44 provided on the front surface 40a and the back surface 40b of the insulating base material 40. The resin layer 44 also has adhesiveness and imparts joinability. The lengths of the protruding portion 16a and the protruding portion 16b are preferably 6 nm or more and more preferably 30 nm to 500 nm.

In FIG. 22 and FIG. 21, a configuration in which the resin layer 44 is provided on the front surface 40a and the back surface 40b of the insulating base material 40; however, the configuration is not limited to this, and a configuration in which the resin layer 44 is provided at least one of the surfaces of the insulating base material 40 may be adopted.

Similarly, the conduction path 16 in FIG. 22 and FIG. 21 has the protruding portion 16a and the protruding portion 16b at both terminals, respectively; however, the configuration is not limited to this, and a configuration in which the protruding portion is provided on the surface of the insulating base material 40 on the side where at least resin layer 44 is provided may be adopted.

The thickness h of the anisotropic conductive member 20 illustrated in FIG. 21 is, for example, 30 µm or less. Further, the anisotropic conductive member 20 preferably has a total thickness variation (TTV) of 10 µm or less.

Here, the thickness h of the anisotropic conductive member 20 is an average value obtained by observing the anisotropic conductive member 20 with a field emission scanning electron microscope at a magnification of 200,000 times to acquire a contour shape of the anisotropic conductive member 20 and carrying out measurement at 10 points in the region corresponding to the thickness h.

The total thickness variation (TTV) of the anisotropic conductive member 20 is a value obtained by cutting the anisotropic conductive member 20 and observing the cross-sectional shape of the anisotropic conductive member 20.

The anisotropic conductive member 20 is provided on a support 46 as illustrated in FIG. 22 for transport, transfer, transportation, storage, and the like. A peeling layer 47 is provided between the support 46 and the anisotropic conductive member 20. The support 46 and the anisotropic conductive member 20 are separably adhered to each other by the peeling layer 47. As described above, an object in which the anisotropic conductive member 20 is provided on the support 46 through the peeling layer 47 is referred to as the anisotropic conductive material 28.

The support 46 supports the anisotropic conductive member 20 and is composed of, for example, a silicon substrate. As the support 46, in addition to the silicon substrate, for example, a ceramic substrate such as SiC, SiN, GaN, or alumina ($Al_2O_3$), a glass substrate, a fiber reinforced plastic substrate, or a metal substrate can be used. The fiber reinforced plastic substrate includes a flame retardant type 4 (FR-4) substrate, which is a printed wiring board.

Further, as the support 46, a support which is flexible and transparent can be used. Examples of the flexible and transparent support 46 include plastic films such as polyethylene terephthalate (PET), polycycloolefin, polycarbonate, an acrylic resin, polyethylene naphthalate (PEN), polyethylene (PE), polypropylene (PP), polystyrene, polyvinyl chloride, polyvinylidene chloride, and triacetyl cellulose (TAC).

Here, "transparent" means that light has a transmittance of 80% or more at a wavelength that is used for registration. For this reason, the transmittance may be low in the entire visible light range of the wavelength of 400 to 800 nm; however, the transmittance is preferably 80% or more in the entire visible light range of the wavelength of 400 to 800 nm. The transmittance is measured using a spectrophotometer.

The peeling layer 47 is preferably a layer obtained by laminating the support layer 48 and a peeling agent 49. The peeling agent 49 is in contact with the anisotropic conductive member 20, and the support 46 and the anisotropic conductive member 20 are separated from each other from the peeling layer 47 as the starting point. In the anisotropic conductive material 28, the adhesive force of the peeling agent 49 is weakened, for example, by heating to a predetermined temperature, and the support 46 is removed from the anisotropic conductive member 20.

As the peeling agent 49, for example, Riva Alpha (registered trade mark) manufactured by Nitto Denko Corporation, Somatac (registered trade mark) manufactured by SOMAR Corporation, or the like can be used.

Further, a protective layer (not illustrated in the drawing) may be provided on the resin layer 44. Since the protective layer is used to protect the surface of the structure body from scratches and the like, an easily peelable tape is preferable. As the protective layer, for example, a film attached with an adhesion layer may be used.

As the film attached with an adhesion layer, for example, SUNYTECT [registered trade mark] (manufactured by Sun A. Kaken Co., Ltd) in which an adhesive layer is formed on the surface of a polyethylene resin film, E-MASK [registered trade mark] (manufactured by Nitto Denko Corporation) in which an adhesive layer is formed on the surface of a polyethylene terephthalate resin film, or a commercially available product sold under series name of MASTACK [registered trade mark] (manufactured by FUJIMORI KOGYO Co., Ltd.) or the like in which an adhesive layer is formed on the surface of a polyethylene terephthalate resin film can be used.

The method of attaching the film attached with an adhesion layer is not particularly limited, and the adhesion layer can be attached using a conventionally known surface protective tape attaching device and a laminator.

Hereinafter, the configuration of the anisotropic conductive member 20 will be described more specifically.

[Insulating Base Material]

The physical properties and the composition of the insulating base material are as described above.

The thickness ht of the insulating base material 40 is preferably in a range of 1 to 1,000 µm, more preferably in a range of 5 to 500 µm, and still more preferably in a range of 10 to 300 µm. In a case where the thickness of the insulating base material is within this range, the handleability of the insulating base material is improved.

The thickness ht of the insulating base material 40 is an average value obtained by cutting and processing the insulating base material 40 with a focused ion beam (FIB) in the thickness direction Dt, observing the cross section thereof with a field emission scanning electron microscope at a magnification of 200,000 times to acquire a contour shape of the insulating base material 40 and carrying out measurement at 10 points in the region corresponding to the thickness ht.

The spacing between the micropores in the insulating base material is preferably 5 nm to 800 nm, more preferably 10 nm to 200 nm, and even more preferably 50 nm to 140 nm. In a case where the spacing between the micropores in the insulating base material is within this range, the insulating base material sufficiently functions as an insulating partition wall. The spacing between the micropores is the same as the spacing between the conduction paths.

Here, the spacing between the micropores, that is, the spacing between the conduction paths means the width w between the adjacent conduction paths (see FIG. 21) and refers to an average value obtained by observing the cross section of the anisotropic conductive member with a field emission scanning electron microscope at a magnification of 200,000 times and measuring the width between adjacent conduction paths at 10 points.

[Conduction Path]

The conduction path is made of a conductive material with which micropores are filled. The conductive material is not particularly limited as long as it has an electrical resistivity of $10^3$ Ω·cm or less, and a metal or the like is used. Suitable specific examples of the metal include gold (Au), silver (Ag), copper (Cu), aluminum (Al), magnesium (Mg), and nickel (Ni). In addition to the metal, indium-doped tin oxide (ITO) or the like is suitably exemplified. From the viewpoint of electrical conductivity, copper, gold, aluminum, or nickel is preferable, and copper or gold is more preferable.

<Protruding Portion>

In a case where the anisotropic conductive member and the electrode are electrically connected or physically joined by a method such as crimping, due to the reason that sufficient insulation can be ensured in the surface direction in a case where the protruding portion is crushed, the aspect ratio of the protruding portion (the height of the protruding portion/the diameter of the protruding portion) of the conduction path is preferably 0.5 or more and less than 50, more preferably 0.8 to 20, and still more preferably 1 to 10.

Further, from the viewpoint of following the surface shape of the semiconductor member to be connected, the height of the protruding portion of the conduction path is preferably 20 nm or more and more preferably 100 nm to 500 nm, as described above.

The height of the protruding portion of the conduction path is an average value obtained by observing the cross section of the anisotropic conductive member at a magnification of 20,000 times with a field emission scanning electron microscope and measuring the height of the protruding portion of the conduction path at 10 points.

The diameter of the protruding portion of the conduction path is an average value obtained by observing the cross section of the anisotropic conductive member with a field emission scanning electron microscope and measuring the diameter of the protruding portion of the conduction path at 10 points.

As described above, the conduction paths 16 are present in a state of being electrically insulated from each other by the insulating base material 40; however, the density thereof is preferably 20,000 paths/mm$^2$ or more, more preferably 2 million paths/mm$^2$ or more, still more preferably 10 million paths/mm$^2$ or more, particularly preferably 50 million paths/mm$^2$ or more, and most preferably 100 million paths/mm$^2$ or more.

Further, the center-to-center distance p of the adjacent conduction paths 16 (see FIG. 20) is preferably 20 nm to 500 nm, more preferably 40 nm to 200 nm, and still more preferably 50 nm to 140 nm.

[Resin Layer]

As described above, the resin layer is provided on the front surface and the back surface of the insulating base material, and the protruding part of the conduction path is embedded therein as described above. That is, the resin layer covers an end part of the conduction path protruding from the insulating base material and protects the protruding part.

The resin layer is formed by the above-described resin layer forming step. The resin layer preferably exhibits fluidity in a temperature range of 50° C. to 200° C. and preferably cures at 200° C. or higher.

The resin layer is formed by the above-described resin layer forming step; however, the composition of the resin agent shown below can also be used. Hereinafter, the composition of the resin layer will be described. The resin layer contains a polymer material. The resin layer may contain antioxidant material.

<Polymer Material>

The polymer material contained in the resin layer is not particularly limited; however, due to the reason that the gap between the semiconductor chip or the semiconductor wafer and the anisotropic conductive member can be efficiently filled, and the adhesiveness to the semiconductor chip or the semiconductor wafer is further improved, it is preferably a thermosetting resin.

Specific examples of the thermosetting resin include an epoxy resin, a phenol resin, a polyimide resin, a polyester resin, a polyurethane resin, a bismaleimide resin, a melamine resin, and an isocyanate resin.

Among them, due to the reason that insulation reliability is further improved and chemical resistance is excellent, a polyimide resin and/or an epoxy resin is preferably used.

<Antioxidant Material>

Specific examples of the antioxidant material contained in the resin layer include 1,2,3,4-tetrazole, 5-amino-1,2,3,4-tetrazole, 5-methyl-1,2,3,4-tetrazole, 1H-tetrazol-5-acetic acid, 1H-tetrazol-5-succinic acid, 1,2,3-triazole, 4-amino-1,2,3-triazole, 4,5-diamino-1,2,3-triazole, 4-carboxy-1H-1,2,3-triazole, 4,5-dicarboxy-1H-1,2,3-triazole, 1H-1,2,3-triazole-4-acetic acid, 4-carboxy-5-carboxymethyl-1H-1,2,3-triazole, 1,2,4-triazole, 3-amino-1,2,4-triazole, 3,5-diamino-1,2,4-triazole, 3-carboxy-1,2,4-triazole, 3,5-dicarboxy-1,2,4-triazole, 1,2,4-triazole-3-acetic acid, 1H-benzotriazole, 1H-benzotriazole-5-carboxylic acid, benzofloxane, 2,1,3-benzothiazole, o-phenylenediamine, m-phenylenediamine, catechol, o-aminophenol, 2-mercaptobenzothiazole, 2-mercaptobenzoimidazole, 2-mercaptobenzoxazole, melamine, and derivatives thereof.

Among these, benzotriazole and a derivative thereof are preferable.

Examples of the benzotriazole derivative include substituted benzotriazole having, in the benzene ring of benzotriazole, a hydroxyl group, an alkoxy group (for example, methoxy group or ethoxy group), an amino group, a nitro group, an alkyl group (for example, a methyl group, an ethyl group, or a butyl group), and a halogen atom (for example, fluorine, chlorine, bromine, or iodine). In addition, examples thereof can include substituted naphthalene triazole and substituted naphthalene bistriazole, which have been substituted in the same manner as naphthalene triazole and naphthalene bistriazole.

In addition, other examples of the antioxidant material contained in the resin layer include general antioxidants such as a higher fatty acid, a higher fatty acid copper, a phenol compound, an alkanol amine, hydroquinone, a copper chelating agent, an organic amine, and an organic ammonium salt.

The content of the antioxidant material contained in the resin layer is not particularly limited; however, from the viewpoint of the anticorrosion effect, it is preferably 0.0001% by mass or more and more preferably 0.001% by mass or more with respect to the total mass of the resin layer. Further, due to the reason that an appropriate electric resistance is obtained in the main joining process, the content thereof is preferably 5.0% by mass or less and more preferably 2.5% by mass or less.

<Migration Prevention Material>

The resin layer preferably contains a migration prevention material due to the reason that the insulation reliability is further improved by trapping metal ions and halogen ions, which may be contained in the resin layer, and metal ions derived from a semiconductor chip and a semiconductor wafer.

As the migration prevention material, it is possible to use, for example, an ion exchanger, specifically, a mixture of a cation exchanger and anion exchanger, or only a cation exchanger.

Here, the cation exchanger and the anion exchanger can be appropriately selected respectively, for example, from the inorganic ion exchanger and the organic ion exchanger described later.

(Inorganic Ion Exchanger)

Examples of the inorganic ion exchanger include a hydrous oxide of a metal represented by hydrous zirconium hydroxide.

Examples of the kind of metal include in addition to zirconium, iron, aluminum, tin, titanium, antimony, magnesium, beryllium, indium, chromium, and bismuth.

Among them, the zirconium-based inorganic ion exchanger has exchangeability for cations, $Cu^{2+}$, and $Al^{3+}$. The iron-based inorganic ion exchanger also has exchangeability for $Ag^+$ and $Cu^{2+}$. Similarly, the tin-based, titanium-based, and antimony-based inorganic ion exchangers are cation exchangers.

On the other hand, the bismuth-based inorganic ion exchanger has exchangeability for anion $Cl^-$.

In addition, the zirconium-based inorganic ion exchanger exhibits anion exchangeability depending on the manufacturing conditions. The same applies to the aluminum-based and tin-based inorganic ion exchangers.

As other inorganic ion exchangers other than the above, compounds such as an acid salt of a polyvalent metal represented by zirconium phosphate, a heteropolyacid salt represented by ammonium molybdrinate, and an insoluble ferrocyanide are known.

Some of these inorganic ion exchangers are already commercially available, and for example, products of various grades under the trade name "IXE" of TOAGOSEI Co., Ltd. are known.

In addition to synthetic products, natural zeolite or inorganic ion exchanger powder such as montmorillonite can also be used.

(Organic Ion Exchanger)

Examples of the organic ion exchanger include crosslinked polystyrene having a sulfonic acid group as a cation exchanger and those having a carboxylic acid group, a phosphonic acid group, or a phosphinic acid group.

Examples of the anion exchanger include crosslinked polystyrene having a quaternary ammonium group, a quaternary phosphonium group, or a tertiary sulfonium group.

These inorganic ion exchangers and organic ion exchangers may be appropriately selected in consideration of the kinds of cations and anions to be captured and the exchange capacity for the ions. Of course, it goes without saying that the inorganic ion exchanger and the organic ion exchanger may be mixed to be used.

An inorganic ion exchanger is preferable since a heating process is included in the manufacturing step of an electronic element.

Further, regarding the mixing ratio between the migration prevention material and the above-described polymer material, the amount of the migration prevention material is preferably 10% by mass or less, the amount of the migration prevention material is more preferably 5% by mass or less, and the amount of the migration prevention material is still more preferably 2.5% by mass or less, from the viewpoint of mechanical strength. Further, from the viewpoint of suppressing migration in a case where a semiconductor chip or a semiconductor wafer is joined to the anisotropic conductive member, the amount of the migration prevention material is particularly preferably 0.01% by mass or more.

<Inorganic Filler>

The resin layer preferably contains an inorganic filler.

The inorganic filler is not particularly limited and may be appropriately selected from known ones. Examples thereof include kaolin, barium sulfate, barium titanate, silicon oxide powder, finely powdered silicon oxide, vapor phase silica, amorphous silica, crystalline silica, molten silica, spherical silica, talc, clay, magnesium carbonate, calcium carbonate, aluminum oxide, aluminum hydroxide, mica, aluminum nitride, zirconium oxide, yttrium oxide, silicon carbide, and silicon nitride.

It is preferable that the average particle size of the inorganic filler is larger than the spacing between the conduction paths due to the reason that entering of an inorganic filler between the conduction paths is prevented and thus conduction reliability is further improved.

The average particle size of the inorganic filler is preferably 30 nm to 10 μm and more preferably 80 nm to 1 μm.

Here, regarding the average particle size, a primary particle size measured by a laser diffraction scattering type particle size measuring apparatus (Microtrac MT3300 manufactured by Nikkiso Co., Ltd.) is used as the average particle size.

<Curing Agent>

The resin layer may contain a curing agent.

In a case where a curing agent is contained, it is preferable not to use a curing agent that is a solid at room temperature but to contain a curing agent that is a liquid at room temperature from the viewpoint of suppressing poor joining to the surface shape of the semiconductor chip or semiconductor wafer to be connected.

Here, the "solid at room temperature" refers to a solid at 25° C., for example, a substance having a melting point higher than 25° C.

Specific examples of the curing agent include an aromatic amine such as diaminodiphenylmethane or diaminodiphenylsulfone, an aliphatic amine, an imidazole derivative such as 4-methylimidazole, dicyandiamide, tetramethylguanidine, thiourea-added amine, a carboxylic acid anhydride such as methylhexahydrophthalic acid anhydride, carboxylic acid hydrazide, a carboxylic acid amide, a polyphenol compound, a novolak resin, and a polymercaptan. From these curing agents, a compound that is a liquid at 25° C. can be appropriately selected and used. The curing agent may be used alone, or two or more thereof may be used in combination.

The resin layer may contain various additives such as a dispersant, a buffer, and a viscosity-adjusting agent, which are extensively and generally added to the resin insulating film of a semiconductor package, within the range where the characteristics of the resin layer are not impaired.

<Shape>

Due to the reason of protecting a conduction path, the thickness of the resin layer is preferably larger than the height of the protruding part of the conduction path and is preferably 1 μm to 5 μm.

Hereinafter, an application example of the anisotropic conductive member 20 will be described.

[Stacked Device]

Next, a stacked device will be described. The stacked device has a conductive member having a conductive part having conductivity and anisotropic conductive member and is obtained by bringing the conductive part into contact with the protruding part of the anisotropic conductive member to be joined with each other. The stacked device is, for example, a device that exhibits a specific function as one unit. It is noted that the stacked device also includes a device in which a plurality of devices are gathered to exhibit a specific function.

Figure 23:
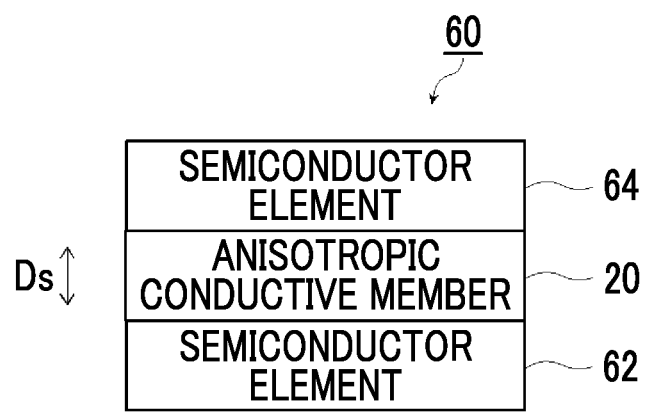
FIG. 23 is a schematic view illustrating a first example of a stacked device having the anisotropic conductive member according to the embodiment of the present invention.
Figure 24:
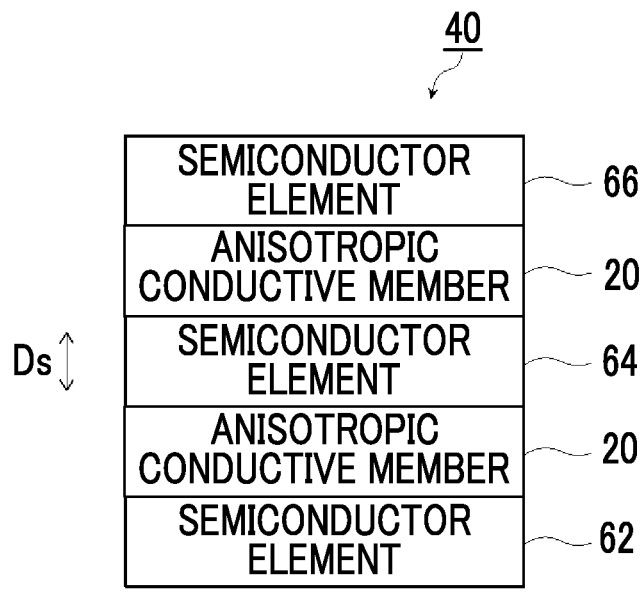
FIG. 24 is a schematic view illustrating a second example of a stacked device having the anisotropic conductive member according to the embodiment of the present invention.

FIG. 23 is a schematic view illustrating a first example of a stacked device having the anisotropic conductive member according to the embodiment of the present invention, and FIG. 24 is a schematic view illustrating a second example of the stacked device having the anisotropic conductive member according to the embodiment of the present invention.

In the stacked device 60 illustrated in FIG. 23, for example, a semiconductor element 62, the anisotropic conductive member 20, and a semiconductor element 64 are stacked and joined in order in the stacking direction Ds and are electrically connected. Although not illustrated in the drawing, a conductive part such as an electrode or a terminal, which carries out conduction for the semiconductor element 62, is brought into contact with the protruding part of the anisotropic conductive member 20 to be joined with each other.

The stacked device 60 has a form in which one semiconductor element 64 is joined to one semiconductor element 62; however, the form is not limited thereto. As in the case of the stacked device 60 illustrated in FIG. 24, a form in which three semiconductor elements 62, 64, and 66 are stacked and joined in the stacking direction Ds through the anisotropic conductive member 20 may be also adopted. In this case as well, although not illustrated in the drawing, an electrode, a terminal, or the like, which carries out conduction for the semiconductor elements 62, 64, and 66, is brought into contact with the protruding part of the anisotropic conductive member 20 to be joined with each other.

Both of the stacked devices 60 illustrated in FIG. 23 and FIG. 24 described above are called semiconductor devices, electronic devices, or the like.

The semiconductor elements 62, 64, and 66 described above are conductive members having a conductive part having conductivity. The conductive member having the conductive part having conductivity is not limited to the semiconductor element and may be a substrate having an electrode. Examples of the substrate having an electrode are a wiring board and an interposer.

[Manufacturing Method for Stacked Device]

Next, a manufacturing method for the stacked device 60 having the anisotropic conductive member 20 illustrated in FIG. 23 will be described.

Figure 25:
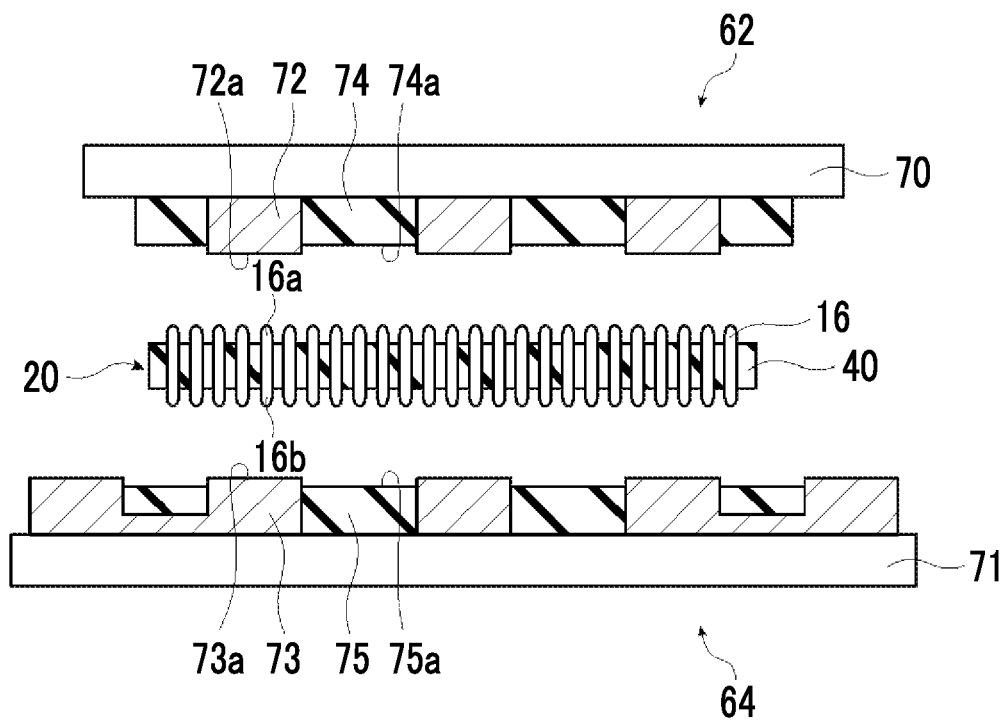
FIG. 25 is a schematic cross-sectional view illustrating a step of a manufacturing method for the stacked device having the anisotropic conductive member according to the embodiment of the present invention.
Figure 26:
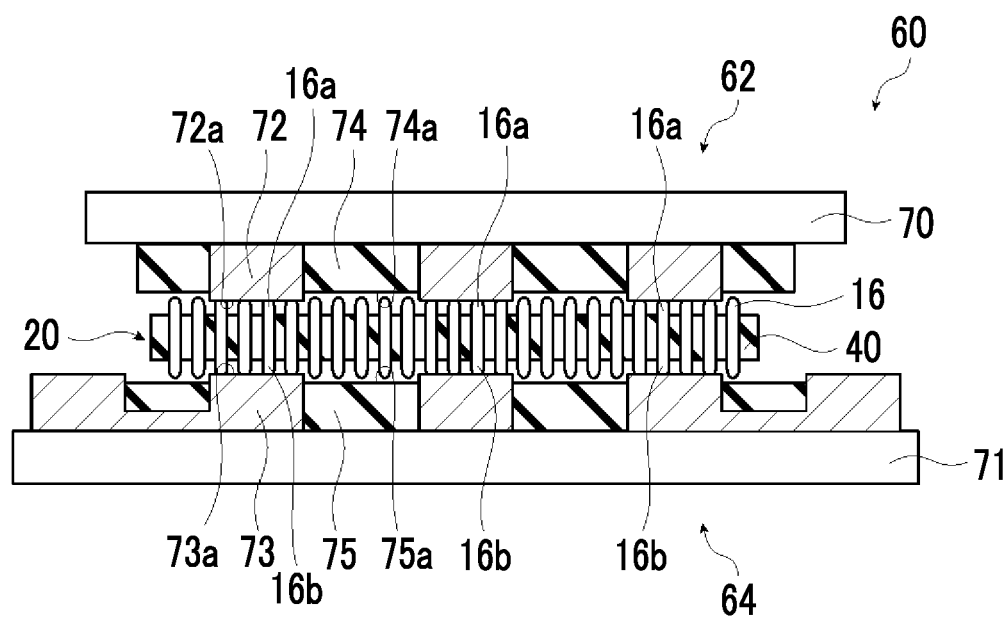
FIG. 26 is a schematic cross-sectional view illustrating a step of a manufacturing method for the stacked device having the anisotropic conductive member according to the embodiment of the present invention.
Figure 27:
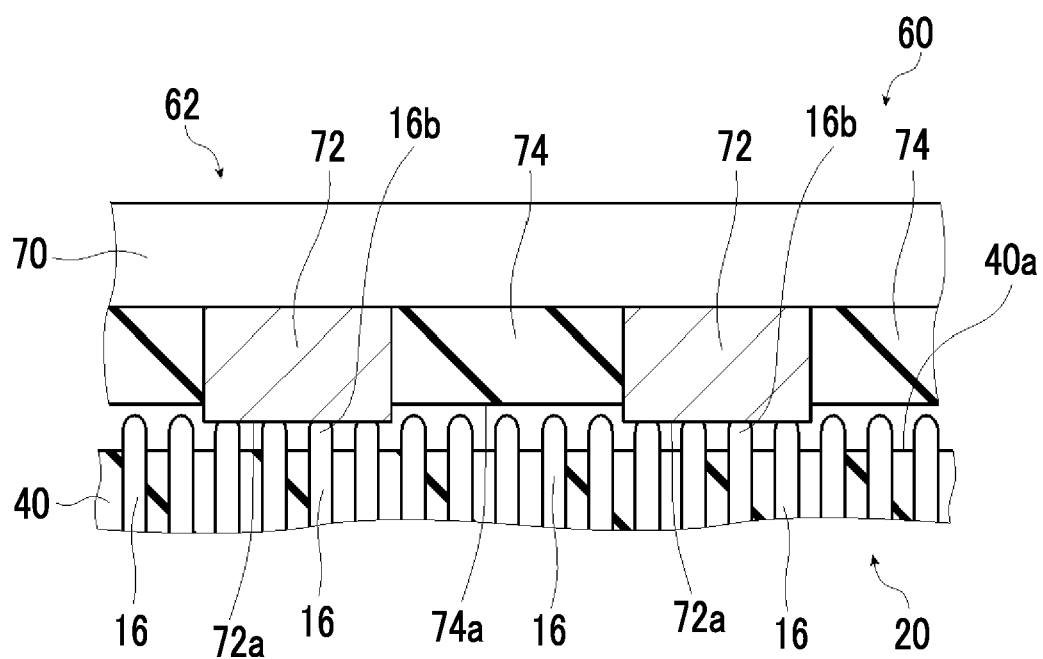
FIG. 27 is a schematic enlarged cross-sectional view illustrating a step of a manufacturing method for the stacked device having the anisotropic conductive member according to the embodiment of the present invention.

FIG. 25 and FIG. 26 are schematic views illustrating the manufacturing method for the stacked device having the anisotropic conductive member according to the embodiment of the present invention in the order of steps. FIG. 27 is a schematic enlarged cross-sectional view illustrating a step of a manufacturing method for the stacked device having the anisotropic conductive member according to the embodiment of the present invention. In FIG. 25 to FIG. 27, the same configuration components as those of the anisotropic conductive member 20 illustrated in FIG. 20 to FIG. 22 and those of the stacked device 60 illustrated in FIG. 23 are designated by the same references, and a detailed description thereof will be omitted.

The examples of the manufacturing method for the stacked device 60 illustrated in FIG. 25 and FIG. 26 relate to the chip-on-chip.

In manufacturing the stacked device 60 illustrated in FIG. 23, first, the semiconductor element 62, the semiconductor element 64, and the anisotropic conductive member 20 illustrated in FIG. 25 are prepared. The semiconductor element 62 is an element in which, for example, a plurality of electrodes 72 for exchanging signals with the outside or giving and receiving a voltage or a current is provided in a semiconductor element unit 70. Each of the electrodes 72 is electrically insulated by an insulation layer 74. A surface 72a of the electrode 72 protrudes from, for example, a surface 74a of the insulation layer 74.

The semiconductor element 64 has the same configuration as the semiconductor element 62. The semiconductor element 64 is an element in which, for example, a plurality of electrodes 73 for exchanging signals with the outside or giving and receiving a voltage or a current is provided in an interposer substrate 71. Each of the electrodes 73 is electrically insulated by an insulation layer 75. A surface 73a of the electrode 73 protrudes from, for example, a surface 75a of the insulation layer 75. The interposer substrate 71 has, for example, a lead-out wiring layer, and the stacked device 60 is electrically connected to the outside by the electrode 73.

The anisotropic conductive member 20 has a configuration illustrated in FIG. 21 described above and includes a plurality of conduction paths 16 (see FIG. 21 and FIG. 22). As an example, the configuration of the anisotropic conductive member 20, in which the resin layer 44 (see FIG. 21) or the like having an adhesion function is include is illustrated; however, a configuration in which the resin layer 44 (see FIG. 21) is not included may be adopted.

As illustrated in FIG. 25, the semiconductor element 62 and the semiconductor element 64 are arranged so that the electrode 72 and the electrode 73 face each other with the anisotropic conductive member 20 being interposed therebetween.

In this case, the semiconductor elements 62 and 64 and the anisotropic conductive member 20 are registered using alignment marks (not illustrated in the drawing) respectively provided therein.

The alignment using alignment marks is not particularly limited as long as an image or a reflection image of the alignment marks can be acquired and the position information of the alignment marks can be obtained, and a known registration method can be appropriately used.

Next, the semiconductor element 62, the anisotropic conductive member 20, and the semiconductor element 64 are brought close to each other, the semiconductor element 62, the anisotropic conductive member 20, and the semiconductor element 64 are stacked, and then the semiconductor element 62, the anisotropic conductive member 20, the semiconductor element 64 are joined with each other in a state where the semiconductor element 62, the anisotropic conductive member 20, and the semiconductor element 64 are registered. As a result, as illustrated in FIG. 26, the semiconductor element 62, the anisotropic conductive member 20, and the semiconductor element 64 are joined, whereby the stacked device 60 can be obtained.

The step of joining the above-described semiconductor element 62, anisotropic conductive member 20, and semiconductor element 64 is a joining step. In the joining step, the joining may be carried out, for example, in a temporarily joined state under predetermined conditions; however, the temporary joining may be omitted. The step of carrying out temporary joining is referred to as a temporary joining step, and the joining other than the temporary joining of the joining step is also referred to as main joining.

In the stacked device 60 manufactured in the above-described joining step, the protruding portion 16a of the conduction path 16 of the anisotropic conductive member 20 is in contact with the surface 72a of the electrode 72 as illustrated in FIG. 27, thus the contact state is good, and a sufficient conduction area is secured. Although not illustrated in FIG. 27, the protruding portion 16b of the conduction path 16 of the anisotropic conductive member 20 is in contact with the surface 73a of the electrode 73, thus the contact state is good, and a sufficient conduction area is secured.

In the above-described joining step, the conductive part such as the electrode 72 is brought into contact with the protruding portion 16a of the anisotropic conductive member 20, and the conductive part such as the electrode 73 is brought into contact with the protruding portion 16b of the anisotropic conductive member 20, thereby being joined.

Hereinafter, a manufacturing method for a stacked device will be described in more detail.

[Temporary Joining Step]

Temporary joining in the temporary joining step means carrying out fixing on a target to be joined in a state of being registered to the target to be joined. In the temporary joining, a registered state is maintained; however, the temporary joining is not in a permanently fixed state. In a case of being temporarily fixed, the anisotropic conductive member and the semiconductor element which is a target to be joined are in a state of being fixed in a state where the anisotropic conductive member is registered to the semiconductor element.

The temporary joining step is carried out by bringing at least two members close to each other. In this case, the pressurizing condition is not particularly limited; however, the pressure is preferably 10 MPa or less, more preferably 5 MPa or less, and particularly preferably 1 MPa or less.

Similarly, the temperature condition in the temporary joining step is not particularly limited; however, the temperature is preferably 0° C. to 300° C., more preferably 10° C. to 200° C., and particularly preferably normal temperature (23° C.) to 100° C.

Devices from companies such as TORAY ENGINEERING Co., Ltd., SHIBUYA CORPORATION, SHINKAWA Ltd., and Yamaha Motor Co., Ltd. can be used for the temporary joining step.

[Joining Step]

As described above, the joining in the joining step is also referred to as main joining. Examples of the control factor in the main joining include the atmosphere, the heating temperature, the pressing force (the load), and the treatment time at the time of the main joining; however, it is possible to select conditions suitable for the device to be used, such as the semiconductor element.

The temperature condition in the main joining is not particularly limited; however, the temperature is preferably a temperature higher than the temperature of the temporary joining Specifically, the temperature is more preferably 150° C. to 350° C. and particularly preferably 200° C. to 300° C.

The pressurizing condition in the main joining is not particularly limited; however, the pressure is preferably 30 MPa or less and more preferably 0.1 MPa to 20 MPa. The maximum load under the pressurizing condition is preferably 1 MN or less. The maximum load is more preferably 0.1 MN or less.

The time of the main joining is not particularly limited; however, it is preferably 1 second to 60 minutes and more preferably 5 seconds to 10 minutes.

As the device that is used for the above-described main joining, wafer joining devices from companies such as Mitsubishi Heavy Industries Machine Tool Co., Ltd., Bondtech Co., Ltd., PMT Corporation, Ayumi Industry Co., Ltd., Tokyo Electron Limited (TEL), EVG, SUSS MicroTec SE (SUSS), and MUSASHINO ENGINEERING Co., Ltd. can be used.

The atmosphere at the time of the main joining can be selected from an inert atmosphere such as a nitrogen atmosphere and a reduced-pressure atmosphere including a vacuum atmosphere, including the ambient air.

The heating temperature is not particularly limited to those described above, and various temperatures can be selected from 100° C. to 400° C., and the temperature rise rate can be also selected from 10° C./min to 10° C./sec depending on the performance of the heating stage and the heating type. The same applies to cooling. It is also possible to carry out heating step-shapedly, and it is also possible to divide heating into several stages and sequentially raise the heating temperature to carry out joining.

The pressure (the load) is also not particularly limited to those described above, and it is possible to select, for example, to pressurize rapidly or to pressurize step-shapedly, depending on the physical characteristics of the target to be joined such as the strength.

The atmosphere at the time of main joining, the holding time and the changing time for each of the heating and the pressurization can be appropriately set. In addition, the order thereof can be appropriately changed. For example, it is possible to make of a procedure in which the following is carried out: a first stage pressurization is carried out after a vacuum state is obtained, and then the temperature is raised by heating; thereafter, heating is carried out to raise the temperature, and then a second stage pressurization is carried out, where the second stage pressurization is held for a constant period time; and unloading is carried and at the same time cooling is carried, and the state of the ambient air is returned at the stage when the temperature is equal to or lower than a constant temperature.

Such a procedure can be rearranged in various ways. For example, heating may be carried out in a vacuum state after pressurizing in the ambient air, or vacuumization, pressurization, and heating may be carried at one time. Examples of combinations of these are illustrated in FIG. 28 to FIG. 34.

Further, in a case where a system in which the in-plane pressure distribution and heat distribution at the time of joining is individually controlled is used, the joining yield can be improved.

The temporary joining can be changed in the same manner. For example, in a case where the temporary joining is carried out in an inert atmosphere, the oxidation of the electrode surface of the semiconductor element can be suppressed. Further, it is also possible to carry out joining while applying ultrasonic waves.

FIG. 28 to FIG. 34 are graphs respectively showing a first example to a seventh example of the main joining conditions of the stacked device having the anisotropic conductive member according to the embodiment of the present invention. FIG. 28 to FIG. 34 illustrate the atmosphere, the heating temperature, the pressing force (the load), and the treatment time at the time of joining, where the reference V indicates a degree of vacuum, the reference L indicates a load, and the reference T indicates a temperature. In FIG. 28 to FIG. 34, a high degree of vacuum means low pressure.

Figure 28:
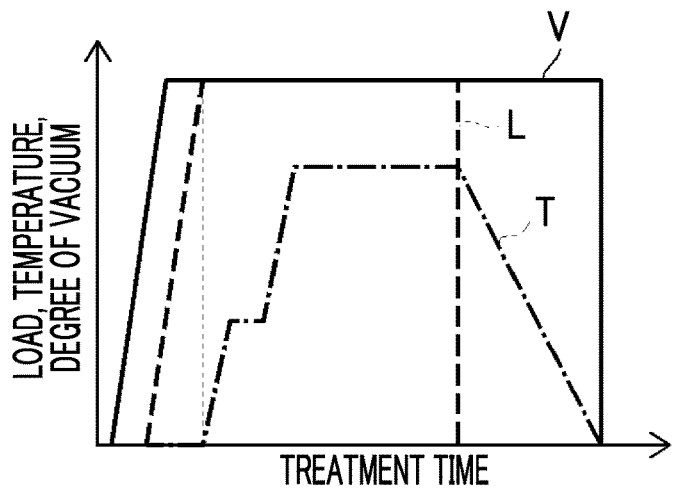
FIG. 28 is a graph showing a first example of the main joining conditions of the stacked device having the anisotropic conductive member according to the embodiment of the present invention.
Figure 29:
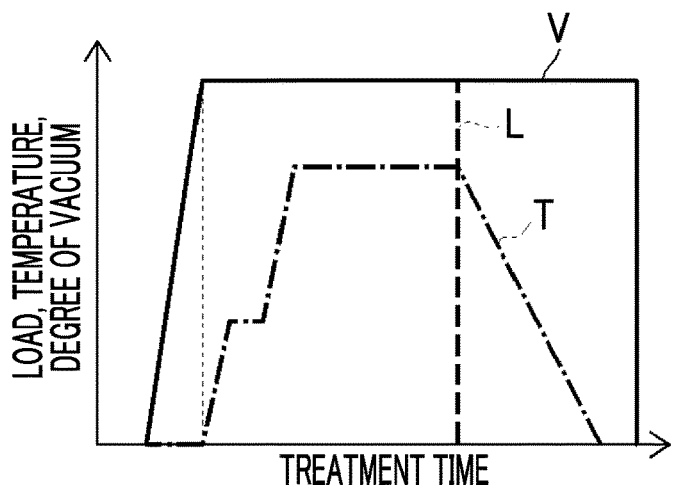
FIG. 29 is a graph showing a second example of the main joining conditions of the stacked device having the anisotropic conductive member according to the embodiment of the present invention.
Figure 30:
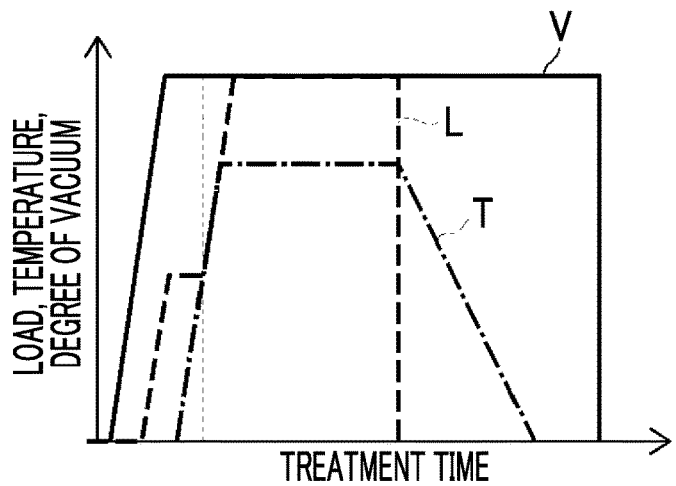
FIG. 30 is a graph showing a third example of the main joining conditions of the stacked device having the anisotropic conductive member according to the embodiment of the present invention.
Figure 31:
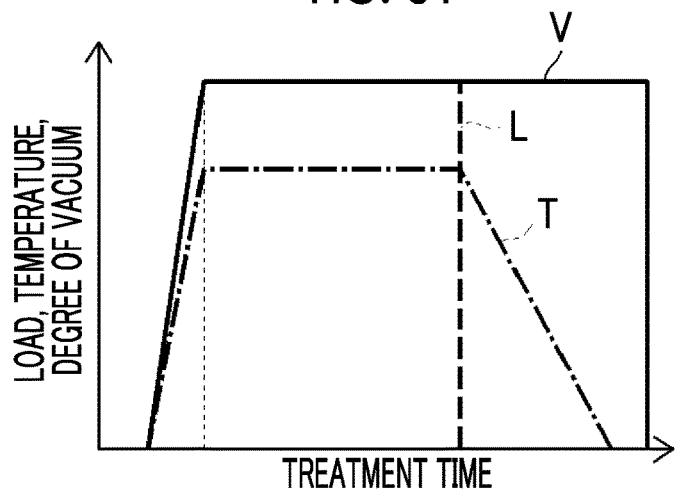
FIG. 31 is a graph showing a fourth example of the main joining conditions of the stacked device having the anisotropic conductive member according to the embodiment of the present invention.
Figure 32:
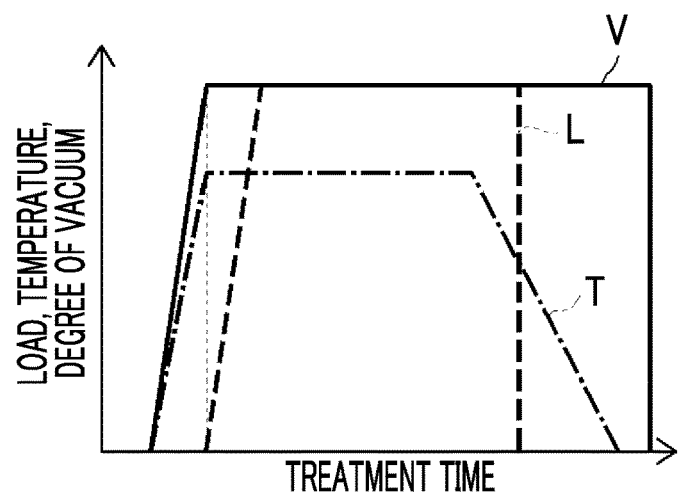
FIG. 32 is a graph showing a fifth example of the main joining conditions of the stacked device having the anisotropic conductive member according to the embodiment of the present invention.
Figure 33:
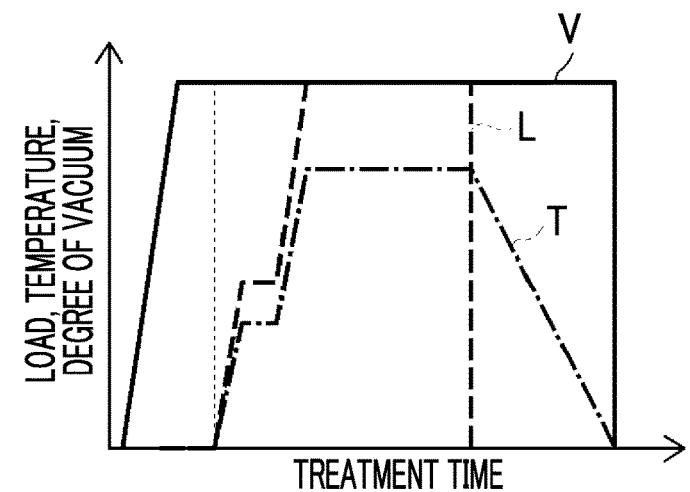
FIG. 33 is a graph showing a sixth example of the main joining conditions of the stacked device having the anisotropic conductive member according to the embodiment of the present invention.
Figure 34:
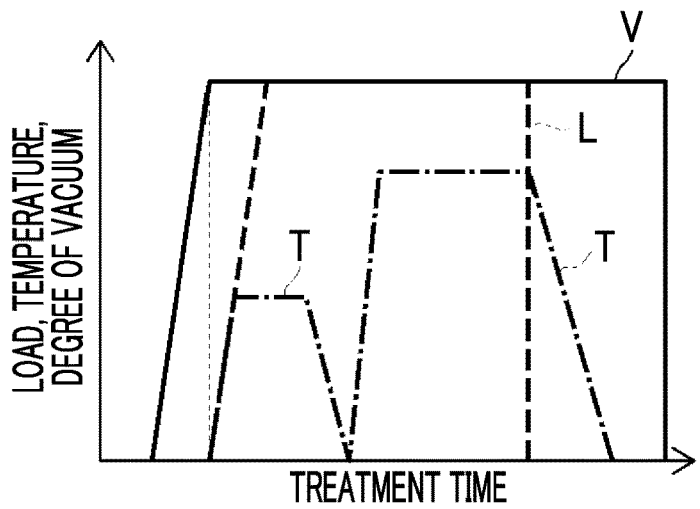
FIG. 34 is a graph showing a seventh example of the main joining conditions of the stacked device having the anisotropic conductive member according to the embodiment of the present invention.

Regarding the atmosphere, the heating temperature, and the load at the time of joining, for example, as illustrated in FIG. 28 to FIG. 30, the temperature may be increased after the load is applied in a state where the pressure is reduced. Further, as illustrated in FIG. 31, FIG. 33, and FIG. 34, the timing of applying the load and the timing of raising the temperature may be synchronized. As illustrated in FIG. 32, the load may be applied after the temperature is raised. Further, as illustrated in FIG. 31 and FIG. 32, the timing of reducing the pressure and the timing of raising the temperature may be synchronized.

The temperature may also be raised step-shapedly as illustrated in FIG. 28, FIG. 29, and FIG. 33, or may be heated in two steps as illustrated in FIG. 34. The load may also be applied step-shapedly as illustrated in FIG. 30 and FIG. 33.

Further, regarding the timing of pressure reduction, the load may be applied after pressure reduction as illustrated in FIG. 28, FIG. 30, FIG. 32, FIG. 33, and FIG. 34, or the timing of pressure reduction and the timing of applying the load may be synchronized as illustrated in FIG. 29 and FIG. 31. In this case, pressure reduction and joining are carried out together at the same time.

[Other Joining Steps]

The joining method is not limited to those described above. For example, the semiconductor element 62, the anisotropic conductive member 20, and the semiconductor element 64 are stacked through an electrode material containing at least tin as a heat-melted material. In this case, the electrode material is arranged on the protruding portion 16b illustrated in FIG. 25, and the electrode material is arranged on the surface 73a of the electrode 73.

Next, the heat-melted material containing tin is heat-treated and melted at a pressure of $1 \times 10^4$ Pa or more and in an atmosphere containing a carboxylic acid vapor such as a formic acid vapor to a temperature equal to or higher than the melting point of the heat-melted material. As a result, the electrode material is formed into an electrode on the protruding portion 16b and the surface 73a of the electrode 73. Next, the semiconductor element 62, the anisotropic conductive member 20, and the semiconductor element 64 are brought close to each other, the heat-melted material is solidified, and then the carboxylic acid vapor is exhausted so that the pressure is reduced from a pressure state of $1 \times 10^4$ Pa or more to a pressure state of $1 \times 10^2$ Pa or less. When the temperature of the electrode material is 100° C. or higher and lower than the melting point, the carboxylic acid vapor is exhausted. After pressure reduction, the atmosphere is replaced with an inert gas atmosphere containing no carboxylic acid. As a result, as illustrated in FIG. 26, the semiconductor element 62, the anisotropic conductive member 20, and the semiconductor element 64 are joined, whereby the stacked device 60 can be obtained. It is noted that the carboxylic acid acts as a reducing agent, whereby joining at a lower temperature is possible. The tin-containing electrode material is, for example, a tin-containing solder material.

Further, for example, the semiconductor element 62, the anisotropic conductive member 20, and the semiconductor element 64 are stacked through a composition layer. In this case, the composition layer is arranged on the protruding portion 16b illustrated in FIG. 25, and the composition layer is arranged on the surface 73a of the electrode 73. Then, heating is carried out at a temperature of 120° C. to 250° C. in a gas atmosphere of any one of an inert gas, a reducing gas, or a mixed gas thereof, and a load is applied. As a result, as illustrated in FIG. 26, the semiconductor element 62, the anisotropic conductive member 20, and the semiconductor element 64 are joined, whereby the stacked device 60 can be obtained.

The gas atmosphere is a gas atmosphere containing a hydrogen gas or a formic acid gas.

The conduct-forming composition contains copper-containing particles, an organic acid, and a dispersion medium. The copper-containing particles have core particles containing copper and an organic substance covering at least a part of the surface of the core particles. The organic substance contains an alkyl amine having a hydrocarbon group having 7 or fewer carbon atoms.

The copper-containing particles are, for example, copper-containing particles of JP2016-037627A. The copper-containing particles contain at least copper; however, they may include a metal such as gold, silver, platinum, tin, or nickel, or a compound, a reducing compound, an organic substance, or the like containing this metal element, as a substance other than copper.

The organic acid is, for example, an organic carboxylic acid that is used as a flux component for soldering. The dispersion medium is an organic solvent generally used in the production of conductive ink, a conductive paste, or the like.

Regarding the method of using the joining atmosphere, a known method may be used, and for example, not only the vacuum atmosphere but also a gas atmosphere of any one of an inert gas such as nitrogen or argon, a reducing gas such as hydrogen or carboxylic acid, or a mixed gas of this inert gas and the reducing gas may be introduced. In particular, it is preferable to use a gas containing a reducing gas. Regarding the technology of using these gases, it is possible to apply the technology related to melting joining of solder or the joining technology of using fine metal particles, and it is possible to introduce a reducing atmospheric gas containing a carboxylic acid such as formic acid or a reducing atmospheric gas containing hydrogen into a chamber to carry out heat-pressurization joining. It is desirable that the concentration of carboxylic acid in the atmospheric gas is below the explosion limit and 0.002% or more. Even in the case of a gas containing hydrogen, it is desirable that the concentration is equal to or lower than the explosion limit and 1% or higher. By joining in a reducing atmosphere, it is easy to desorb organic substances on the surface of the copper pillar that protrudes from the surface of the anisotropic conductive member manufactured in the present invention and to remove the oxide film, and the joining of this copper pillar to the copper electrode which is the target to be joined is promoted.

Specifically, after the target to be joined is introduced into the chamber, the inside of the chamber is once exhausted and vacuumized, and the above-described reducing atmospheric gas is introduced into the chamber to maintain a constant pressure. At this time, the gas introduced into the chamber is a mixed gas of a carboxylic acid vapor and a carrier gas (nitrogen or the like), and the pressure inside the chamber becomes $1 \times 10^4$ Pa or more due to the introduction of the gas. The heated targets to be joined are joined to each other in a state where the pressure inside the chamber becomes constant. The target to be joined may be heated at the time of vacuumization and exhausting or may be heated after introducing a reducing gas. The pressure inside the chamber in the heating step is not particularly limited, and, the conductor formation at a low temperature tends to be further promoted by setting to the pressure reduction condition, and the chamber may be in a state of "flow" in which gas is introduced and exhausted in parallel. By setting to the state of "flow", exhausting the desorbed gas and the like proceeds at the same time, and thus contamination of the chamber is reduced.

Hereinafter, a semiconductor package using the anisotropic conductive member 20 (see FIG. 20 and FIG. 21) will be described.

(Semiconductor Package)

[Manufacturing Method 1 for Semiconductor Package]

Figure 35:
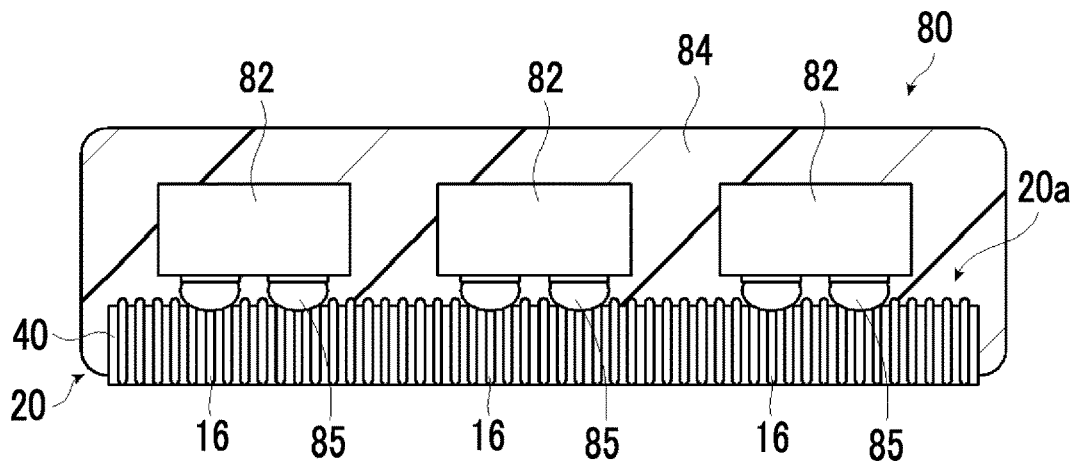
FIG. 35 is a schematic cross-sectional view illustrating a first example of a semiconductor package.

For example, it is possible to manufacture a semiconductor package 80 illustrated in FIG. 35 by a manufacturing method including the following steps in order, a semiconductor element mounting step of installing a semiconductor element on a surface of an insulating base material and joining the above-described metal M2, an electrode of the semiconductor element, after the above-described [Metal filling step], a molding step of molding with a resin, and the above-described [Substrate removing step].

FIG. 35 is a schematic cross-sectional view illustrating a first example of the semiconductor package. In FIG. 35 to FIG. 44 described below, the same configuration components as those of the anisotropic conductive member 20 illustrated in FIG. 20 to FIG. 22 described above are designated by the same references, and detailed description thereof will be omitted.

In the semiconductor package 80 illustrated in FIG. 35, a semiconductor element 82 is placed on a front surface 20a of the anisotropic conductive member 20 and is electrically connected by the anisotropic conductive member 20 and a solder ball 85. The front surface 20a of the anisotropic conductive member 20 is covered by a mold resin 84, including the semiconductor element 82.

[Semiconductor Element Mounting Step]

In a case of mounting a semiconductor element on the anisotropic conductive member according to the embodiment of the present invention, mounting by heating is accompanied. However, in mounting by thermocompression bonding, including solder reflow, and mounting by flip-chip, the maximum reachable temperature is preferably 220° C. to 350° C., more preferably 240° C. to 320° C., and particularly preferably 260° C. to 300° C., from the viewpoint of uniform and reliable mounting.

From the same viewpoint, the time for maintaining this maximum reachable temperature is preferably 2 seconds to 10 minutes, more preferably 5 seconds to 5 minutes, and particularly preferably 10 seconds to 3 minutes.

Further, from the viewpoint of suppressing cracks generated in the anodized film due to the difference in thermal expansion coefficient between the aluminum substrate and the anodized film, it is also possible to adopt a method in which a heat treatment is carried out, at a desired constant temperature, preferably for 5 seconds to 10 minutes, more preferably 10 seconds to 5 minutes, and particularly preferably 20 seconds to 3 minutes, before reaching the above-described maximum reachable temperature. The desired constant temperature is preferably 80° C. to 200° C., more preferably 100° C. to 180° C., and particularly preferably 120° C. to 160° C.

Further, the temperature at the time of mounting by wire bonding is preferably 80° C. to 300° C., more preferably 90° C. to 250° C., and particularly preferably 100° C. to 200° C., from the viewpoint of reliable mounting. The heating time is preferably 2 seconds to 10 minutes, more preferably 5 seconds to 5 minutes, and particularly preferably 10 seconds to 3 minutes.

[Manufacturing Method 2 for Semiconductor Package]

Figure 36:
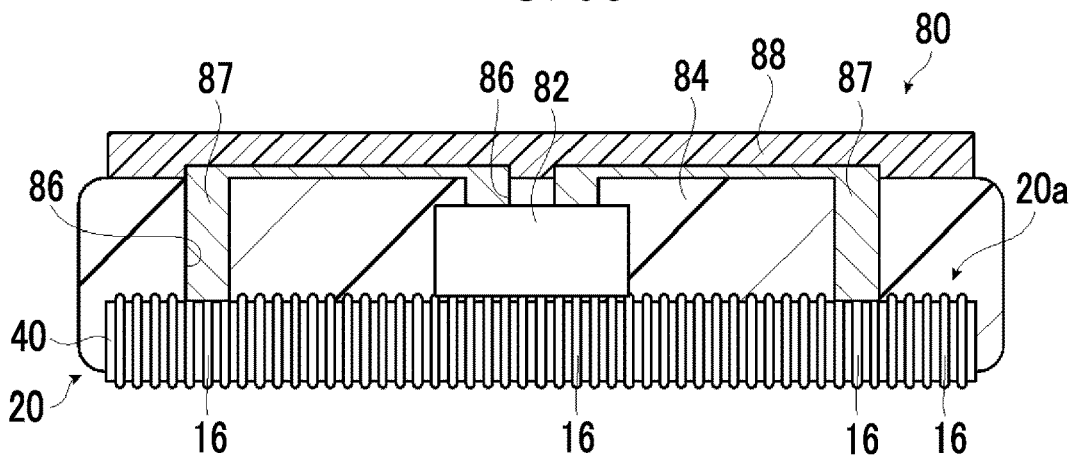
FIG. 36 is a schematic cross-sectional view illustrating a second example of the semiconductor package.

The semiconductor package 80 illustrated in FIG. 36 can be manufactured by a manufacturing method having the following steps in order, an element installing step of installing a semiconductor element on the surface of the above-described insulating base material with a resin paste which is filled with solder, a silver paste, or a filler, after the above-described [Metal filling step], a molding step of molding with a resin, a drilling step of making a hole in the mold resin to expose an element electrode and the metal M2 described above, a wire forming step of electrically conducting the above-described metal M2 and an electrode of the semiconductor element, an insulation layer forming step of forming an insulation layer that covers the above-described wire, and the above-described [Substrate removing step].

FIG. 36 is a schematic cross-sectional view illustrating a second example of the semiconductor package.

In the semiconductor package 80 illustrated in FIG. 36, a semiconductor element 82 is placed on the front surface 20a of the anisotropic conductive member 20 and is electrically connected. The front surface 20a of the anisotropic conductive member 20 is covered by a mold resin 84, including the semiconductor element 82. In the mold resin 84, a hole 86 for forming a wire for electrically conducting the electrode of the semiconductor element 82 and the conduction path 16 of the anisotropic conductive member 20 is formed. A wire 87 that passes through the hole 86 is provided. The wire 87 electrically conducts the electrode of the semiconductor element 82 and the metal M2 of the anisotropic conductive member 20. Further, an insulation layer 88 covering the wire 87 is provided on the upper surface of the mold resin 84.

<Wire Forming Step>

The wire forming step described above is a step of forming a wire on at least one surface of the anisotropic conductive member described above.

Here, examples of the method of forming the above-described wire include methods of carrying out various plating treatments such as an electrolytic plating treatment, an electroless plating treatment, and a replacement plating treatment; a sputtering treatment; and vapor deposition treatment. Among these, from the viewpoint of high heat resistance, the formation of a layer of only metal is preferable, and from the viewpoint of film thickness, uniform formation, and high adhesiveness, layer formation by a plating treatment is particularly preferable. Since the above-described plating treatment is a plating treatment for a non-conductive substance (a composite material), it is preferable to use a method in which a reduced metal layer called a seed layer is provided and then a thick metal layer is formed using this metal layer.

The above-described seed layer is preferably formed by a sputtering treatment. Further, electroless plating may be used for forming the above-described seed layer, and as the plating solution, it is preferable to use a solution composed of, for example, a main component such as a metal salt or a reducing agent, and for example, auxiliary components such as a pH adjusting agent, a buffer, a complexing agent, an accelerating agent, a stabilizing agent, and an improving agent.

As the plating solutions, it is possible to appropriately use commercially available products such as SE-650, 666, 680, SEK-670, 797, and SFK-63 (all manufactured by Japan Kanigen Co., Ltd.), and MELPLATE NI-4128, ENPLATE NI-433, and ENPLATE NI-411 (all manufactured by (all manufactured by Meltex Inc.).

In a case where copper is used as the material for the above-described wire, it is possible to use various electrolytic solutions which contain sulfuric acid, copper sulfate, hydrochloric acid, polyethylene glycol, and a surfactant as main components, to which various other additives are added.

The wire formed in this manner is patterned by a known method according to the mounting design for the semiconductor element or the like. Further, it is possible to provide a metal including solder in the place where the semiconductor element or the like is actually mounted and appropriately process it to be easily connected by thermocompression bonding, flip-chip bonding, wire bonding, or the like.

The suitable metal is preferably solder or a metal material such as gold (Au), silver (Ag), copper (Cu), aluminum (Al), magnesium (Mg), or nickel (Ni). From the viewpoint of mounting a semiconductor element or the like by heating, a method of providing Au or Ag through solder or Ni is preferable from the viewpoint of connection reliability.

Specific examples of the method of forming gold (Au) through nickel (Ni) on the patterned copper (Cu) wire include a method of carrying out Ni strike plating and then carrying out Au plating.

Here, Ni strike plating is carried out for the intended purpose of removing the surface oxide layer of the Cu wire and ensuring the adhesiveness of the Au layer.

Further, for Ni strike plating, a general Ni/hydrochloric acid mixed solution may be used, or a commercially available product such as NIPS-100 (manufactured by Showa Denko Materials Co., Ltd.) may be used.

On the other hand, Au plating is carried out for the intended purpose of improving wire bonding or solder wettability after Ni strike plating. In addition, Au plating is preferably generated by electroless plating, and it is possible to use a commercially available treatment liquid such as HGS-5400 (manufactured by Showa Denko Materials Co., Ltd.) or MICROFAB Au series, GALVANOMEISTER GB series, or PRECIOUSFAB IG series (all manufactured by Tanaka Kikinzoku Kogyo K.K).

In addition, as an aspect of connecting the anisotropic conductive member according to the embodiment of the present invention and a semiconductor element or the like by using the above-described wire, for example, flip-chip connection by a controlled collapse chip connection (C4) bump, a solder ball, and a Cu pillar, or the like, and connection using a conductive particle array type anisotropic conductive film (ACF) can be mentioned; however, the aspect of the present invention is not limited thereto.

[Coaxial Structure]

Figure 43:
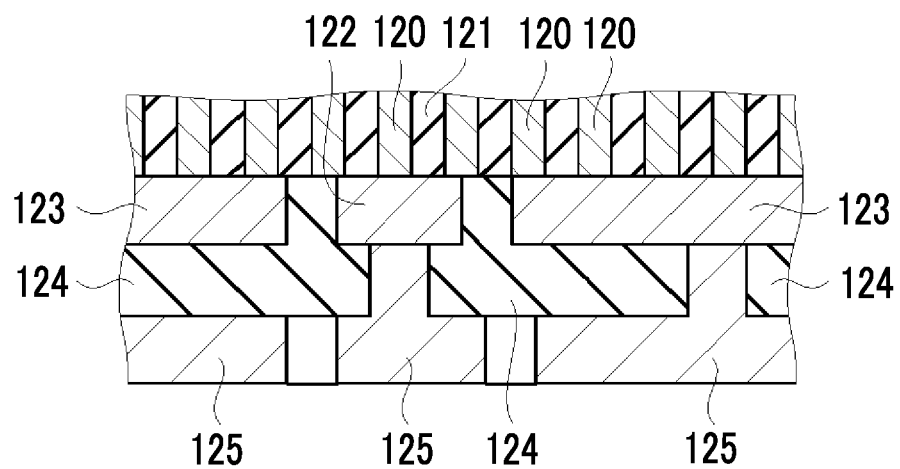
FIG. 43 is a schematic cross-sectional view for explaining a coaxial structure.
Figure 44:
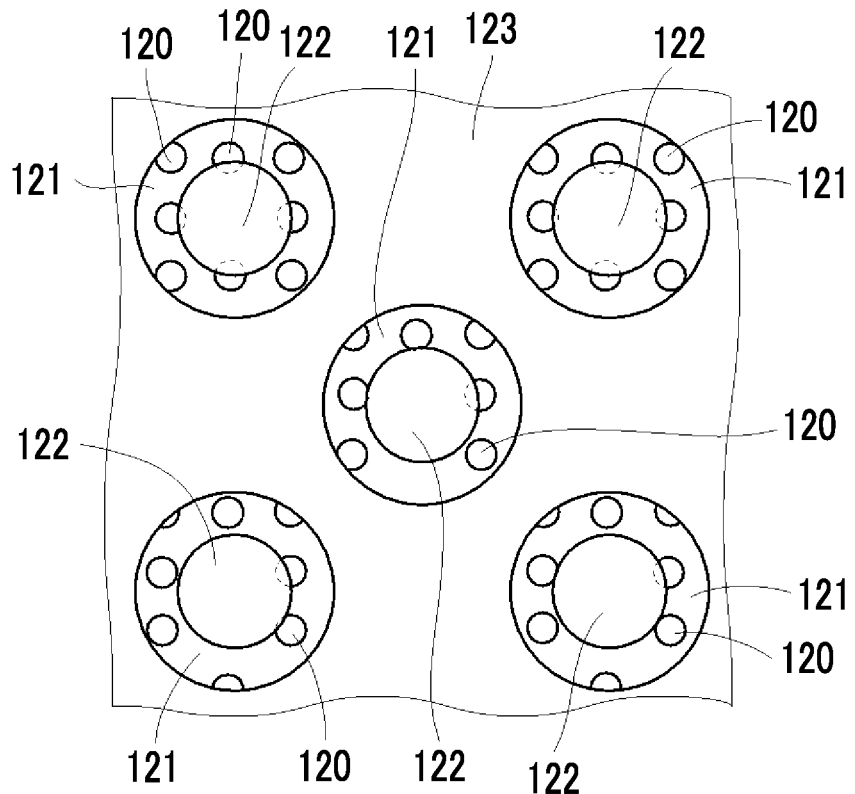
FIG. 44 is a schematic plan view for explaining the coaxial structure.

In addition, in the above-described wire, a plurality of linear conductors 120 that are connected to a ground wire 123 at predetermined spacings can also be arranged to be in the vicinity of the linear conductors 120 through which signal currents flow, as illustrated in FIG. 43 and FIG. 44. Since this structure is equivalent to that of a coaxial line, a shielding effect can be exhibited. Further, the plurality of linear conductors 120 connected to the ground wire 123 are arranged in the space between the plurality of linear conductors 120 arranged adjacent to each other and through which different signal currents flow. As a result, it is possible to reduce the electrical coupling (the capacitive coupling) generated in the space between the plurality of linear conductors 120 arranged adjacent to each other and to which different signal currents flow, and it is possible to suppress that the plurality of linear conductors 120 to which signal currents flow by themselves become a noise source. In FIG. 43, the plurality of linear conductors 120 through which signal currents flow are formed on the insulating base material 121 are electrically insulated from each other and are electrically connected to a signal wire 122. The signal wire 122 and the ground wire 123 are electrically connected respectively to wiring layers 125, which are electrically insulated by the insulation layer 124.

<Insulation Layer Forming Step>

The above-described insulation layer forming step is a step of forming the above-described insulation layer.

The method of forming the above-described insulation layer is not particularly limited; however, in a case where the resin described below is used as the above-described insulation layer, Examples thereof include a method of laminating on the above-described anisotropic conductive member using a laminator device, a method of applying onto the above-described anisotropic conductive member using a spin coater device, and a method of joining the above-described anisotropic conductive member to the above-described semiconductor element by using a flip-chip joining device and at the same time forming an insulation layer.

(Insulation Layer)

The material of the insulation layer is not particularly limited as long as it is a material having high insulating properties, and specific examples thereof include inorganic insulators such as air, glass, and alumina, and organic insulators such as a resin. These may be used alone, or two or more thereof may be used in combination. Among these, it is preferable to use a resin due to the reason that the resin is not expensive and has high thermal conductivity.

The material of the above-described resin is preferably a thermosetting resin. The above-described thermosetting resin is preferably at least one resin selected from the group consisting of an epoxy resin, a modified epoxy resin, a silicone resin, a modified silicone resin, an acrylate resin, a urethane resin, and a polyimide resin, and an epoxy resin, a modified epoxy resin, a silicone resin, or a modified silicone resin is more preferable.

Further, as the above-described resin, it is preferable to use a resin excellent in heat resistance, weather fastness, and light resistance.

Further, for imparting a predetermined function, the above-described resin can be mixed with at least one selected from the group consisting of a filler, a dispersing agent, a pigment, a fluorescent substance, a reflective substance, an ultraviolet absorbing agent, and antioxidant.

In addition, an adhesive composition can also be used as the above-described resin. Examples thereof include adhesives for semiconductors, which are commonly known as a underfill material (liquid type), a non conductive paste (NCP) (paste type), and a non conductive film (NCF) (film type), and dry film resist or the like can also be used.

Further, as the above-described insulation layer, the conductive particle array type anisotropic conductive film (ACF) described as the above-described wire may be used.

However, in the present invention, the aspect of the above-described insulation layer is not limited to those described above.

<Drilling Step>

For the drilling step, a physical method such as laser processing, drilling processing, or dry etching, or a chemical method by wet etching is considered; however, it is not limited to these methods.

[Manufacturing Method 3 for Semiconductor Package]

Figure 37:
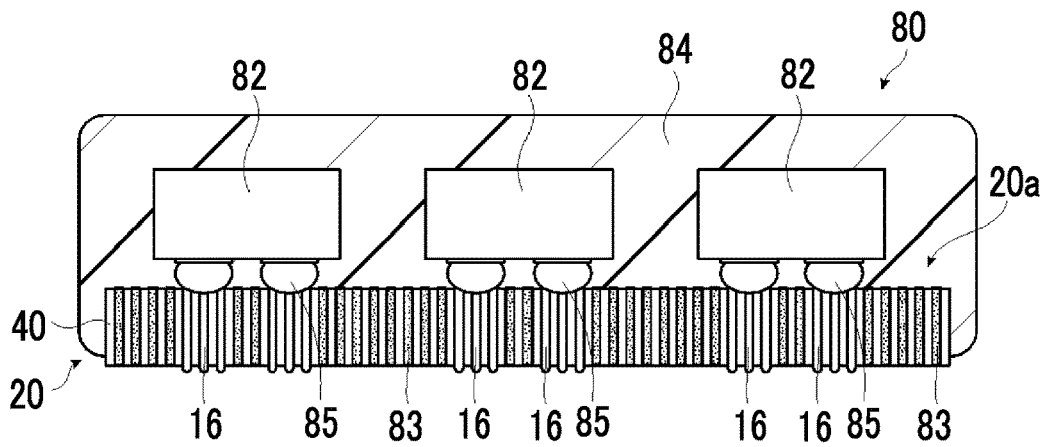
FIG. 37 is a schematic cross-sectional view illustrating a third example of the semiconductor package.

The semiconductor package 80 illustrated in FIG. 37 can be manufactured by a manufacturing method which includes the following steps in order, a mask layer forming step of forming a mask layer on the surface of the anisotropic conductive member between the above-described metal filling step and the above-described semiconductor element mounting step or during the semiconductor element installing step, where the above-described steps are described in the above-described manufacturing method 1 for a semiconductor package and the above-described manufacturing method 2 for a semiconductor package; a filling metal removing step of removing the above-described metal M2 and metal M1 with which the above-described anodized film is filled; and a mask layer removing step of removing the above-described mask layer.

FIG. 37 is a schematic cross-sectional view illustrating a third example of the semiconductor package.

The semiconductor package 80 illustrated in FIG. 37 has the same configuration as the semiconductor package 80 illustrated in FIG. 35, except that the configuration of the anisotropic conductive member 20 is different. The anisotropic conductive member 20 is filled with the resin 83 in the portion where the metal M2 and the metal M1 have been removed by the filling metal removing step. The anisotropic conductive member 20 and the semiconductor element 82 are electrically connected by a solder ball 85 provided in the conduction path 16 which has not been removed.

[Manufacturing Method 4 for Semiconductor Package]

Figure 38:
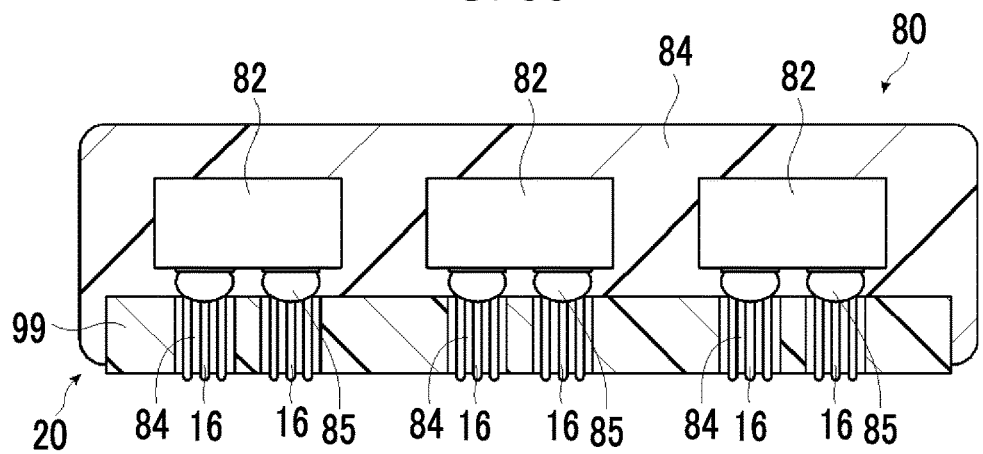
FIG. 38 is a schematic cross-sectional view illustrating a fourth example of the semiconductor package.

The semiconductor package 80 illustrated in FIG. 38 can be manufactured by a manufacturing method which includes the following steps in order, a mask layer forming step of forming a mask layer on the surface of the above-described anisotropic conductive member between the above-described metal filling step and the above-described semiconductor element mounting step or during the semiconductor element installing step, where the above-described steps are described in the above-described manufacturing method 1 for a semiconductor package and the above-described manufacturing method 2 for a semiconductor package; anisotropic conductive member removing step of removing a part of the above-described anisotropic conductive member; a resin filling step of filling the removed portion of the above-described anisotropic conductive member with a resin; and a mask layer removing step of removing the above-described mask layer.

FIG. 38 is a schematic cross-sectional view illustrating a fourth example of the semiconductor package.

The semiconductor package 80 illustrated in FIG. 38 has the same configuration as the semiconductor package 80 illustrated in FIG. 35, except that the configuration of the anisotropic conductive member 20 is different. In the anisotropic conductive member 20, the portion removed by the anisotropic conductive member removing step is filled with a resin 99 by the resin filling step. The anisotropic conductive member 20 and the semiconductor element 82 are electrically connected by a solder ball 85 provided in the conduction path 16 which has not been removed.

<Mask Layer Forming Step>

The above-described mask layer forming step is a step of forming a mask layer having a predetermined opening pattern (an opening part) on the surface of the insulating base material after the above-described [Metal filling step].

The above-described mask layer can be formed by, for example, a method in which an image recording layer is formed on the surface of the above-described insulating base material, and then energy is applied to the above-described image recording layer by exposure or heating to develop a predetermined opening pattern. Here, the material for forming the above-described image recording layer is not particularly limited, and a conventionally known material for forming a photosensitive layer (a photoresist layer) or a material for forming a heat-sensitive layer can be used. An additive such as an infrared absorbing agent or the like may also be contained as necessary.

<Mask Layer Removing Step>

The above-described mask layer removing step is a step of removing the above-described mask layer.

Here, the method of removing the above-described mask layer is not particularly limited, and examples thereof include a method in which the above-described mask layer is dissolved to be removed by using a liquid that dissolves the above-described mask layer but does not dissolve the above-described aluminum substrate and the above-described anodized film. Examples of such a liquid include known developers in a case where a photosensitive layer and a heat-sensitive layer are used for the above-described mask layer.

<Filling Metal Removing Step>

The above-described filling metal removing step is a step of removing the metal M2 and the metal M1, constituting the conduction path 16 in the anisotropic conductive member present in the lower part of the opening part of the above-described mask layer. Here, the method of removing the metal M2 and the metal M1 described above is not particularly limited, and examples thereof include a method in which the metal M2 and the metal M1 are dissolved by using a hydrogen peroxide solution, an acid aqueous solution, or a mixed solution thereof.

<Anisotropic Conductive Member Removing Step>

The above-described anisotropic conductive member removing step is a step of removing the anisotropic conductive member present in the lower part of the opening part of the above-described mask layer.

Here, the method of removing the above-described anisotropic conductive member is not particularly limited, and examples thereof include a method in which the anodized film of the anisotropic conductive member is dissolved by using an alkali etching aqueous solution or an acid aqueous solution.

<Water Washing Treatment>

It is preferable to wash with water after the completion of each of the above-described treatment steps. Pure water, well water, tap water, or the like can be used for washing with water. A nipping device may be used to prevent a treatment liquid from being incorporated into the next step.

[Manufacturing Method 5 for Semiconductor Package]

Figure 39:
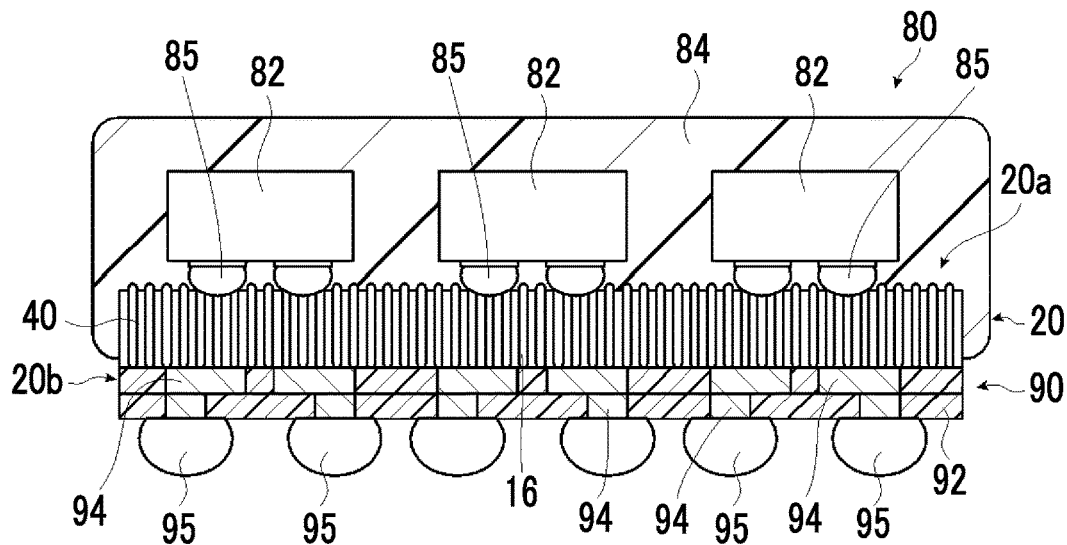
FIG. 39 is a schematic cross-sectional view illustrating a fifth example of the semiconductor package.

The semiconductor package 80 illustrated in FIG. 39 is manufactured by a manufacturing method including a wiring layer forming step of forming at least one or more wiring layers on the surface of the exposed anisotropic conductive member, after the above-described [Substrate removing step].

FIG. 39 is a schematic cross-sectional view illustrating a fifth example of the semiconductor package.

The semiconductor package 80 illustrated in FIG. 39 has the same configuration as that of the semiconductor package 80 illustrated in FIG. 35, except for the difference in that the wiring board 90 is provided on the back surface 20b of the anisotropic conductive member 20.

In the wiring board 90, a wiring layer 94 is provided on an insulating base material 92 having an electrical insulation property. One side of the wiring layer 94 is electrically connected to the conduction path 16 of the anisotropic conductive member 20, and the other side is electrically connected to the solder ball 95. As a result, a signal and the like from the semiconductor element 82 can be taken out to the outside of the semiconductor package 80. Further, a signal, a voltage, a current, or the like can be supplied to the semiconductor element 82 from the outside of the semiconductor package 80.

[Manufacturing Method 6 for Semiconductor Package]

Figure 40:
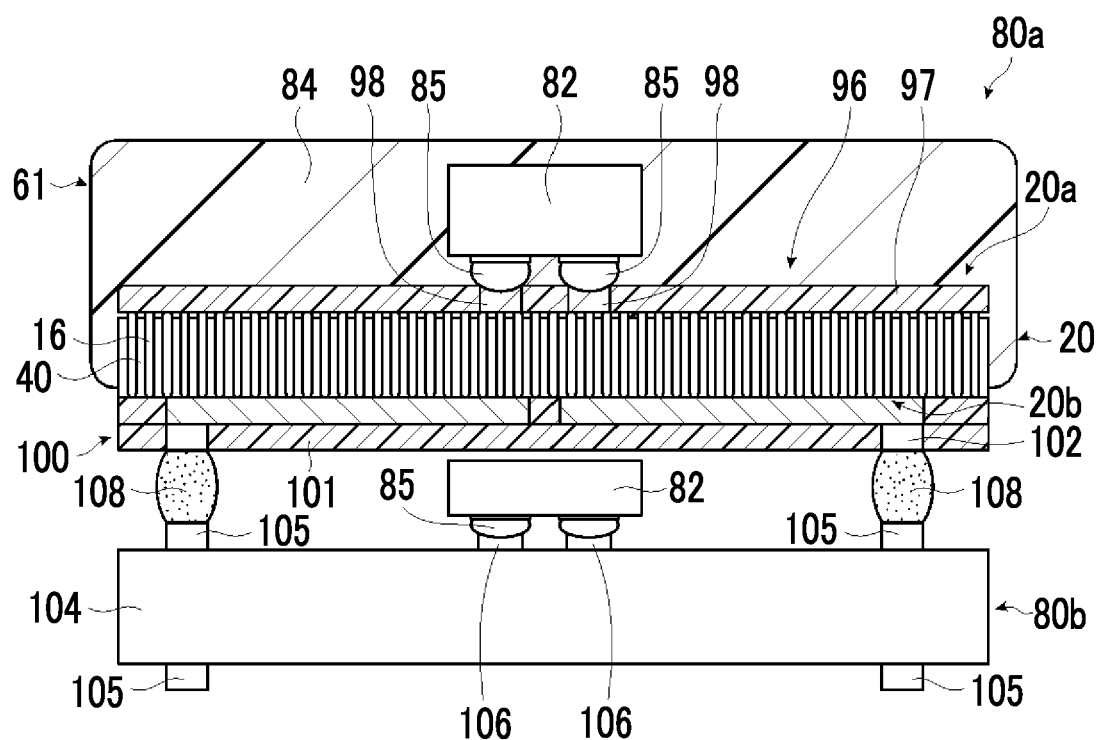
FIG. 40 is a schematic cross-sectional view illustrating a configuration in which the semiconductor package board is stacked.

A package on package (PoP) board 61 as illustrated in FIG. 40, in which semiconductor package boards are stacked, can be manufactured by a manufacturing method including a step of joining, at least one time or more, the above-described semiconductor package to the package substrate on which the semiconductor element is installed, after the wiring layer forming step of the above-described [Manufacturing method 5 for semiconductor package].

FIG. 40 is a schematic cross-sectional view illustrating a configuration in which the semiconductor package boards are stacked.

In a PoP board 61 illustrated in FIG. 40, the semiconductor package board 80a and the semiconductor package board 80b are stacked and electrically connected by a solder ball 108. In the semiconductor package board 80a, a wire 98 is provided on the front surface 20a of the anisotropic conductive member 20. For example, two wires 98 are provided on an insulation layer 97. Each wire 98 is electrically connected to one semiconductor element 82 by a solder ball 85. The wire 98 and the one semiconductor element 82 are covered by the mold resin 84.

Further, a wiring layer 100 is provided on the back surface 20b of the anisotropic conductive member 20. In the wiring layer 100, two wires 102 are provided on the insulating base material 101. Each wire 102 is electrically connected to the solder ball 108 through the conduction path 16 of the anisotropic conductive member 20.

In the semiconductor package board 80b, for example, electrodes 105 are provided on both sides of a substrate 104, and two electrodes 106 are provided in the central part. Each electrode 106 in the central part is electrically connected to the semiconductor element 82 through the solder ball 85. Each of the electrodes 105 on both sides of the substrate 104 is electrically connected to the wire 102 of the semiconductor package board 80a through the solder balls 108.

[Manufacturing Method 7 for Semiconductor Package]

Figure 41:
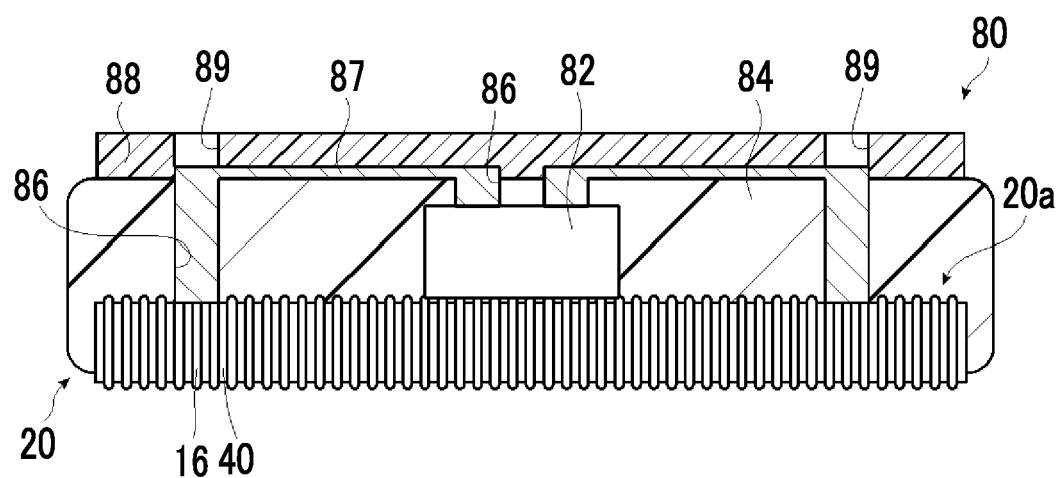
FIG. 41 is a schematic cross-sectional view illustrating a sixth example of the semiconductor package.

The semiconductor package 80 illustrated in FIG. 41 can be manufactured by a manufacturing method including a step of drilling a hole in the insulation layer to expose the above-described wire under the above-described insulation layer, after the insulation layer forming step described above in [Manufacturing method 2 for semiconductor package] described above. In this manner, a component-containing substrate can be manufactured.

FIG. 41 is a schematic cross-sectional view illustrating a sixth example of the semiconductor package.

The semiconductor package 80 illustrated in FIG. 41 has the same configuration as the semiconductor package 80 illustrated in FIG. 36, except that a hole 89 is provided, where a hole 89 for exposing the wire 87 to the insulation layer 88 is provided.

The present invention is not limited to the above-described embodiments, and examples of the mounting form include system on a chip (SoC), system in package (SiP), package on package (PoP), polysilicon insulater polysilicon (PiP), chip scale package (CSP), and through silicon via (TSV).

More specifically, for example, the anisotropic conductive member according to the embodiment of the present invention can also be used as a ground part and a heat conductive part in addition to being used for connecting a data signal of a semiconductor element alone and a power source.

Further, the anisotropic conductive member according to the embodiment of the present invention can also be used as a ground part and a heat conductive part in addition to being used for connecting a data signal between two or more semiconductor elements or a power source. Examples of such an aspect include an aspect in which the anisotropic conductive member according to the embodiment of the present invention is used as an interposer in the following examples.

Three-dimensional SoC logic device (for example, a homogeneous substrate ((a substrate obtained by stacking a plurality of field programmable gate arrays (FPGA) on an interposer) and a heterogeneous substrate (a substrate obtained by stacking a digital device, analog device, an RF device, MEMS, and a memory on an interposer))

Three-dimensional SiP (Wide I/O) obtained by combining a logic and a memory (for example, one obtained by stacking a CPU and a DRAM on or both on and under an interposer, one obtained by stacking a GPU and a DRAM on or both on and under an interposer, one obtained by stacking an ASIC/FPGA and a Wide I/O memory on or both on and under an interposer, and one obtained by stacking an APE and a Wide I/O memory on or both on and under an interposer)

2.5-dimensional heterogeneous substrate obtained by combining an SoC and a DRAM

Figure 42:
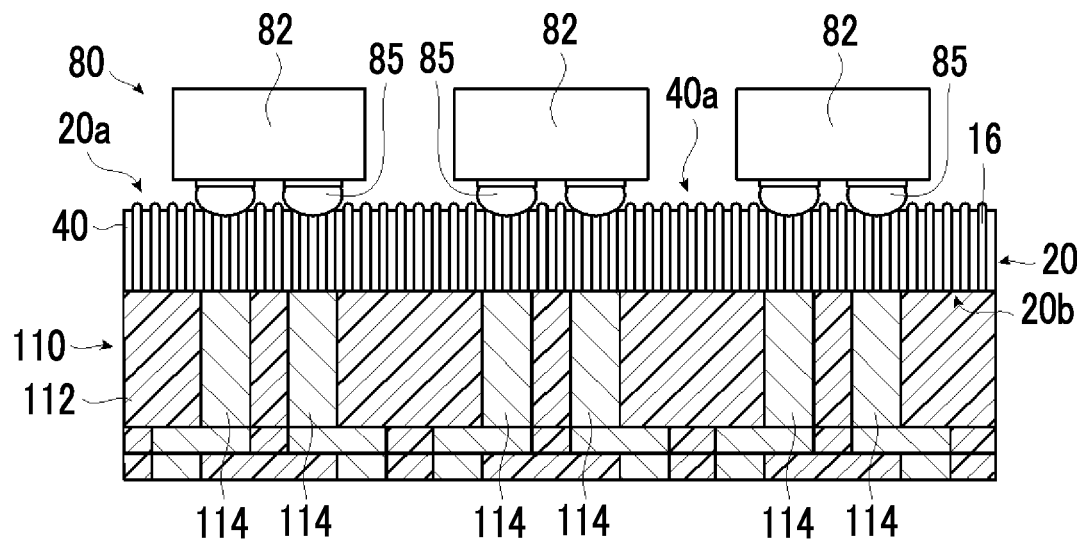
FIG. 42 is a schematic cross-sectional view illustrating a seventh example of the semiconductor package.

Further, the anisotropic conductive member according to the embodiment of the present invention can also be used for electrical connection between the semiconductor package 80 and a printed wiring board 110 as illustrated in FIG. 42. The printed wiring board 110 is provided on the back surface 20b of the anisotropic conductive member 20 of the semiconductor package 80. In the printed wiring board 110, for example, a wiring layer 114 is provided on an insulating base material 112 made of a resin. The wiring layer 114 is electrically connected to the conduction path 16 on the back surface 20b of the anisotropic conductive member 20.

Further, the anisotropic conductive member according to the embodiment of the present invention can also be used for connecting two or more semiconductor packages (PoP; Package on Package). Examples of the aspect, in this case, include an aspect in which the anisotropic conductive member according to the embodiment of the present invention is connected to the two semiconductor packages that are arranged on the upper and lower surface sides of the anisotropic conductive member through a predetermined wire.

Further, the anisotropic conductive member according to the embodiment of the present invention can also be used for a multi-chip package obtained by carrying out packaging by an aspect of stacking two or more semiconductor elements on a substrate or an aspect of horizontally placing two or more semiconductor elements on a substrate. Examples of the aspect, in this case, include an aspect in which two semiconductor elements are stacked on the anisotropic conductive member according to the embodiment of the present invention and connected through a predetermined wire.

(Electronic Device)

Hereinafter, an electronic device using anisotropic conductive member will be described. An electronic device is one kind of stacked device.

Figure 45:
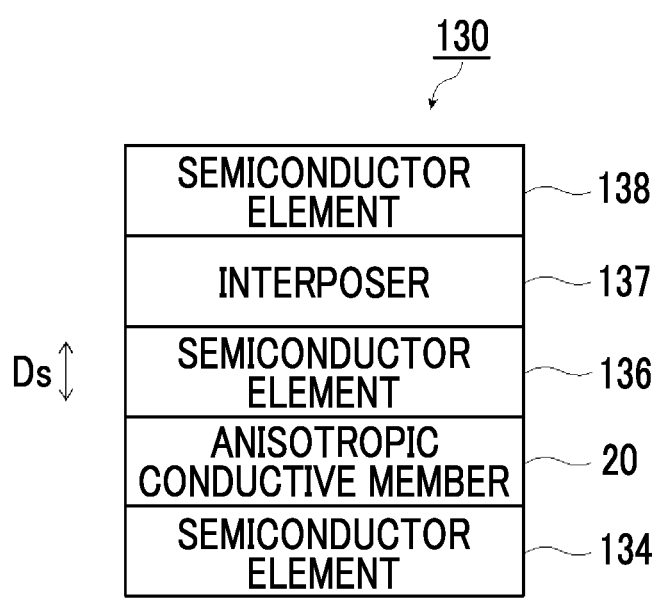
FIG. 45 is a schematic view illustrating a first example of an electronic device obtained using the anisotropic conductive member according to the embodiment of the present invention.
Figure 46:
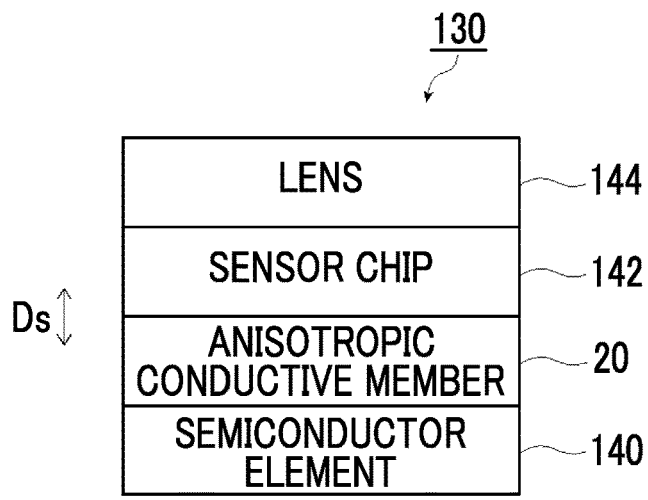
FIG. 46 is a schematic view illustrating a second example of the electronic device obtained using the anisotropic conductive member according to the embodiment of the present invention.

FIG. 45 is a schematic view illustrating a first example of an electronic device using the anisotropic conductive member according to the embodiment of the present invention, and FIG. 46 is a schematic view illustrating a second example of the electronic device using the anisotropic conductive member according to the embodiment of the present invention.

As in the case of an electronic device 130 illustrated in FIG. 45, a configuration in which a semiconductor element 134, a semiconductor element 136, and a semiconductor element 138 are stacked and joined in the stacking direction Ds by using an interposer 137 and the anisotropic conductive member 20, and are electrically connected may be adopted.

Further, as in the case of the electronic device 130 illustrated in FIG. 46, a configuration of having a function as an optical sensor may be adopted. In the electronic device 130 illustrated in FIG. 46, the semiconductor element 140 and the sensor chip 142 are stacked through the anisotropic conductive member 20 in the stacking direction Ds. Further, a lens 144 is provided in the sensor chip 142.

The semiconductor element 140 has a logic circuit formed therein, and the configuration thereof is not particularly limited as long as the logic circuit can process the signal obtained by the sensor chip 142.

The sensor chip 142 has an optical sensor that detects light. The optical sensor is not particularly limited as long as it can detect light, and for example, a charge coupled device (CCD) image sensor or a complementary metal oxide semiconductor (CMOS) image sensor is used.

The configuration of the lens 144 is not particularly limited as long as it can condense light on the sensor chip 142, and for example, a lens called a microlens is used.

The semiconductor element 134, the semiconductor element 136, and the semiconductor element 138, which are described above, have an element region (not illustrated in the drawing).

The element region is a region where element constituent circuits of various elements such as a capacitor, a resistor, and a coil for functioning as an electronic element are formed. The element region includes, for example, a region where a memory circuit of a flash memory or the like, and a logic circuit such as a microprocessor, a field-programmable gate array (FPGA), or the like are formed and a region where a communication module such as a wireless tag, and a wire are formed. In addition to these, a transmitting circuit or micro-electro-mechanical systems (MEMS) may be formed in the element region. MEMS is, for example, a sensor, an actuator, antenna, or the like. Sensors include, for example, various sensors for acceleration, sound, light, and the like.

As described above, element constituent circuits or the like is formed in the element region, and for example, a rewiring layer (not illustrated in the drawing) is provided in the semiconductor element.

In the stacked device, for example, a semiconductor element having a logic circuit and a semiconductor element having a memory circuit can be combined. Further, all the semiconductor elements may have a memory circuit, or all the semiconductor elements may have a logic circuit. Further, the combination of the semiconductor elements in the electronic device 130 may be a combination of a sensor, an actuator, antenna, and the like, a memory circuit, and a logic circuit, and is appropriately determined depending on the use application of the electronic device 130 and the like.

[Semiconductor Element]

Semiconductor elements are those that are used in the above-described semiconductor package and electronic device. The semiconductor element is not particularly limited, and in addition to the above, examples thereof include a logic large scale integration (logic LSI) (for example, an application specific integrated circuit (ASIC), a field programmable gate array (FPGA), or an application specific standard product (ASSP)), a microprocessor (for example, a central processing unit (CPU) or a graphics processing unit (GPU)), a memory (for example, a dynamic random access memory (DRAM), a hybrid memory cube (HMC), a magnetic RAM (MRAM), a phase-change memory (PCM), a resistive RAM (ReRAM), a ferroelectric RAM (FeRAM: a ferroelectric memory), or flash memory (not AND (NAND) flash)), a light emitting diode (LED) (for example, a micro flash of a mobile terminal, in-vehicle use, a projector light source, an LCD backlight, or general lighting use), a power device, analog integrated circuit (analog IC), (for example, a direct current (DC)-direct current (DC) converter or an insulated gate bipolar transistor (IGBT)), micro electro mechanical systems (MEMS), (for example, a accelerometer, a pressure sensor, an oscillator, or a gyro sensors), wireless (for example, a global positioning system (GPS), frequency modulation (FM), nearfield communication (NFC), an RF expansion module (RFEM), a monolithic microwave integrated circuit (MMIC), or wireless local area network (WLAN)), and a discrete element, back side Illumination (BSI), a contact image sensor (CIS), a camera module, a complementary metal oxide semiconductor (CMOS), a passive device, a surface acoustic wave (SAW) filter, a radio frequency (RF) filter, a radio frequency integrated passive device (RFIPD), or broadband (BB).

The semiconductor element is, for example, completed alone, and the semiconductor element alone exhibits a specific function such as a circuit or a sensor.

The electronic device is not limited to a one-to-multiple form in which a plurality of semiconductor elements are joined to one semiconductor element, but also a multiple-to-multiple form in which a plurality of semiconductor elements are joined to a plurality of semiconductor elements are joined may be adopted.

Figure 47:
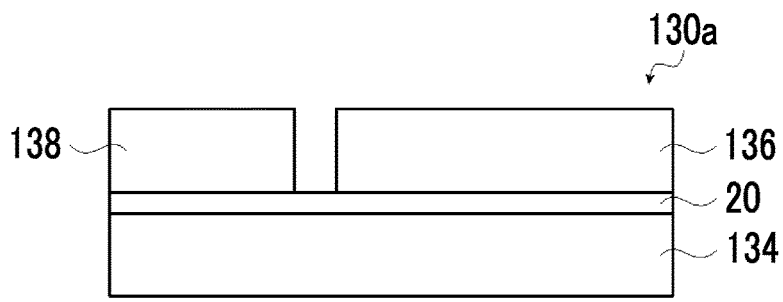
FIG. 47 is a schematic view illustrating a third example of the electronic device obtained using the anisotropic conductive member according to the embodiment of the present invention.
Figure 48:
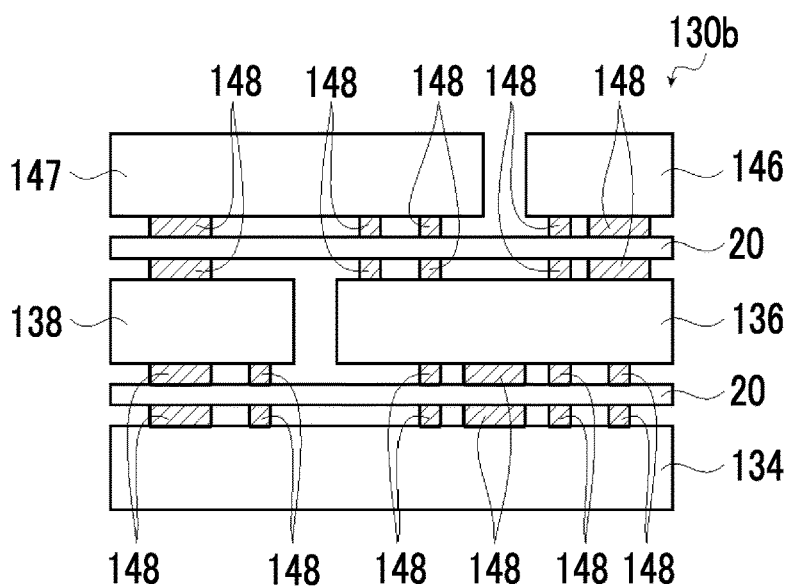
FIG. 48 is a schematic view illustrating a fourth example of the electronic device obtained using the anisotropic conductive member according to the embodiment of the present invention.
Figure 49:
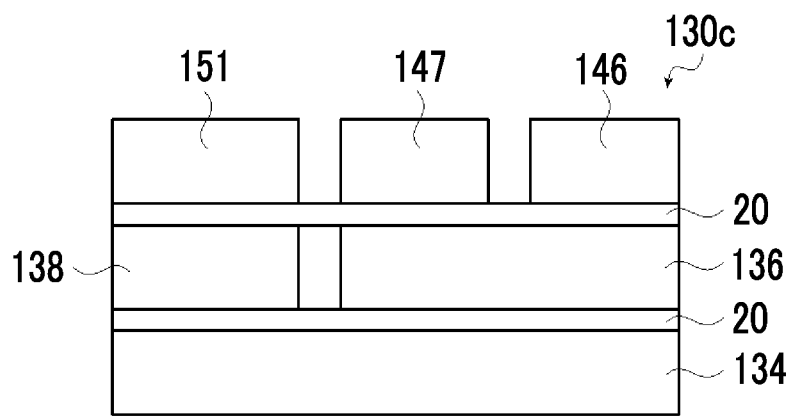
FIG. 49 is a schematic view illustrating a fifth example of the electronic device obtained using the anisotropic conductive member according to the embodiment of the present invention.
Figure 50:
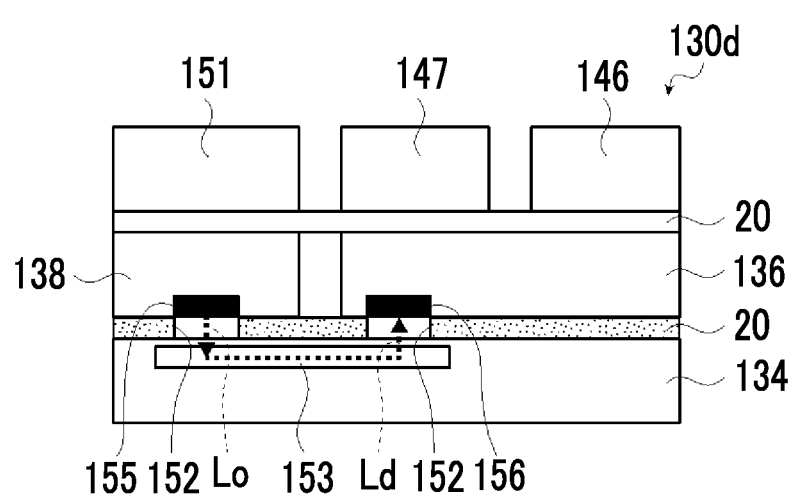
FIG. 50 is a schematic view illustrating a sixth example of the electronic device obtained using the anisotropic conductive member according to the embodiment of the present invention.

FIG. 47 is a schematic view illustrating a third example of the electronic device obtained using the anisotropic conductive member according to the embodiment of the present invention, FIG. 48 is a schematic view illustrating a fourth example of an electronic device using the anisotropic conductive member according to the embodiment of the present invention, and FIG. 49 is a schematic view illustrating a fifth example of the electronic device using the anisotropic conductive member according to the embodiment of the present invention, and FIG. 50 is a schematic view illustrating a sixth example of the electronic device obtained using the anisotropic conductive member according to the embodiment of the present invention.

Examples of the one-to-multiple form include an electronic device 130a having a form in which the semiconductor element 136 and the semiconductor element 138 are joined to one semiconductor element 134 by using the anisotropic conductive member 20, and electrically connected, as illustrated in FIG. 47. The semiconductor element 134 may have an interposer function.

Further, for example, it is possible to stack a plurality of devices such as a logic chip having a logic circuit and a memory chip on a device having an interposer function. Further, in this case, even in a case where the electrode size is different for each device, the joining can be carried out.

In the electronic device 130b illustrated in FIG. 48, the electrodes 148 do not the same size, and some of them have different sizes; however, the semiconductor element 136 and the semiconductor element 138 are joined and electrically connected to one semiconductor element 134 by using the anisotropic conductive member 20. Further, the semiconductor element 146 is joined and electrically connected to the semiconductor element 136 by using the anisotropic conductive member 20. The semiconductor element 147 is joined and electrically connected across the semiconductor element 136 and the semiconductor element 138 by using the anisotropic conductive member 20.

In addition, as in the case of an electronic device 130c illustrated in FIG. 49, the semiconductor element 136 and the semiconductor element 138 are joined and electrically connected to one semiconductor element 134 by using the anisotropic conductive member 20. Further, a configuration in which the semiconductor element 146 and the semiconductor element 147 are joined to the semiconductor element 136 by using the anisotropic conductive member 20, and a semiconductor element 151 is joined and electrically connected to the semiconductor element 138 by using the anisotropic conductive member 20 can also be adopted.

In the case of the above configuration, it is possible to support silicon photonics assuming high frequencies in a case where a light emitting element such as a vertical cavity surface emitting laser (VCSEL) and a light receiving element such as a complementary metal oxide semiconductor (CMOS) image sensor are stacked on the surface of the device including an optical waveguide.

For example, as in the case of an electronic device 130d illustrated in FIG. 50, the semiconductor element 136 and the semiconductor element 138 are joined and electrically connected to one semiconductor element 134 by using the anisotropic conductive member 20. Further, the semiconductor element 146 and the semiconductor element 147 are joined to the semiconductor element 136 by using the anisotropic conductive member 20, and a semiconductor element 151 is joined and electrically connected to the semiconductor element 138 by using the anisotropic conductive member 20. An optical waveguide 153 is provided in the semiconductor element 134. A light emitting element 155 is provided in the semiconductor element 138, and a light receiving element 156 is provided in the semiconductor element 136. The light Lo output from the light emitting element 155 of the semiconductor element 138 passes through the optical waveguide 153 of the semiconductor element 134 and is emitted as the emission light Ld to the light receiving element 156 of the semiconductor element 136. As a result, it is possible to support silicon photonics described above.

In the anisotropic conductive member 20, holes 152 are formed in the places corresponding to the optical paths of the light Lo and the emission light Ld.

The present invention is basically configured as described above. As described above, the anodizing method and the manufacturing method for an anisotropic conductive member according to the embodiment of the present invention have been described in detail; however, the present invention is not limited to the above-described embodiments, and, of course, various improvements or modifications may be made without departing from the gist of the present invention.

EXAMPLES

Hereinafter, the characteristics of the present invention will be described more specifically with reference to Examples. The materials, reagents, amounts of substances and their ratios, operations, and the like in the following Examples can be appropriately changed as long as they do not depart from the gist of the present invention. Accordingly, the scope of the present invention is not limited to the following Examples.

In these Examples, anisotropic conductive members of Examples 1 to 5 and anisotropic conductive members of Comparative Examples 1 to 4 were prepared. For the anisotropic conductive members of Examples 1 to 5 and the anisotropic conductive members of Comparative Examples 1 to 4, the frequency of abnormal parts, the diameters of upper and lower pores, the defect frequency, and the joining were evaluated. Table 2 below shows the evaluation results of the frequency of abnormal parts, the diameters of upper and lower pores, the defect frequency, and the joining.

Hereinafter, each evaluation item for the frequency of abnormal parts, the diameters of upper and lower pores, the defect frequency, and the joining will be described.

The evaluation of the frequency of abnormal parts will be described.

<Evaluation of Frequency of Abnormal Parts>

An attempt was made to find a reflecting point by applying light on the surface of the anodized film obtained by the anodization, and by observing the surface thereof under an optical microscope. Then, the reflecting points were counted and the reflecting points per unit area were obtained. The number of reflecting points per unit area was evaluated as the frequency of abnormal parts.

The evaluation of the diameters of upper and lower pores will be described.

<Evaluation of Upper and Lower Pore Diameters>

Ten cross sections of the manufactured anisotropic conductive member were cut out, and a field emission scanning electron microscope (FE-SEM) image of each of the cross sections was obtained. The diameters of the surface and the bottom part of each of the micropores were measured from the FE-SEM images of ten cross sections, and the average values of the diameters of the surface and the bottom part of the micropores were obtained. These average values were taken as the diameters of the surface and bottom part of the micropore, respectively.

The cross sections were obtained by cutting and processing by using a focused ion beam (FIB).

The evaluation of the defect frequency will be described.

<Evaluation of Defect Frequency>

After polishing one side of the manufactured anisotropic conductive member, the polished surface was observed under an optical microscope to find defects. Then, the number of defects was counted, the number of defects per unit area was obtained, and the defect frequency was evaluated according to the evaluation standard shown in Table 1 below. In the evaluation, it is necessary to satisfy both the evaluation standard of diameter 20 to 50 μm and the evaluation standard of diameter 50 μm or more. For example, an evaluation AA was the case where defects having a diameter of 20 to 50 μm had a defect frequency of 0.001 to 0.1 and defects having a diameter of more than 50 μm were not detected.

The above-described single-sided polishing was carried out as follows. First, the anisotropic conductive member manufactured on a 4-inch wafer was attached to Q-chuck (registered trade mark) (manufactured by MARUISHI SANGYO Co., Ltd.), and the anisotropic conductive member was polished with a polishing device manufactured by Kemet Japan Co., Ltd. so that the arithmetic average roughness (Japanese Industrial Standards (JIS) B0601: 2001) became 0.02 μm. Abrasive grains containing alumina were used for polishing.

TABLE 1

|  |  | Evaluation standard | | | |
|---|---|---|---|---|---|
|  | Defect size | AA | A | B | C |
| Number of defects (/m$^2$) | Diameter: 20 to 50 μm | 0.01 to 0.1 | More than 0.1 and 1 or less | More than 1 and 5 or less | More than 5 and 10 or less |
|  | Diameter: More than 50 μm | Not detected | Not detected | 0.01 to 0.1 | More than 0.1 and 1 or less |

TABLE 1-continued

|  | | Evaluation standard | | | |
|---|---|---|---|---|---|
|  | Defect size | D | E | F |
| Number of defects (/m²) | Diameter: 20 to 50 μm | More than 10 and 50 or less | More than 50 and 100 or less | More than 100 |
|  | Diameter: More than 50 μm | More than 1 and 5 or less | More than 5 and 10 or less | More than 10 |

The evaluation of the joining will be described.
<Evaluation of Joining>

A test element group chip (a TEG chip) that could evaluate the daisy chain was prepared. The TEG chip was assumed to have 1,000 daisy chains.

The anisotropic conductive members were stacked with two TEG chips and installed in the chamber of the wafer bonder. After the inside of the chamber was once vacuumed to $10^{-3}$ Pa, a nitrogen gas containing 5% hydrogen was introduced into the chamber to stabilize the pressure inside the chamber at 5 KPa. Then, pressurizing and heating were carried out under the conditions of a pressure of 20 MPa and a temperature of 200° C., and held for 30 minutes for the joining.

The joining was evaluated according to the evaluation standard shown below.
Evaluation Standard A: Among the 1,000 daisy chains of the joined product, all of them are connected.

B: Among the 1,000 daisy chains of the joined product, 75% or more and less than 100% are connected.

C: Among the 1,000 daisy chains of the joined product, 50% or more and less than 75% are connected.

D: Among the 1,000 daisy chains of the joined product, 25% or more and less than 50% are connected.

Hereinafter, Examples 1 to 5 and Comparative Examples 1 to 4 will be described.

Example 1

The anisotropic conductive member of Example 1 will be described.
[Anisotropic Conductive Member]
<Aluminum Substrate>

An aluminum substrate having a purity of 99.999% by mass was used.
<Electrolytic Polishing Treatment>

The above-described aluminum substrate was subjected to an electrolytic polishing treatment using an electrolytic polishing liquid having the following composition under the conditions of a voltage of 25 V, a liquid temperature of 65° C., and a liquid flow rate of 3.0 m/min. The treated area of the electrolytic treatment was 0.12 m².

A carbon electrode was used as the cathode, and GP0110-30R (manufactured by TAKASAGO Ltd.) was used as the power source. The flow rate of the electrolytic solution was measured using a vortex flow monitor FLM22-10PCW (manufactured by AS ONE Corporation).
(Electrolytic Polishing Liquid Composition)
  85% by mass phosphoric acid a (reagent manufactured by FUJIFILM Wako Pure Chemical Corporation): 660 mL
  Pure water: 160 mL
  Sulfuric acid: 150 mL
  Ethylene glycol: 30 mL <Anodization Step>

Next, the aluminum substrate after the electrolytic polishing treatment was subjected to anodization under the following anodization conditions.
(Electrolytic Solution)

10% aqueous solution of oxalic acid, liquid temperature: 15° C. The electrolytic solution was stirred.
(Anodization Conditions)

The anodization was carried out twice.

In the first time of the first stage anodization, the anodization was carried out for 60 minutes under the constant voltage control so that the voltage became a constant voltage of 40 V.

In the second anodization, a programmable direct current power supply was used, and the voltage control shown below was carried out to carry out the anodization. The current increasing period was set to 6 minutes. The current keeping period was set to 400 minutes. In a case where the current keeping period is 400 minutes, the current density is 72 A/m².

Regarding the voltage control, the voltage setting was to 4 minutes at a voltage of 20 V, 1.5 minutes at a voltage of 30 V, and 0.5 minutes at a voltage of 35 V, and the voltage was increased stepwise to a final voltage of 40 V.
<Barrier Layer Removing Step>

Next, an electrolytic treatment (an electrolytic removal treatment) was carried out while continuously lowering the voltage from 40 V to 0 V at a voltage lowering rate of 0.2 V/sec under the same treatment liquid and treatment conditions as those of the above-described anodization.

Thereafter, an etching treatment (etching removal treatment) of immersing in 5% by mass phosphoric acid at 30° C. for 30 minutes was carried out to remove the barrier layer in the bottom part of the micropores of the anodized film, and the aluminum substrate was exposed through the micropores.

The density of micropores present in the anodized film was about 100 million/mm². The density of micropores was measured and calculated by the method described in paragraphs [0168] and [0169] of JP2008-270158A.

The degree of regularity of the micropores present in the anodized film was 92%. The degree of regularity was calculated by taking a surface photograph (magnification: 20,000 times) with an FE-SEM and measuring by the method described in paragraphs [0024] to [0027] of JP2008-270158A.
<Metal Filling Step>

Next, the aluminum substrate was used as a cathode, and platinum was used as a positive electrode for electrolytic plating treatment.

Specifically, a copper plating solution having the composition shown below was used, and constant current electrolysis was carried out to prepare anisotropic conductive member having micropores filled with copper.

Here, for the constant current electrolysis, a plating device manufactured by YAMAMOTO-MS Co., Ltd. was used, and a power source (HZ-3000) manufactured by HOKUTO DENKO Corporation was used, cyclic voltammetry was carried out in the plating solution, and then after checking precipitation potential, the treatment was carried out under the conditions shown below.

(Copper Plating Solution Composition and Conditions)
Copper sulfate: 100 g/L
Sulfuric acid: 50 g/L
Hydrochloric acid: 15 g/L
Temperature: 25° C.
Current density: 10 A/dm$^2$ <Substrate Removing Step>

Next, immersion was carried out in a 20% by mass mercury chloride aqueous solution (corrosive sublimate) at 20° C. for 3 hours so that the aluminum substrate was dissolved and removed, whereby anisotropic conductive member was prepared.

<Protruding Step>

The anisotropic conductive member after the substrate removing step was immersed in an aqueous solution of sodium hydroxide (concentration: 5% by mass, liquid temperature: 20° C.), the immersion time was adjusted so that the height of the protruding portion became 300 nm, whereby the surface of the aluminum anodized film was selectively dissolved, and the anisotropic conductive member subsequently washed with water and dried to cause a copper cylinder, which is a conduction path, to protrude.

Regarding the back surface of the aluminum anodized film as well, a copper cylinder, which is a conduction path, was caused to protrude in the same manner so that the height of the protruding portion was 300 nm.

Example 2

In Example 2, the second anodization was different from that of Example 1, and except for the second anodization, Example 2 was the same as Example 1.

In Example 2, the current was controlled at the time of the second anodization. In the second anodization, a programmable direct current power supply was used to increase the current at a set rate of increase. After the lapse of the increase treatment period, the maximum current value of the increase treatment period was kept in the current keeping period.

In Example 2, in the second anodization, the quantity of current increase was set to 0.2 A/(m$^2$·second)), the current increasing period was set to 8 minutes, and the current keeping time was set to 300 minutes. In a case where the current keeping time is 300 minutes, the current density is 96 A/m$^2$.

Example 3

Example 3 was the same as Example 2, except that in the second anodization, the quantity of current increase was 0.15 A/(m$^2$·second)) and the current keeping time was 400 minutes as compared with Example 2. In a case where the current keeping time is 400 minutes, the current density is 72 A/m$^2$.

Example 4

Example 4 was the same as Example 1, except that a stainless steel plate was used in the method of controlling the quantity of current increase and in the second anodization, the current increasing period was 7 minutes and the current keeping time was 350 minutes as compared to Example 1. In a case where the current keeping time is 350 minutes, the current density is 84 A/m$^2$.

In Example 4, a stainless steel plate electrically connected in parallel with the aluminum substrate to be subjected to the anodization was used in the second anodization, instead of the voltage control of Example 1. The stainless steel plate had the same area as the treated area of the aluminum substrate and had a thickness of 0.2 mm. In Example 4, the constant voltage control was carried out so that the voltage became a constant voltage of 40 V.

In Table 2, the stainless steel plate was denoted by the steel use stainless (SUS) plate.

Example 5

Example 5 was the same as Example 4, except that a Ti plate was used instead of the stainless steel plate as compared with Example 4. The Ti plate had the same area as the treated area of the aluminum substrate and had a thickness of 0.2 mm.

Comparative Example 1

In Comparative Example 1, the constant voltage control was carried out so that the voltage became a constant voltage of 40 V at the time of the anodization as compared with Example 1; however, Comparative Example 1 was the same as Example 1 except that voltage control was not carried out in the current increasing period and the current keeping time was 300 minutes and the current density was 96 A/m$^2$.

In Comparative Example 1, it was denoted as "None" in the column of the current increasing period. In Comparative Example 1, there exists no current increasing period; however, the time required for the voltage to reach 40 V is 1 second.

Comparative Example 2

Comparative Example 2 was the same as Example 2, except that the quantity of current increase in the second anodization was 1.0 A/(m$^2$·second)) and the current increasing period was 1.6 minutes as compared with Example 2.

Comparative Example 3

Comparative Example 3 was the same as Example 2, except that in the second anodization, the quantity of current increase was 0.15 A/(m$^2$·second)) and the current increasing period was 12 minutes as compared with Example 2.

Comparative Example 4

Comparative Example 4 was the same as Example 1, except that the current increasing period was 12 minutes as compared with Example 1.

TABLE 2

| | Second anodization condition | | | | Evaluation standard | | | |
|---|---|---|---|---|---|---|---|---|
| | | Current increasing period | | | | Diameters of upper | | |
| | Control method | Quantity of current increase (A/(m² · second)) | Treatment time (minute) | Current keeping time | Frequency of abnormal parts (frequency/mm²) | and lower pores (surface/bottom part) | Defect frequency | Joining |
| Example 1 | Voltage control | 0.2 | 6 | 400 minutes (72 A/m²) | Less than 1 | 40/40 nm | AA | A |
| Example 2 | Current control | 0.2 | 8 | 300 minutes (96 A/m²) | Less than 1 | 40/40 nm | AA | A |
| Example 3 | Current control | 0.15 | 8 | 400 minutes (72 A/m²) | 1 | 40/40 nm | A | A |
| Example 4 | Conductivity load (SUS plate) | 0.2 | 7 | 350 minutes (84 A/m²) | 2 | 40/40 nm | A | B |
| Example 5 | Conductivity load (Ti plate) | 0.2 | 7 | 350 minutes (84 A/m²) | Less than 1 | 40/40 nm | AA | A |
| Comparative Example 1 | None | None | None | 300 minutes (96 A/m²) | 50 | 40/40 nm | D | D |
| Comparative Example 2 | Current control | 1.0 | 1.6 | 300 minutes (96 A/m²) | 25 | 40/40 nm | C | C |
| Comparative Example 3 | Current control | 0.15 | 12 | 300 minutes (108 A/m²) | 3 | 50/40 nm | B | C |
| Comparative Example 4 | Voltage control | 0.2 | 12 | 400 minutes (72 A/m²) | 3 | 50/40 nm | B | C |

As shown in Table 2, in Example 1 to Example 5, good results were obtained regarding the frequency of abnormal parts, the defect frequency, and the joining as compared with Comparative Example 1 to Comparative Example 4.

In Comparative Example 1, since the quantity of current increase is not controlled, the frequency of abnormal parts is high, the defect frequency is low, and further, the joining is also bad.

In Comparative Example 2, the quantity of current increase is more than 0.2 amperes per square meter per second, the frequency of abnormal parts is high, the defect frequency is low, and further, the joining is also bad.

In Comparative Example 3 and Comparative Example 4, since the current increasing period is long, the frequency of abnormal parts is high, the defect frequency is low, and the joining is bad. In addition, the diameter of the micropores on the surface side has increased.

From Example 2 and Example 3, good results were obtained regarding the frequency of abnormal parts and the defect frequency in a case where the quantity of current increase was close to 0.2 amperes per square meter per second.

From Example 4 and Example 5, in a case where a conductive load member was provided, good results were obtained in the Ti plate as compared with the stainless steel plate regarding the frequency of abnormal parts, the defect frequency, and the joining.

EXPLANATION OF REFERENCES

10: aluminum substrate
10a: surface
12: micropore
13: barrier layer
14: anodized film
15: metal
15a: metal layer
15b: metal
16: conduction path
16a: protruding portion
16b: protruding portion
17: structure body
19: resin layer
20: anisotropic conductive member
20a: front surface
20b: back surface
21: winding core
28: anisotropic conductive material
30: anodization device
32: electrolytic bath
34: counter electrode
35: metal substrate
36: power supply unit
38: control unit
40: insulating base material
40a: front surface
40b: back surface
44: resin layer
46: support
47: peeling layer
48: support layer
49: pealing agent
60: stacked device
61: PoP board
62, 64, 66, 82: semiconductor element
70: semiconductor element unit
71: interposer substrate
72, 73: electrode
72a, 74a, 75a: surface
74, 75, 88, 97: insulation layer
80: semiconductor package
80a, 80b: semiconductor package board
83, 99: resin
84: mold resin
85, 95, 108: solder ball
86, 89: hole
87: wire
90: wiring board
92, 101, 112, 121: insulating base material
94, 100: wiring layer
98, 102: wire
110: printed wiring board
114, 125: wiring layer
120: linear conductor 122: signal wire
123: ground wire
124: insulation layer
130, 130a, 130b, 130c, 130d: electronic device
134, 136, 138, 140, 146, 147, 151: semiconductor element
137: interposer
142: sensor chip
144: lens
148: electrode
152: hole
153: optical waveguide
155: light emitting element
156: light receiving element
AQ: electrolytic solution
$B_1$: first anodization
$B_2$: second anodization
Ds: stacking direction
Dt: thickness direction
Im: maximum value
Ld: emission light
Lo: light
Pe: region
Rs: steady state part
Ru: rising part
T: anodization time
Tm: period
Ts: steady state time
Tu: rising time
Vm: maximum value
h: thickness
ht: thickness
p: center-to-center distance
x: direction

What is claimed is:

1. An anodizing method comprising:
subjecting a surface of a valve metal plate to a plurality of times of anodization; and
forming an anodized film having micropores present in a thickness direction of the valve metal plate and having a barrier layer present in a bottom part of the micropores, on the surface of the valve metal plate,
wherein in steps of second and subsequent times of anodization of the plurality of times of anodization, a current increasing period and a current keeping period are continuous,
the current increasing period is a period in which a quantity of current increase is more than 0 amperes per square meter per second and 0.2 amperes per square meter per second or less, and which is 10 minutes or less,
a current is kept at a constant value during the current keeping period, and the constant value is equal to or less than a maximum current value during the current increasing period, and
a counter electrode is arranged to face the valve metal plate, and a conductive load member is electrically connected in parallel with the valve metal plate.

2. The anodizing method according to claim 1,
wherein a voltage that is applied to the valve metal plate is increased stepwise during the current increasing period.

3. The anodizing method according to claim 1,
wherein a step of a first time of anodization of the plurality of times of anodization is carried out at a constant voltage.

4. The anodizing method according to claim 1,
wherein the valve metal plate is an aluminum substrate.

5. A manufacturing method for an anisotropic conductive member, comprising:
a step of filling micropores of the anodized film obtained by the anodizing method of claim 1 with a conductive material.

6. The manufacturing method for an anisotropic conductive member according to claim 5, further comprising:
a step of removing the valve metal plate from the anodized film before the step of filling the micropores of the anodized film with a conductive material; and
a step of piercing the micropores present in the anodized film from which the valve metal plate has been removed.

7. The anodizing method according to claim 2,
wherein a step of a first time of anodization of the plurality of times of anodization is carried out at a constant voltage.

8. The anodizing method according to claim 2,
wherein the valve metal plate is an aluminum substrate.

9. A manufacturing method for an anisotropic conductive member, comprising:
a step of filling micropores of the anodized film obtained by the anodizing method of claim 2 with a conductive material.

10. The manufacturing method for an anisotropic conductive member according to claim 9, further comprising:
a step of removing the valve metal plate from the anodized film before the step of filling the micropores of the anodized film with a conductive material; and
a step of piercing the micropores present in the anodized film from which the valve metal plate has been removed.

11. The manufacturing method for an anisotropic conductive member according to claim 9, further comprising:
a step of removing the valve metal plate from the anodized film before the step of filling the micropores of the anodized film with a conductive material; and
a step of piercing the micropores present in the anodized film from which the valve metal plate has been removed.

12. The anodizing method according to claim 3,
wherein the valve metal plate is an aluminum substrate.

13. A manufacturing method for an anisotropic conductive member, comprising:
a step of filling micropores of the anodized film obtained by the anodizing method of claim 3 with a conductive material.

14. The manufacturing method for an anisotropic conductive member according to claim 13, further comprising:
a step of removing the valve metal plate from the anodized film before the step of filling the micropores of the anodized film with a conductive material; and
a step of piercing the micropores present in the anodized film from which the valve metal plate has been removed.

15. A manufacturing method for an anisotropic conductive member, comprising:
a step of filling micropores of the anodized film obtained by the anodizing method of claim 4 with a conductive material.

16. The manufacturing method for an anisotropic conductive member according to claim 15, further comprising:
a step of removing the valve metal plate from the anodized film before the step of filling the micropores of the anodized film with a conductive material; and a step of piercing the micropores present in the anodized film from which the valve metal plate has been removed.

* * * * *